(12) United States Patent
Parker

(10) Patent No.: US 7,839,605 B2
(45) Date of Patent: Nov. 23, 2010

(54) ELECTRICAL SIGNAL-PROCESSING DEVICE INTEGRATING A FLUX SENSOR WITH A FLUX GENERATOR IN A MAGNETIC CIRCUIT

(75) Inventor: Michael Andrew Parker, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 845 days.

(21) Appl. No.: 11/598,886

(22) Filed: Nov. 13, 2006

(65) Prior Publication Data

US 2007/0121249 A1     May 31, 2007

(51) Int. Cl.
*G11B 5/39*     (2006.01)
(52) U.S. Cl. ............... 360/318; 360/318.1; 360/321
(58) Field of Classification Search ........... 360/317, 360/318, 318.1, 321, 123.17, 125.33
See application file for complete search history.

(56) References Cited

U.S. PATENT DOCUMENTS

| | | | |
|---|---|---|---|
| 3,649,912 A | 3/1972 | Nakamura | |
| 5,177,433 A | 1/1993 | Schwendtner et al. | |
| 5,255,141 A | 10/1993 | Valstyn et al. | |
| 5,461,308 A | 10/1995 | Jin et al. | |
| 5,508,868 A | 4/1996 | Cheng et al. | |
| 5,512,818 A | 4/1996 | Jin et al. | |
| 5,640,343 A | 6/1997 | Gallagher et al. | |
| 5,665,465 A | 9/1997 | Gyorgy et al. | |
| 5,742,457 A * | 4/1998 | Simmons et al. | 360/318.1 |
| 5,831,426 A | 11/1998 | Black, Jr. et al. | |
| 5,870,260 A | 2/1999 | Davies et al. | |
| 5,871,622 A | 2/1999 | Pinarbasi | |
| 5,929,636 A | 7/1999 | Torok et al. | |
| 6,031,273 A | 2/2000 | Torok et al. | |
| 6,054,780 A | 4/2000 | Haigh et al. | |

(Continued)

FOREIGN PATENT DOCUMENTS

EP    0 789 250 A2    8/1997

(Continued)

OTHER PUBLICATIONS

Jeff Bachiochi, You're Not Alone Dealing with Isolation, Circuit Cellar, Issue 142, May 2002.

(Continued)

*Primary Examiner*—Jefferson Evans
(74) *Attorney, Agent, or Firm*—Zilka-Kotab, PC

(57) ABSTRACT

An electrical signal processing device includes at least one thin film flux generator and at least one thin film magnetic sensor. Each flux generator includes at least one conductive induction line that is connected to at least one lead of a pair of input leads, and a yoke that surrounds the conductive induction line. The yoke has at least one pair of pole tips, and a gap is disposed between the end surfaces of each pair of pole tips. A magnetic sensor is disposed in the gap, and a pair of output leads is connected to the sensor. An alternative embodiment may include two or more conductive induction lines that are connected to respective separate pairs of input leads. Alternatively, two or more conductive induction lines may connect to one another to form an induction coil. The flux generator and magnetic sensor are preferably formed on a single substrate to create an integrated device.

43 Claims, 11 Drawing Sheets

U.S. PATENT DOCUMENTS

| | | | |
|---|---|---|---|
| 6,101,067 A * | 8/2000 | Matsuzono et al. | 360/317 |
| 6,111,406 A | 8/2000 | Garfunkel et al. | |
| 6,114,719 A | 9/2000 | Dill et al. | |
| 6,225,801 B1 | 5/2001 | Jin et al. | |
| 6,300,617 B1 | 10/2001 | Daughton et al. | |
| 6,376,933 B1 | 4/2002 | Goetz et al. | |
| 6,433,540 B1 | 8/2002 | Hachisuka et al. | |
| 6,445,171 B2 | 9/2002 | Sandquist et al. | |
| 6,452,764 B1 | 9/2002 | Abraham et al. | |
| 6,459,552 B1 | 10/2002 | Liu et al. | |
| 6,469,927 B2 | 10/2002 | Spitzer et al. | |
| 6,510,078 B2 | 1/2003 | Schwarzl | |
| 6,518,588 B1 | 2/2003 | Parkin et al. | |
| 6,538,297 B2 | 3/2003 | Odagawa et al. | |
| 6,573,713 B2 | 6/2003 | Torok et al. | |
| 6,606,225 B1 * | 8/2003 | Funayama et al. | 360/321 |
| 6,735,061 B2 | 5/2004 | Pinarbasi | |
| 6,738,284 B2 | 5/2004 | Torok et al. | |
| 6,819,527 B1 | 11/2004 | Dill et al. | |
| 6,833,975 B2 * | 12/2004 | Fukazawa et al. | 428/828 |
| 6,845,036 B2 | 1/2005 | Witcraft et al. | |
| 6,859,063 B2 | 2/2005 | Nuspi et al. | |
| 7,170,719 B1 * | 1/2007 | Dovek et al. | 360/317 |
| 2001/0022712 A1 * | 9/2001 | Funayama et al. | 360/317 |
| 2001/0036044 A1 * | 11/2001 | Urai | 360/318 |
| 2006/0082929 A1 * | 4/2006 | Kiyono et al. | 360/317 |

FOREIGN PATENT DOCUMENTS

| | | |
|---|---|---|
| JP | 59189734 | 10/1984 |
| JP | 63198876 | 8/1988 |
| JP | 6130088 | 5/1994 |
| JP | 6174752 | 6/1994 |
| JP | 2000055999 | 2/2000 |
| JP | 2000056000 | 2/2000 |
| WO | WO 01/33242 A1 | 5/2001 |
| WO | WO 0206844 | 1/2002 |

OTHER PUBLICATIONS

M. Durlam et al., A low power 1Mbit MRAM based on 1T1MTJ bit cell integrated with Copper Interconnects, Motorola Labs 2002.

George M. Ettinger, "Magnetic Amplifiers", London: Methuen & Co. Ltd., New York: John Wiley & Sons, Inc., first published in 1953.

* cited by examiner

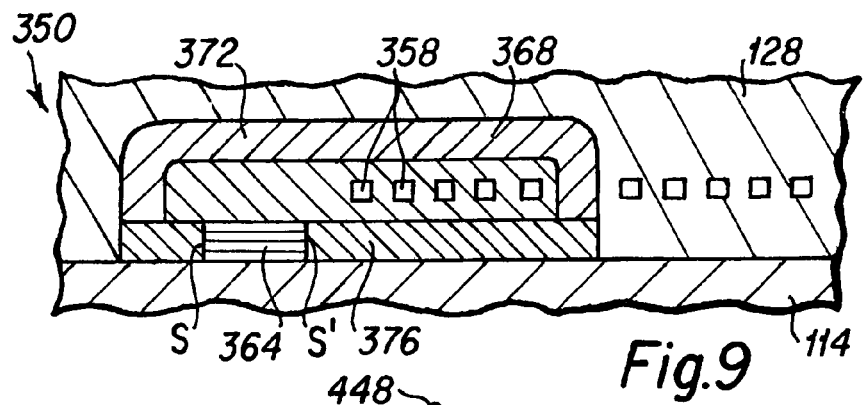
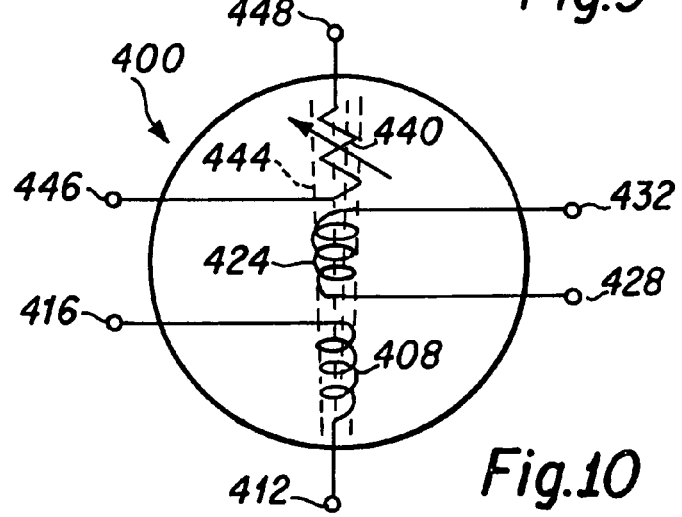
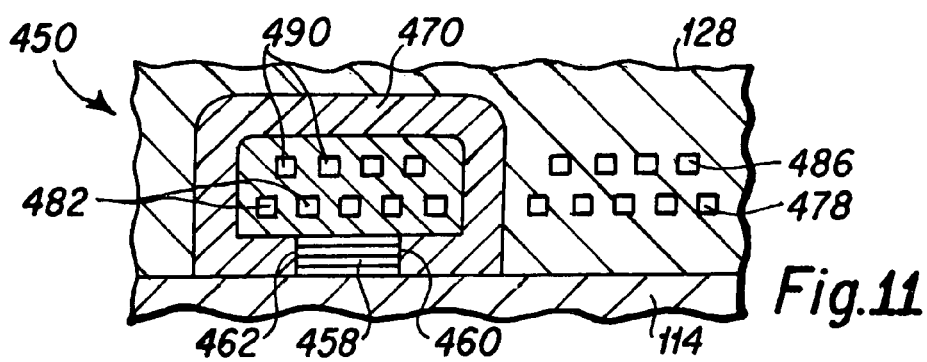
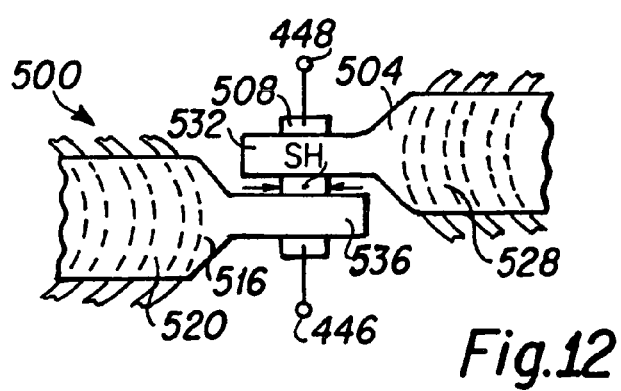

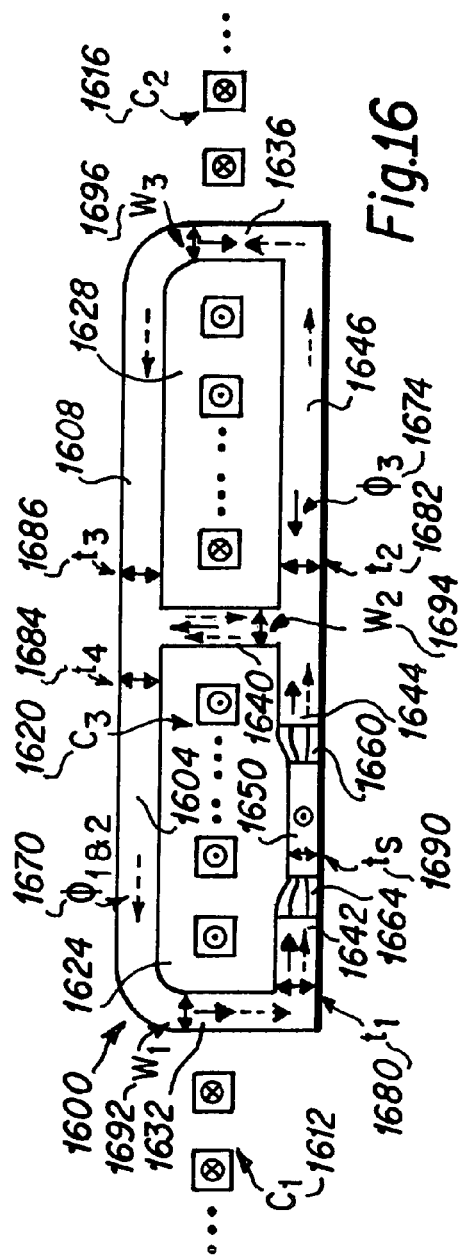
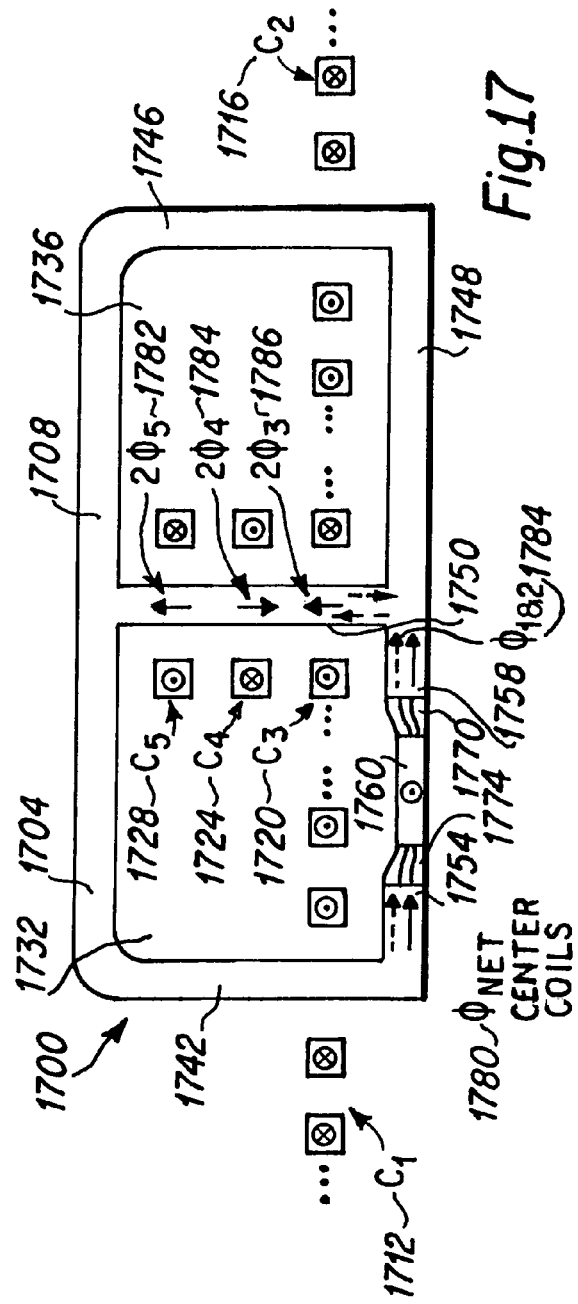
Fig.16
Fig.17

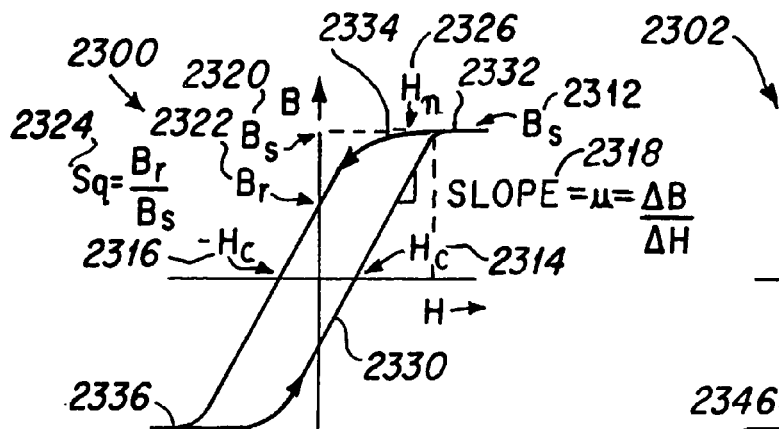
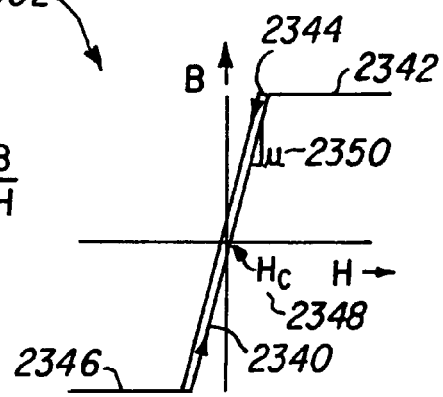
Fig.23A  Fig.23B
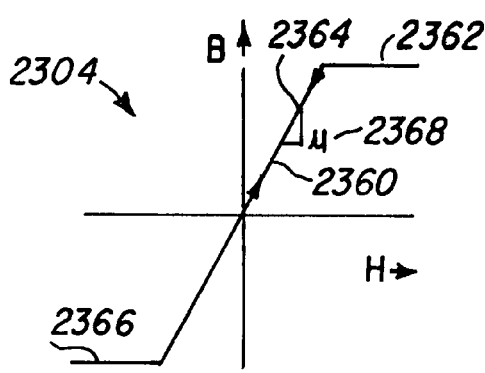
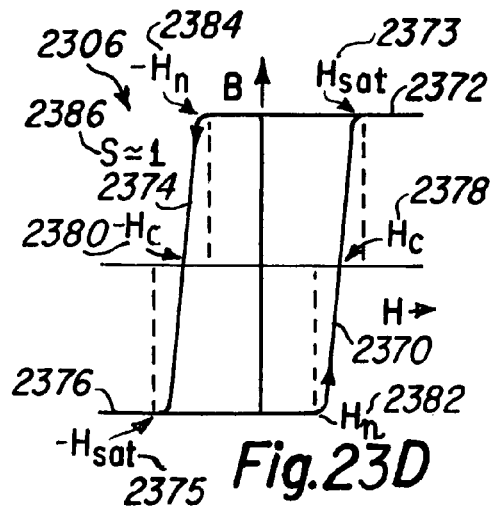
Fig.23C  Fig.23D
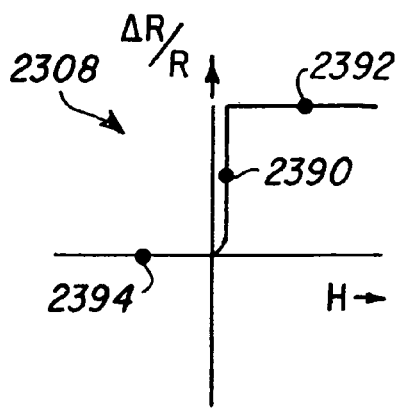
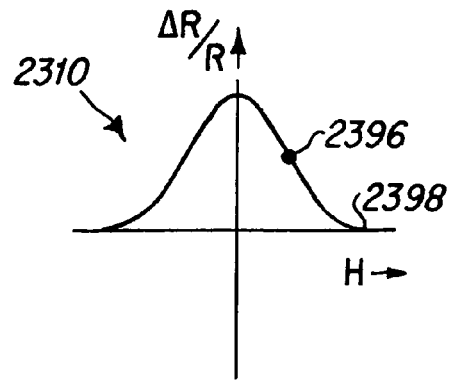
Fig.23E  Fig.23F

ELECTRICAL SIGNAL-PROCESSING DEVICE INTEGRATING A FLUX SENSOR WITH A FLUX GENERATOR IN A MAGNETIC CIRCUIT

BACKGROUND OF THE INVENTION

1. Field of the Invention

The present invention relates generally to electrical signal processing devices, and more particularly to a device incorporating a magnetic circuit having high flux transfer efficiency between one or more magnetic flux generators, and one or more magnetic flux sensors.

2. Description of the Prior Art

Magnetic circuit devices that include a flux generator and a flux sensor are known in the art. Typically the flux generator and the flux sensor are fabricated separately and assembled proximate each other, such that the sensor is placed within the magnetic field created by the flux generator. Such devices are rather large and relatively cumbersome because such prior art devices have purposes other than electrical signal processing. There is therefore a need for devices that are small in scale and in which the flux generator and magnetic sensor are fabricated proximate each other incorporating a magnetic circuit having high flux transfer efficiency coupling the flux generator with the magnetic sensor as a part of a single integrated electrical signal processing device.

SUMMARY OF THE INVENTION

An electrical signal-processing device of the present invention includes a thin film magnetic circuit including at least one thin film flux generator and at least one thin film magnetic sensor. Each flux generator includes at least one conductive induction line that is connected to at least one lead of a pair of input leads, and a yoke that surrounds the conductive induction line. The yoke has at least one pair of pole tips and a gap is disposed between the end surfaces of each pair of pole tips. A magnetic sensor is disposed in the gap between the pole tips, and a pair of output leads is connected to the sensor. The magnetic sensor may be a current perpendicular to the plane (CPP) sensor or a current in the plane (CIP) sensor, and it may be a magnetoresistive sensor, an anisotropic magnetoresistive sensor, a giant magnetoresistive sensor, a spin valve sensor, a tunneling magnetoresistive sensor, or a colossal magnetoresistive sensor.

An alternative embodiment may include two or more conductive induction lines where each conductive induction line is connected to respective separate pairs of input leads. Alternatively, two or more conductive induction lines may connect to one another to form an induction coil, where the induction coil connects to a pair of input leads, and the induction coil may take the form of a pancake coil or a helical coil. In alternative embodiments, the magnetic circuit may include multiple loops that have conductive induction lines threaded through them. The magnetic circuit may also include components comprised of a ferrimagnetic electrically insulating oxide material.

The flux generator and magnetic sensor are preferably formed on a single substrate to create an integrated electrical signal-processing device.

It is an advantage of the electrical signal-processing device of the present invention that it is fabricated on a single substrate as an integrated electrical signal-processing device.

It is another advantage of the electrical signal-processing device of the present invention that it is fabricated utilizing known materials and process steps.

It is a further advantage of the electrical signal processing device of the present invention that it can be fabricated with separate input leads and output leads, whereby only magnetic flux generated by the flux generator influences the electrical output from the magnetic sensor.

It is yet another advantage of the electrical signal processing device of the present invention that multiple inputs can be provided to the flux generator to create complex output signals from the sensor.

It is yet a further advantage of the electrical signal-processing device of the present invention that multiple flux generators can be engaged with a single magnetic sensor to provide complex output signals from the sensor.

It is yet a further advantage of the electrical signal-processing device of the present invention that one or more flux generators can be coupled with one or more magnetic sensors through a magnetic circuit having high flux transfer efficiency to provide complex output signals from the device.

These and other features and advantages of the present invention will no doubt become apparent to those skilled in the art upon reading the following detailed description that makes reference to the several figures of the drawing.

IN THE DRAWINGS

The following drawings are not made to scale as an actual device, and are provided for illustration of the invention described herein.

FIG. 9 is a side cross-sectional view of yet another embodiment of the present invention;

FIG. 10 is a diagram of a further embodiment of the present invention including two input coils;

FIG. 11 is a side cross-sectional view of another embodiment of the present invention with two input coils;

FIG. 12 is a top plan view of a further embodiment of the present invention with two input coils, but disposed in two separate flux generators;

FIG. 16 is a side cross-sectional view of another embodiment of the present invention with three input coils arranged on the legs of a magnetic circuit having two inner loops and an outer loop that minimizes transformer action between the coils when two time-varying input signals are applied thereto;

FIG. 17 is a side cross-sectional view of another embodiment of the present invention with more than three input coils arranged on the legs of a magnetic circuit having two inner loops and an outer loop that minimizes transformer action between the coils when two time-varying input signals and multiple DC input signals are applied thereto;

FIG. 23A depicts the generic features of a B-H loop of a component in the magnetic circuit of the invention;

FIG. 23B depicts the features of a B-H loop along an easy axis of magnetization of a component in the magnetic circuit of the invention;

FIG. 23C depicts the features of a B-H loop along a hard axis of magnetization of a component in the magnetic circuit of the invention;

FIG. 23D depicts the features of a B-H loop with high squareness ratio of a component in the magnetic circuit of the invention;

FIG. 23E depicts the features of a ΔR/R-H loop of a sensor having a free layer and a pinned layer useful as a component in the magnetic circuit of the invention;

FIG. 23F depicts the features of a ΔR/R-H loop of a magnetoresistive (MR) sensor with a bell-type transfer curve useful as a component in the magnetic circuit of the invention;

Figure 25A:
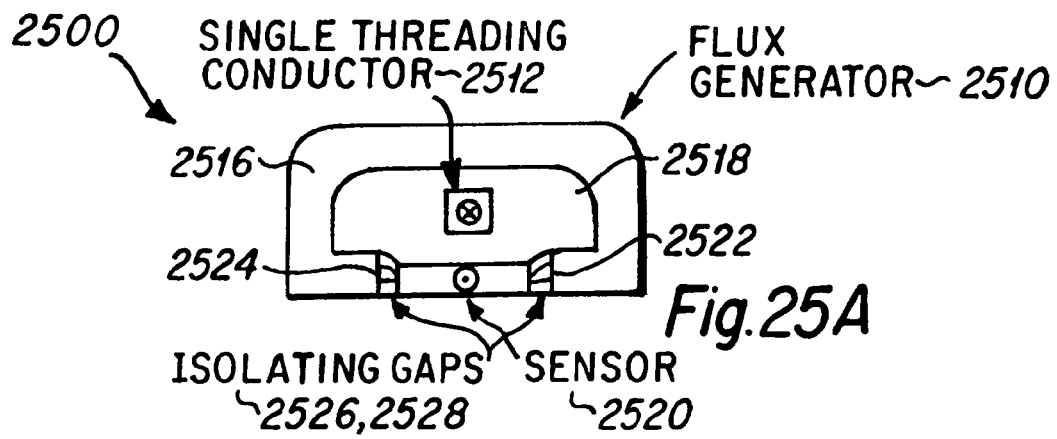
FIG. 25A is a side cross-sectional view of a further embodiment of the present invention utilizing a single conductive induction line threading the magnetic circuit of the invention useful as a digital switch, logic gate, or MRAM memory element.
Figure 25B:
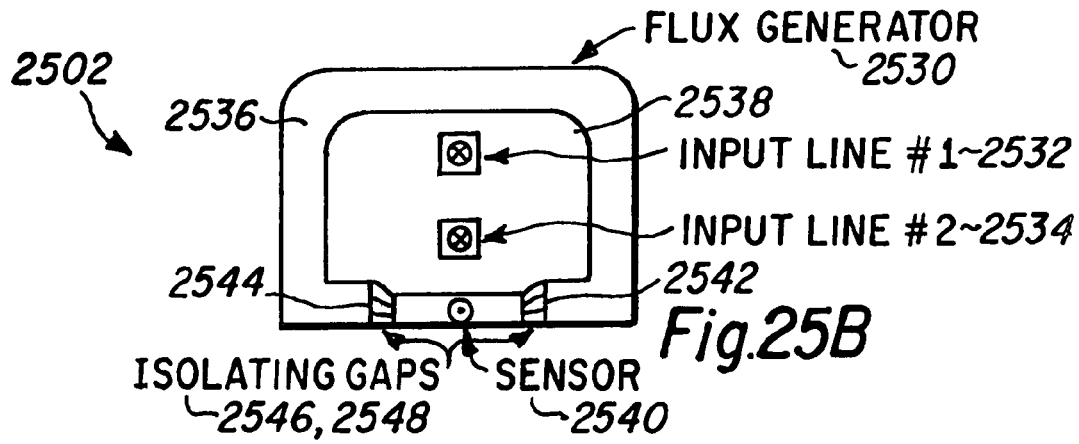
Figure 25C:
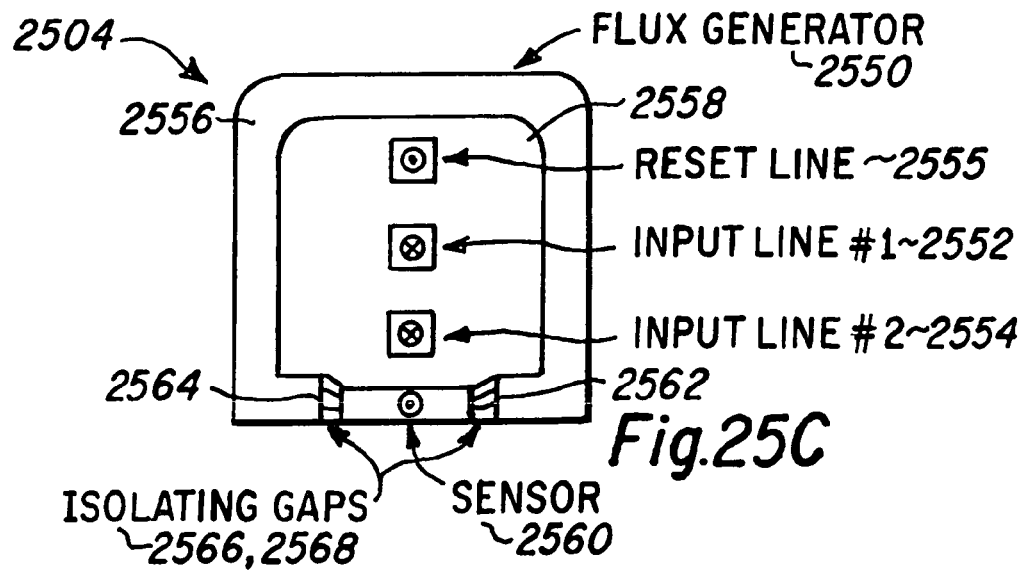

FIG. 25B is a side cross-sectional view of a further embodiment of the present invention utilizing two conductive induction lines threading the magnetic circuit of the invention useful primarily as a logic gate; and, FIG. 25C is a side cross-sectional view of a further embodiment of the present invention utilizing three conductive induction lines threading the magnetic circuit of the invention useful primarily as a resettable logic gate, or resettable MRAM memory element.

DETAILED DESCRIPTION OF THE PREFERRED EMBODIMENTS

The concept of this invention is to directly couple a magnetic flux generator, such as the flux circuit design of a magnetic recording head writer, i.e. write element, to a magnetic sensor, such as the flux sensitive design of the magnetic recording head reader, i.e. read element, and to take advantage of the advances in magnetic recording head device scaling and thin film fabrication technology to produce a device based on signal transfer through direct flux coupling between the write element and the read element. This device because it is based on magnetic flux coupling might be called a "magnetic valve," or in the case of devices using a magnetoresistive sensor as the flux modulated element, a transfluxistor (TFR), a coined word.

With advances in magnetic recording technology, it has become possible to make magnetic recording heads with high flux output and low hysteresis, such as the inductive magnetic writing element created for magnetic heads of hard disk drives. This was made possible by the application of thin film fabrication technology as used in the semiconductor industry to the fabrication of thin film magnetic recording heads in the early 1980's, whereas previous magnetic recording heads were primarily made of core-wound blocks of ferrite. Moreover, the application of thin film technology to the fabrication of the thin film head enabled the batch processing of many devices on ceramic wafers allowing manufacturing throughput gains similar to those realized for thin film integrated circuits (IC's) on monolithic silicon wafers. Another advance in magnetic recording technology came in the 1990's with the replacement of the read function provided by earlier inductive read elements with magnetic sensors based on the magnetoresistance effect, which have similar low hysteresis, but higher flux sensitivity. Once again, this advance was enabled by the application of thin film technology to the fabrication of a thin film magnetoresistive sensor. However, because only a single read and a single write element are required for a magnetic recording head, taking note of the possible exception of multi-track magnetic tape heads, thin film magnetic heads never took full advantage of another benefit of device scaling offered by thin film technology. The semiconductor industry had earlier already discovered this other benefit, viz. the integration of several devices interconnected on a single monolithic chip providing complex functionality, as exemplified in silicon integrated circuits (IC's). With the further advance of magnetoresistive sensor technology, new thin film structures based on the giant magnetoresistance (GMR) effect were introduced in the late 1990's; and recently, magnetoresistive sensors based on tunneling magnetoresistance (TMR) have made their appearance. These latter two devices depend critically on the control of the properties of ultrathin atomic monolayers of materials, once again made possible by thin film technology.

As a result, GMR and TMR sensors have now made possible leveraging these other advantages of device scaling offered by thin film technology for the integration of magnetic devices on monolithic substrates. Recently, magnetic random access memories (MRAM's) have appeared that takes advantage of the other benefit of device scaling as realized in the integration of complex functionality in digital memories. However, the design of a fundamental magnetic based device similar to the transistor that would enable the realization of other types of complex functionality present in silicon IC's seems to be absent from present technological development. It is the object of this invention to provide such a fundamental device based on the advantages of device scaling offered by fabrication of thin film flux generators and thin film flux sensors in both simple and complex thin film magnetic circuits. Now facilitated by thin film technology, such a fundamental device would enable the full realization of these other advantages of device integration in complex functionality.

A magnetic writing element of a typical magnetic recording head acting as a transducer can produce a magnetic field of approximately 24 kG for an applied current of only 50 mA, or a transduction ratio of approximately 500 G/mA. Also, a GMR spin valve (SV) sensor (GMR-SV) of a magnetic recording head with a current of only 2.5 mA and an input of only 10 Oe from the fringing flux of a magnetic hard disk produces ΔR/R of approximately 15%, and TMR sensors, approximately 100%; under these conditions, the GMR-SV sensor produces a current swing of approximately 0.37 mA for an excitation field of 10 Oe, or transduction ratio of approximately 25 mA/1000 Oe. An electrical signal processing device can then be created by directly coupling the magnetic recording writer to the magnetic recording reader, sensor.

Assuming perfect flux coupling, negligible flux losses, and that it is possible to directly couple the writer to the magnetic reader, sensor, without significant loss of performance in either structure, a nominally unity, or better than unity, current gain device is feasible. Improvements in current gain can be obtained by increasing the number of turns on the write element, because flux density $\Phi/A=\mu n i$, where n is the number of turns per meter of the magnetic circuit; $\mu$ is the permeability of the medium carrying the flux; i is the current in a single yoke-threading conductive induction line, or coil turn. Thus, based on present-day, read-head-element, and write-head-element technology, after suitable design modifications have been made, an electrical signal processing device, and, in particular, a current amplification device can be created by directly coupling the write-head element to the read head-element of a conventional sensor, such as a MI (magnetic induction), AMR (anisotropic magnetoresistive), GMR (giant magnetoresistive), or TMR (tunneling magnetoresistive) sensor, used in magnetic recording head designs. The current gain for the devices will generally increase in the order recited above: MI<AMR<GMR<TMR.

Moreover, since the technology currently exists to fabricate multiple read and write elements on a single wafer, it is relatively straight forward to couple such devices together into integrated devices having complex functionality: integrated magnetic circuits, IMCs, hybrid magnetic/semiconductor integrated circuits similar to MRAM's and other devices, and hybrid magnetic/miniaturized electomechanical systems (MEMS) which are also suitable for a number of unique application environments, such as high input impedance devices, high input voltage devices, and radiation hardened devices.

Description of Fundamental Embodiments of the Invention

Figure 1:
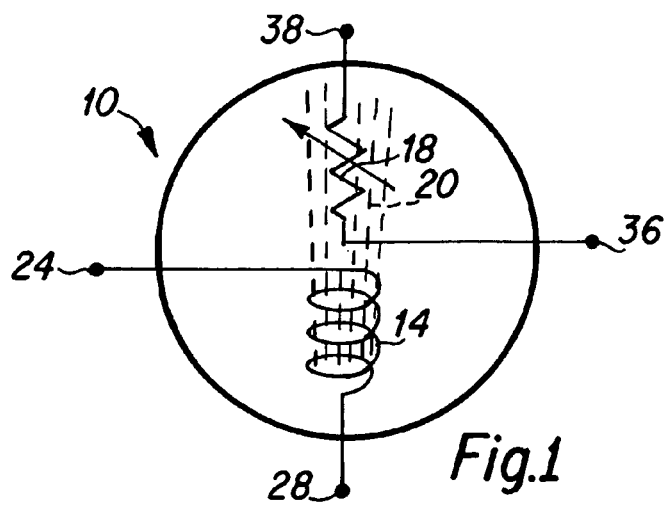
FIG. 1 is a diagram depicting the basic concept of a device of the present invention.

FIG. 1 is a basic diagram of a device 10 of the present invention that can be termed a transfluxistor that is suggestive of the basic principle underlying the device. FIG. 1 depicts a coil 14, or yoke-threading conductive induction line, that is the input element, magnetically coupled to a variable resistor (sensor) 18, the output element, through a bridging magnetic flux 20 shown as dashed lines connecting the two. The magnetic flux 20 propagates in a magnetic circuit comprising the input and output elements. Leads 24 and 28 serve as the inputs to the device 10, and leads 36 and 38 serve as the outputs from the device 10. There is no polarity to these inputs, and outputs, unlike a common transistor, and this is another advantage of the transfluxistor. That is, the device 10 works the same if a current of an input signal flows from leads 24 to 28 or from leads 28 to 24; likewise the output signal is the same whether a current of an output signal flows across a load from leads 36 to 38, or from leads 38 to 36. Note that it is necessary that the input signal be applied as a current, because the device relies on Ampere's Law to generate a magnetic flux signal in the flux 20 that propagates through a magnetic circuit coupling a flux generator, input element, to a flux sensor, output element. Moreover, the potential on the output does not have to be higher or lower than that on the input because the input and output circuits are completely isolated from each other, except for the flux coupling between them, which results in a primarily inductive coupling impedance.

As depicted in FIG. 1, a basic transfluxistor 10 is a four lead device, although it can be operated in a three lead mode, if a low potential side (for example leads 28 and 36) of both the input and output of the device are tied together in common. This allows substitution of the device for three lead devices such as triode electron tubes, or transistors. The four lead device is discussed because it has certain advantages over a three lead device (not shown) due to the total electrical isolation of the input from the output. Essentially, the only coupling between the input and the output is through the flux, coupling the flux generator 14 to the flux sensor 18. This makes the four lead transfluxistor ideal for applications in which complete electrical isolation, aside from inductive coupling, is required, e.g. input from a waveform floating on a high voltage, a low input impedance, and an input having lessened capacitive coupling impedance with the output.

Figure 2:
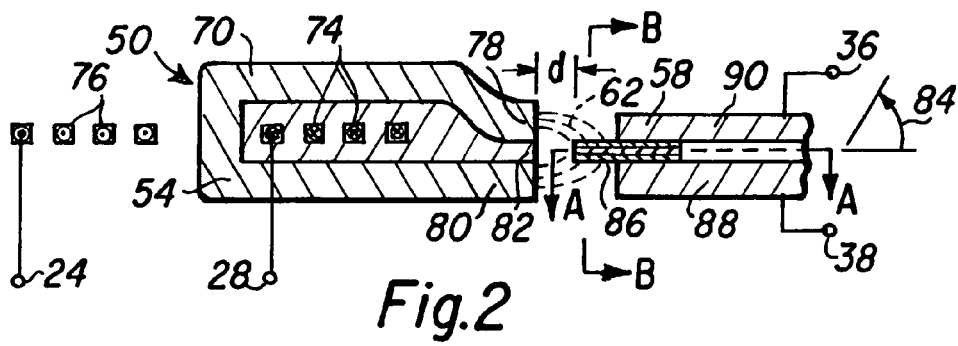
FIG. 2 is a side cross-sectional view depicting an embodiment of the present invention.

FIG. 2 depicts an exemplary first embodiment of a transfluxistor 50; although this embodiment is less than optimal, it is useful for heuristic purposes in discussing schematically the operation of the invention. The input element, the flux generator 54, is shown as the write element of a well-known magnetic recording head, and the output element, sensor 58, is shown as the read element of a well-known magnetic recording head, where the write and read elements are in direct communication with each other through the flux 62 emanating from the flux generator. The flux generator 54 therefore includes a yoke member 70 that surrounds a plurality of conductive induction lines connected to form the inside portions of coil turns 74, having vector heads and tails showing a direction of current flow through the coil from the input leads 24 and 28, and outside portions of the coil turns 76 as shown. The yoke 70 includes two pole tips 78 and 80 having write gap 82 formed therebetween. Being surrounded by the yoke 70, the conductive induction lines thread a magnetic circuit comprising the yoke 70, pole tips 78 and 80, and gap 82. The read sensor output element 58 may be formed as an MR sensor 86 including a plurality of sensor layers, as for an GMR-SV sensor, such as a pinned magnetic layer, a spacer layer and a free magnetic layer (all not shown in detail in FIG. 2), and further including a biasing layer (not shown in FIG. 2)

and electrical lead layers 88 and 90 identified with the output leads 36 and 38 shown in FIG. 1.

FIG. 2 emphasizes the basic principle of the transfluxistor in a historical context based on classical magnetic recording head designs; that is, coupling of the read element of a magnetic recording head with the write element of a magnetic recording head through the flux 62, represented by the dashed lines, that would normally write to a magnetic recording disk, now absent from this system. Although FIG. 2 is useful in illustrating the concept, there are more efficient embodiments of the invention. In particular, FIG. 2 shows that there is a finite spacing, d, between the writer and the reader. In order to obtain the transduction ratios referred to above, this spacing generally should be on the order of the magnetic spacing between the head and the disk in a magnetic recording drive; the spacing, d, must be small, approximately 2 nm, if the reader and writer designs are used without modification to assure high flux transfer efficiency between the flux generator, writer, and the sensor, reader. Although this spacing of the two elements on a wafer can probably be obtained to fabricate the transfluxistor, such a dimension is difficult to achieve. To overcome this difficulty the design of the flux generator and the sensor can be modified to make the fabrication of the device easier, and some exemplary embodiments are discussed below. Nevertheless, FIG. 2 is useful in illustrating the basic principle of the transfluxistor within a historical context. In addition, FIG. 2 is helpful in illustrating some other important design issues. In order to obtain the full benefit of the transduction ratios from the flux generator and sensor referred to above, this spacing must be eliminated or substantially reduced, because the flux emanating from the pole tips falls exponentially as a function of distance from the pole tips.

Also, for the sake of schematic simplicity, the flux has been shown as crossing the sensor nominally perpendicular to its cross-section; but, in order to obtain optimum efficiency of flux delivery to the sensor, the geometric orientation and location of the sensor relative to the flux lines needs to be optimized so that the flux lines lie nominally in-plane or parallel to the plane of the sensor layers, as it is in more refined embodiments of the invention. In the FIG. 2, this can be accomplished by aligning the sensor 86 up or down with one or the other of the pole tips 78, or 80, of the writer 54, or by rotating the plane of the sensor about the central axis A-A by 90 degrees into plane B-B, as indicated by the arrow 84, so that the flux is substantially in the plane of the sensor. Thus, the efficiency of the sensor for detection of the component of the flux in the plane of the sensor improves with rotation of the sensor plane towards a position tangent to the flux lines emanating from the flux generator.

There is also flux that is lost and never reaches the sensor, which is characteristic of most, if not all, applications of flux sensors in the prior art, because flux is lost through flux lines that bridge the gap without ever reaching the sensor. Since these prior art applications do not have as their purpose an electrical signal processing device as here, prior art devices lack efficient integration of the flux generator with the flux sensor in a magnetic circuit designed to minimize flux loss between the flux generator and the flux sensor. Thus, there is a need for embodiments of the invention, as a signal processing device, to capture flux otherwise lost to the sensor, to improve the delivery of flux to the sensor, and to obtain the benefit of high transduction ratios of the flux generator and sensor through efficient coupling of the flux generator with the sensor.

Figure 3A:
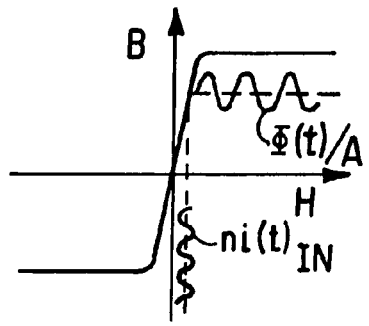
FIG. 3A is a graphical depiction of a transfer curve for a flux generator element of the invention showing the interrelationship between an input signal to the device and an intermediary flux density signal.
Figure 3B:
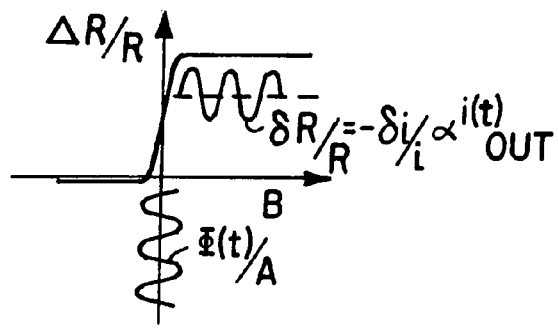
FIG. 3B is a graphical depiction of a transfer curve for a magnetic sensor element of the invention showing the inter-relationship between the intermediary flux density signal and an output signal from the device.

FIGS. 3A and 3B are graphical depictions of the transfer curves for the input (FIG. 3A) and output (FIG. 3B) elements of a transfluxistor. Although the following discussion is couched in the framework of the device shown schematically in FIG. 2, it also applies generally to other embodiments of the invention. The input transfer curve of the transfluxistor (FIG. 3A) is basically the effective B-H curve of the magnetic circuit of the flux generator 54, writer, the gap 82, and the space separating the pole tips 78 and 80 from the sensor 86, reader. Since present technology is capable of making write heads with minimal hysteresis, the B-H curve is shown as essentially closed, because the coercivity, $H_c$ of the write head is less than 3 Oe. The applied field intensity, $H_a$, is proportional to the input current, $i(t)_{IN}$, viz., $H=ni(t)_{IN}$, where n is the number of turns of the coil per length of the total magnetic circuit; and, is shown generically as entering with a time-varying or AC (alternating current) component that fluctuates about a finite positive DC (direct current) level to the right of the origin on the bottom right hand side of the B-H loop. The output flux density, B, which is the flux, $\Phi(t)$, per unit area, A, or, $\Phi(t)/A$, fluctuates about a finite positive value. Thus, the input current is transduced into a time-varying flux density, $\Phi(t)/A$, by the effective permeability, $\mu_{eff}$, of the entire magnetic circuit, given by the slope of the effective B-H loop of the flux generator, and the number of turns of the coil 74 per unit length, n, of the flux generator, writer. It will be shown later that in only the simplest of magnetic circuits can the effective permeability, $\mu_{eff}$, be taken as the permeability, $\mu_{yk}$, of the yoke alone; so that in general the effective permeability, $\mu_{eff}$, is a complex function of the reluctance of all the component parts of the flux generator in the magnetic circuit.

This flux density then enters the sensor 58 across the space between it and the flux generator 54. As a result of the continuity of B-field intensity, the field intensity in the gap and the space between the flux sensor and the flux generator equals the flux density, B=H, because the gap and the space are non-magnetic with a permeability of essentially unity. The action of this flux density on the sensor 54 is illustrated with the aid of the $\Delta R/R$-B transfer curve of FIG. 3B. Here, the representation of the sensor transfer curve differs from the usual representation as a $\Delta R/R$-H transfer curve, simplifying the discussion. For a $\Delta R/R$-H transfer curve, the flux density would have to be divided by the permeability of the sensor, $\mu_s$. In general, the flux density can enter with a DC offset to the right or left of the origin of the sensor transfer curve. Also, in the interest of simplifying the discussion, this DC offset is assumed equal to zero, because the sensor can be biased magnetically, through techniques known in the art, to compensate for some amount of DC offset in the flux density. Thus, the flux density is shown as entering the sensor as a fluctuating AC component around the mean operating point of the sensor. In the alternative, if bias of the sensor is inadequate to compensate for this offset, the current entering the flux generator can be input as a pure AC component without DC offset component, in which case biasing the sensor to overcome the DC offset component is unnecessary.

The output from the sensor appears as a variation of $\delta R/R$, which for a constant voltage source appears as $-\delta i/i$ output variation, where the differential, $-\delta i$, is identified as the AC output current from the sensor, $i(t)_{OUT}$; i, as the bias current, $I_b$; and, the negative sign indicates that as the resistance increases, the output current decreases. The ratio of output current, $i(t)_{OUT}$, to bias current, $I_b$, i.e. $-\delta i/i$, is determined by the slope of the $\Delta R/R$-B transfer curve, which is given by the sensitivity of the sensor, S times $1/\mu_s$, where $S=(\Delta R/R)/\Delta H$; $\Delta R/R$ is the full resistance change of the sensor expressed in percent resistance change; $\Delta H$ is the corresponding applied field change; and, $\mu_s$ is the permeability of the sensor. Thus, if the constant output current offset level about which the output signal current, $i(t)_{OUT}$, fluctuates is neglected, because it can be compensated with sensor bias, the output signal current, $i(t)_{OUT}$, is given by the product of the bias current with this slope, i.e. $I_b \times (\Delta R/R)/\Delta H \times (1/\mu_s)$, multiplied by the input flux density, $\Phi(t)/A$.

As a generalized derivation of the relationship between the input current, $i(t)_{IN}$, and the output current, $i(t)_{OUT}$, the output current from the sensor is related to the input current by $i(t)_{OUT} = \alpha i(t)_{IN}$ where $\alpha$ is the current amplification factor and $\alpha = \tau_{fg} \tau_s$, where $\tau_{fg}$ is the transduction factor for the flux generator, and $\tau_s$ is the transduction factor for the sensor. $\tau_{fg}$ is equal to $\mu_{eff} n$, i.e. $\tau_{fg} = \mu_{eff} n$. $\tau_s$ is equal to the bias current times the sensor sensitivity divided by the permeability of the sensor, i.e. $\tau_s = I_b \Delta R / R \Delta H \mu_s$. The bias current, $I_b$, is given by: $I_b = V_b SHt/MRW\rho$, where $V_b$ is the bias voltage, SH is the stripe height, t is the sensor thickness, MRW is the magnetoresistive sensor width, and $\rho$ is the resistivity of the sensor. Here, the SH and MRW can be identified with the height, h, and length, l, of the sensor when viewed as a thin film resistor; so that $I_b = V_b th/\rho l$. This model assumes that the sensor itself only slightly perturbs the flux flow through the flux generator, writer. As will be seen later, this assumption is valid only for the simplest of magnetic circuits. It also assumes that most of the magnetomotive force (mmf) drop occurs across the gap reluctance. Here, these assumptions of the model are useful for illustrating conceptually the operation of embodiments of the invention. But, since much of the flux is lost in the gap before it reaches the sensor under these conditions, as seen from the discussion of FIG. 2, other embodiments of the invention, discussed later, provide improvements in the current amplification factor, or current gain. It is recognized that analogous equations can be developed for a device operated with a constant bias current, $I_b$, through the sensor in terms of a voltage amplification factor, or voltage gain, discussed later.

Figure 4:
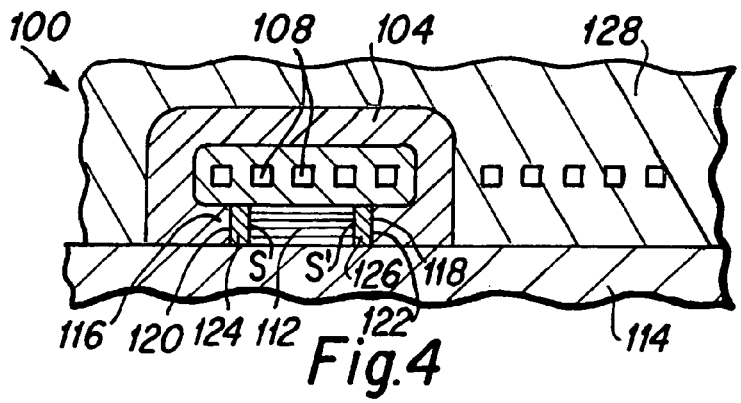
FIG. 4 is a side cross-sectional view depicting another embodiment of the present invention.

FIG. 4 is a side cross-sectional view that depicts another embodiment 100 of a transfluxistor in which the sensor is directly embedded in a gap of the flux generator. As depicted therein, a yoke 104 comprising thin film planar layers, surrounds inside portions of the thin film conductive induction lines connected to form coil turns 108 of a flux generating coil in a thin film planar layer, where a thin film planar sensor element 112 is fabricated upon a substrate 114 between thin film planar pole tip portions 116 and 118 of the yoke 104. The pole tips 116 and 118 have end surfaces 120 and 122 respectively that are generally perpendicular to the planar sensor layers of the thin film planar layers of the magnetic sensor 112. In this embodiment 100, the sensor 112 is separated from the end surfaces 120 and 122 of the pole tips 116 and 118 by electrically insulating thin film planar portions of the gap, $g_1$ 124 and $g_2$ 126. Such electrically insulating gap portions are non-magnetic, because they are typically made of non-magnetic materials such as alumina; but, to reduce their reluctances, can be made of thin film planar layers of magnetic oxides, such as the high permeability ferrimagnetic oxides, ferrites, to be discussed later. It can therefore be understood that the flux emanating from the pole tips 116 and 118 passes through first one of the end surfaces 120 and 122, leaving first one of the two and then entering the other; and, after leaving from one of the end surfaces, then passes through the sensor 112 through first one of the opposite first sensor sides S and S', entering first one of the two and then leaving the other, respectively. Depending on the application, the length of the electrically insulating portions of the gap, i.e. the distance between the sides S and S' of the sensor facing respectively the end surfaces 120 and 122 of the pole tips along the direction of flux propagation in the magnetic circuit, can be equal to or less than 1000 microns, equal to or less than 1 micron, or equal to or less than 10 nanometers. The device 100 is encapsulated in an electrically insulating material 128 such as alumina. As described above, the various components of the device embodying the invention are fabricated as thin film planar layers through techniques known from the art of fabrication of magnetic recording heads. To provide a better understanding of the orientation of the magnetoresistive sensor layers relative to the pole tips in the device 100, a perspective view of a GMR sensor 130 suitable for use in the present invention is provided in FIG. 5, and next described; but, the device may also be made using other types of magnetic sensors, particularly of the genus of MR sensors of which GMR sensors are but one species.

Figure 5:
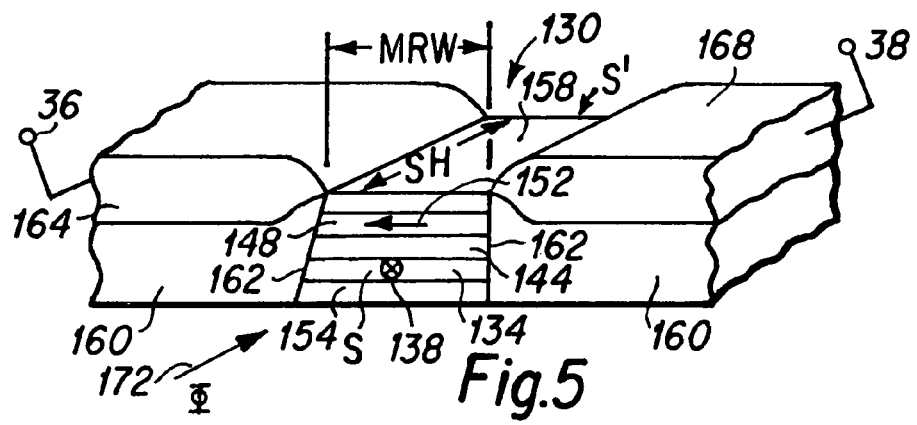
FIG. 5 is a perspective view of a magnetoresistive sensor that may be utilized in the present invention.

As depicted in FIG. 5, a GMR-SV sensor 130, which may serve as the sensor 112 in the embodiment 100, includes a first side S that corresponds to a typical air-bearing surface of an MR sensor of a typical magnetic head. The GMR sensor 130 is formed of thin film planar sensor layers that typically include a pinned magnetic layer 134 having a magnetization 138 that is directed perpendicularly to a first side S. There is also typically included a spacer layer 144 and a free magnetic layer 148 having a magnetization 152 that is nominally directed in the plane of a first side S. Other sensor layers may include an antiferromagnetic layer 154 and a cap layer 158. Hard bias elements 160, which bias the sensor to shift the operating point of the sensor along its transfer curve (see FIG. 3B), may be fabricated as thin film planar layers at a second set of sides 162 of the sensor layers, and thin film planar electrical lead elements 164 and 168, which serve as output leads 36 and 38 are formed upon the hard bias elements 160. As may be seen from FIG. 5, said second set of sensor sides are orthogonally oriented relative to said first set of sensor sides, S and S'. Because the current flowing through the sensor runs along through the planes of the sensor layers, this type of GMR sensor is therefore commonly referred to as a current in the plane (CIP) sensor. Magnetic flux, $\Phi$, 172 from the pole tip 116 is directed generally perpendicularly to a first side S along the stripe height (SH) dimension of the sensor, but orthogonal to the magnetoresistive sensor width (MRW) direction, and influences the direction of magnetization 152 of the free magnetic layer 148.

Figure 6:
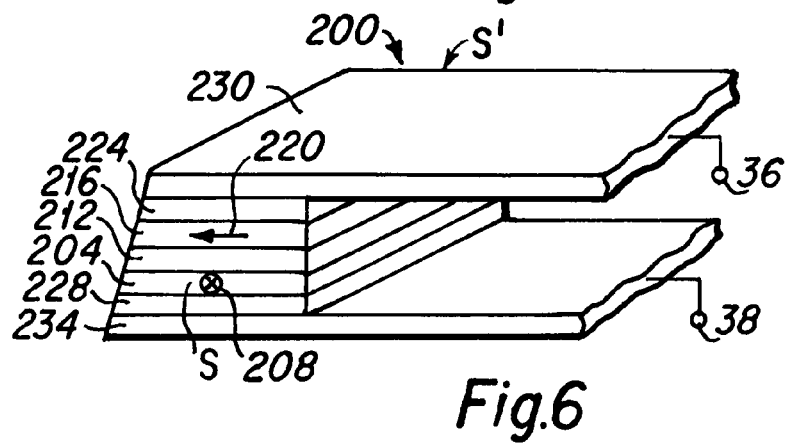
FIG. 6 is a perspective view of a tunnel valve sensor that may be utilized in the present invention.

As indicated hereabove, various types of known magnetic sensors may be utilized in the present invention, and FIG. 6 is a depiction of a current perpendicular to the plane (CPP) sensor 200 that may be used as a sensor 112 in the embodiment 100. CPP sensors are of three types depending on the nature of the spacer layer separating the pinned layer from the free layer: if the spacer layer is a non-conductor, the device is referred to as a tunnel valve (TV), tunneling magnetoresistive (TMR), or magnetic tunnel junction (MTJ) sensor; if the spacer layer is a conductor, the device is typically referred to in the art as simply a CPP-GMR or CPP-SV sensor; in which case, context usually makes clear to what the term refers, even though some ambiguity may arise because of the more generic use of this term; and, if the spacer layer is comprised of separate conductor and non-conductor regions, the device may be referred to as a hybrid CPP-TMR sensor; although because usage in the art is not firmly established, it may also be referred to as either a CPP or TMR (TV or TMJ) sensor depending on the dominance of one or the other type of region, respectively.

As depicted in FIG. 6, the CPP sensor 200 is formed of a plurality of thin film planar layers, each having a side edge that together form a surface S which corresponds to the air bearing surface of a typical CPP sensor that is used in a typical magnetic head. The CPP sensor layer may include a pinned magnetic layer 204 having a pinned magnetization 208 that is directed perpendicularly to the surface S, a spacer layer 212 being a conductor, non-conductor, or hybrid of the two, a free magnetic layer 216 having a magnetization 220 that is in the plane of the surface S, an in-stack hard bias layer 224 and an antiferromagnetic layer 228. Electrical output leads 230 and 234 are formed above and below the sensor layers, such that the sensor 200 is commonly referred to as a current perpendicular to the plane (CPP) sensor. The electrical output leads 230 and 234 can be identified with the output leads 36 and 38 of the sensor device depicted in FIG. 1, which for convenience of the drawing are shown entering and leaving the device on the same side, although in general the leads need not do so.

To fabricate a device such as embodiment 100, thin film fabrication steps as are well known in the art of magnetic head fabrication are utilized. Particularly, in a first series of fabrication steps, the MR sensor layers may be deposited as thin films across the surface of a wafer substrate. Thereafter, using photolithographic techniques, all four sides of the MR sensor 112 are created: a pair of first sides to face opposite opposing end surfaces of pole tips, and a pair of second sides connected to a pair of output leads. This differs from the fabrication of a typical MR sensor for a magnetic head where the surface S (the air bearing surface of a magnetic head sensor) is ultimately created following all wafer level fabrication steps, and after the wafer has been sliced into rows. The air bearing surface is ultimately created by a polishing and lapping process upon the edge surface of a substrate row, as will be understood by those skilled in the art. However, in the present invention, all surfaces, including the surfaces S and S' are preferably formed in the photolithographic process steps including masking of the sensor layers and the ion milling or reactive ion etching away of unmasked sensor layer material to create four sides nominally orthogonal to the plane of the sensor layers; alternatively, chemical etching may be used to remove unmasked layers as is known in the art. In the case of a CIP sensor, the four sides orthogonal to the planar layers of the sensor are disposed as follows: two of the four sides connect to output leads, and two of the sides face pole tips; but, in the case of a CPP sensor, only one pair of two opposite sides of these orthogonally oriented four face pole tips; another pair of sides parallel to the plane of the sensor layers at the top and the bottom of the stack of sensor layers connect to output leads; the other pair of orthogonally oriented sides may face end surfaces of a hard bias structure as described above for a CIP device, but with an interposed electrically insulating oxide layer to prevent shunting of current away from the sensor, as is known in the art.

Thereafter, utilizing further photolithographic techniques, the hard bias elements (if required as depending upon the type of sensor being fabricated) and the electrical leads of the output circuit are fabricated. An electrically insulating layer is deposited, which upon subsequent masking, ion milling, and/or etching forms thin electrically insulating portions of the gap, $g_1$ 124 and $g_2$ 126. The formation of such thin oxide layers at the side of a sensor is known in the art from the formation of thin oxides, a few nanometers wide, between the sensor and hard bias layers of TMR heads. Subsequently, with regard to the embodiment 100, the lower magnetic pole tip structures 116 and 118 of the yoke 104 are fabricated, such as by utilizing sputtering techniques or plating techniques. Patterned fill layers can then be deposited, the induction coil structure is then fabricated, and ultimately the upper portions of the yoke 104 are fabricated in magnetic flux connection with the lower magnetic pole tip structures 116 and 118, such as by sputtering or electroplating. The fabrication steps and techniques required to fabricate the device 100 will be well understood by those skilled in the art of fabricating magnetic heads for hard disk drives, in that the materials and structures and process steps are similar to those undertaken in fabricating magnetic sensors and inductive write heads for such magnetic heads.

Returning to the embodiment 100 depicted in FIG. 4, the sensor 112 is shown as isolated from the pole tips 116 and 118 of the flux generator by electrically insulating portions of the gap 124 and 126 having respective lengths $g_1$ and $g_2$. The total gap length, $g=g_1+SH+g_2$, where SH corresponds to the stripe height of the sensor 112; but, the main reluctance in the device will be due to $g_1+g_2$, because these will typically be made of nonmagnetic materials, whereas the sensor 112 is made primarily of magnetic material. Notwithstanding the fact that the sensor occupies some portion of the space between the pole tips of the flux generator, the gap, the structures, 124 and 126, behave analogously to the gap in a magnetic recording head, because of their low permeability compared to the sensor and the rest of the device. In particular, the free layer in the sensor is typically primarily NiFe, of a type having a low hysteresis high permeability, with substantially less reluctance than the electrically insulating portions of the gap 124 and 126.

The embodiment 100, as depicted in FIG. 4, also shows another distinction between the way the sensor and writer are laid out in a magnetic recording head and the way the analogous elements are disposed in embodiments of the present invention. In the case of a typical magnetic recording head, the sensor is isolated from the writer by magnetic shields, whereas in the embodiment 100, there are no shields shown surrounding the sensor 112, so the sensor is in direct communication with flux generator (analogous to the write element of a recording head) through the coupling flux that bridges across the electrically insulating portions of the gap 124 and 126.

Associated with the embodiment 100 depicted in FIG. 4, where most of the flux is directed through the sensor, is the fact that a magnetic sensor typically operates over fields of +/−10 Oe from the disk, whereas the writer typically operates at fields of +/−24 kG with a current swing of +/−35 mA. Under these conditions, the sensor would be easily saturated, if it were subjected to all of this flux. Therefore, for high input currents of +/−35 mA the sensor should somehow be desensitized to possible large flux densities. This can be done by increasing the electrically insulating portions of the gap 124 and 126 from a few nanometers to microns even hundreds of or a thousand microns, which portions 124 and 126 if nonmagnetic have a high reluctance. Alternatively, some of the flux could be shunted away from the sensor through flux guides (not shown in FIG. 4) positioned above and/or below the sensor, much as the magnetic shields are fabricated around an MR sensor as is known from the art of magnetic recording heads. Shielding the sensor 112 may also be desirable to prevent the fields from the coils 108 coupling directly to the sensor, which due to the inductive impedance of the yoke coil structure would be leading the flux in time, and could cause non-linearities in the output signal from the sensor. However, if the flux generator is driven at currents significantly lower than 35 mA, for instance 1 mA, the necessity of shielding is reduced.

However, driving the flux generator with low applied fields induced by low currents can create another problem which occurs because a typical flux generator is not as linear at low currents <5 mA as it is under high current operation. To overcome these non-linearities associated with inductance and the low but finite hysteresis of approximately <3 Oe of the flux generator, it may be necessary to use the hard axis loop of the flux generator, sacrificing high permeability to obtain lower coercivity and improved linearity. Nevertheless, a small nonlinearity in the output signal may have to be tolerated depending on the design chosen for embodiments of the invention directed to a particular application. Under conditions where the sensor is fully saturated in the fully conducting versus its high resistance states, such as for digital switching, this small non-linearity is probably insignificant. Moreover, the non-linearity can be reduced through material selection, such as the use of 80/20 permalloy, or other low coercivity alloys as are known in the art, in the pole tip structures 116 and 118, at some cost in maximum tolerable saturation magnetization of the pole tips located at the flux generator gap. The desirability of using low magnetostriction materials for certain embodiments of the invention is another distinction in the design of the flux generator in such devices, as compared with the design of present-day magnetic recording head write elements, where some linearity is sacrificed to achieve a higher saturation magnetization and permeability through the use of materials having higher saturation magnetization, but also higher magnetostriction coefficients.

Figure 7:
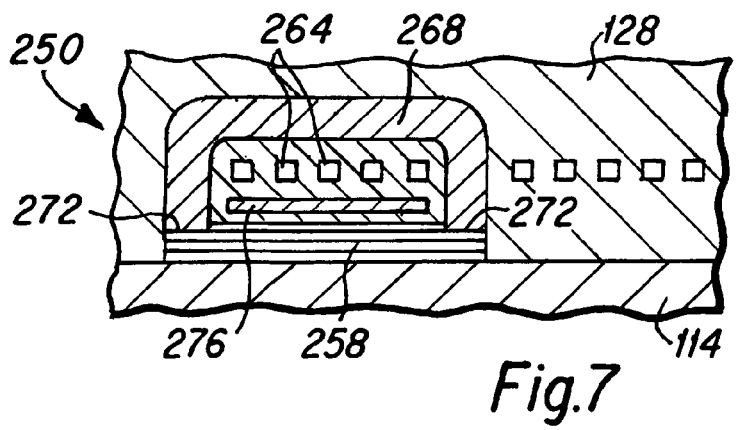
FIG. 7 is a side cross-sectional view of another embodiment of the present invention.

For low input signals of perhaps 1 mA, it is desirable to capture as much flux as possible from the flux generator and this can be accomplished by building the sensor itself into the flux generator without electrically insulating portions of the gap 124 and 126. This can be done by fabricating some or all the layers of a sensor along the bottom plane of the yoke/pole tip structure, and such a device 250 is depicted in FIG. 7. As depicted therein, the magnetic sensor layers 258 are deposited full film across the wafer surface and subsequently shaped utilizing photolithographic techniques. The magnetization of the pinned layer would be in the plane of the figure and parallel to the planar sensor layers and the magnetization of the free magnetic layer would be perpendicular to the plane of the figure as in the prior embodiments. The coil 264 and yoke 268 of the flux generator would be fabricated utilizing the photolithographic, sputtering and plating techniques referred to and described above and well known in the magnetic recording head fabrication art. A mask patterned to expose portion of the sensor layer would be formed to allow etching or ion milling of the sensor stack at locations interfacing to and below the pole tips 272 down to the free magnetic layer of a GMR or TMR sensor, or to the Permalloy layer of an AMR sensor. This would create end tabs onto which the pole tips 272 and the rest of the yoke structure 268 is plated, as shown in FIG. 7. The sensor 258 would then become integrally embedded in the flux generator as part of a closed loop ring electromagnet. Essentially, all the flux from the flux generator would thus be captured for its effect on the sensor. Although generally not required, a magnetic shield 276 can be fabricated between the sensor layer 258 and the coil 264 to shield the sensor from flux from the coil; and, as described above, such a shield can also serve as a flux guide to divert flux away from the sensor, wherein the amount of flux diversion would be determined by the gaps at either end of the shield 276 and the yoke 268. The shunting of flux can be minimized by increasing the separation between the yoke and the shield, for example, by filling the space between them with a non-magnetic material such as alumina. Finally, through image forces, the shield can be used to bias the sensor, itself, the degree of bias determined by the distance between the shield and sensor, as is well known in the art.

For the design in FIG. 7 having a long stripe height dimension, the direction of the easy axis of magnetization in the sensor may be along the stripe height dimension due to shape anisotropy; this may cause changes in the sensor transfer curve, and raise serious concerns about domain stability in the sensor. To avoid such problems, an aspect ratio of the sensor, i.e. MRW/SH, at least approximately greater than or equal to unity is desirable; and, provision should be made to maintain a single domain state in the flux sensitive portion of sensor, i.e. free layer or magnetoresistive layer, in SV or TMR, and AMR devices, respectively, through the use of exchange or hard bias structures as discussed above, and known from the art of magnetic recording sensors.

Figure 8:
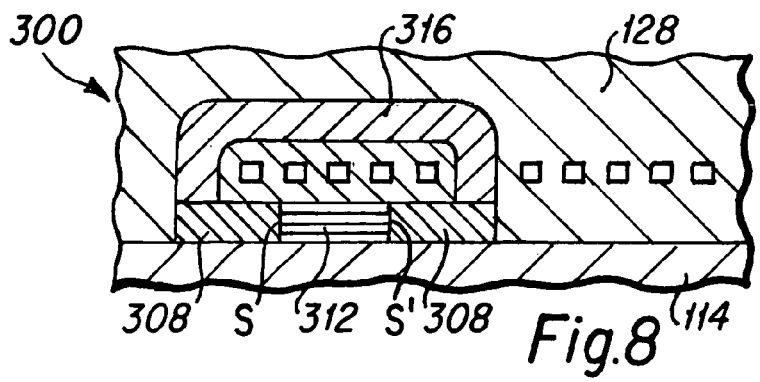
FIG. 8 is a side cross-sectional view of a further embodiment of the present invention.

Alternatively, in a device 300 that is depicted in FIG. 8, a flux guide 308 can be deposited in direct contact with the sides S and S' of the sensor 312 using ion-milling and sputtering techniques similar to those used in fabricating the lead/hard bias structures of present magnetic recording sensors. As in the previous embodiment, essentially all of the flux from the flux generator 316 would be captured for its effect upon the sensor. However, this latter structure will have deadlayers at the ends of the sensor connected to the flux guides that are artifacts of ion milling the sensor to define its stripe height. These deadlayers are nonmagnetic and in effect act like high reluctance portions of a gap having narrow dimension of approximately 2 nm. As a result, flux delivery to the sensor is reduced from the ideal situation in which high reluctance gap portions are eliminated from the magnetic circuit.

FIG. 9 depicts an alternative design 350 in which the flux generator coil 358 is displaced to the side of the sensor 364. As depicted therein, a yoke 368 can be fabricated above the inside portions of the coil turns and an elongated yoke portion 372 can extend over and around to one side S of the sensor 364, with a return yoke portion 376 being formed on the opposite side S' of the sensor 364.

For embodiments as depicted in FIGS. 7, 8, and 9, it will be recognized by those skilled in the art that current supplied to the sensor will be shunted away from it if the yoke and pole tips are made of a metallic magnetic material of high permeability such as Permalloy. To avoid such shunting a high resistivity metal with suitable magnetic properties such as high permeability and low coercivity could be used, e.g. Sendust, silicon iron, and amorphous ferromagnetic metals, all of which are easily deposited by plasma vapor deposition (PVD). However, since metals nevertheless have relatively high conductivity, it would be preferable to use an insulating oxide having suitable magnetic properties.

Ferrimagnetic ferrites are excellent candidates for such an application. Using a ferrite thin film, the entire flux guide 308 could be fabricated from a ferrimagnetic electrically insulating oxide material, such as nickel zinc ferrite, or manganese zinc ferrite. Similarly, yoke portions in communication with the sensor as depicted in FIG. 9 at the sides S and S' of the sensor could be fabricated from a ferrimagnetic electrically insulating oxide material; and even, more generally, a flux guide, a yoke, a yoke portion, or a pole tip could all be fabricated from a ferrimagnetic electrically insulating oxide material.

Because the deposition of oxide thin films is problematic using the conventional PVD methods of sputtering, thin films from which these structures are made could be deposited by using ion beam deposition (IBD) from a target containing constituents of the ferrimagnetic electrically insulating oxide material in the presence of a reactive oxygen species. This IDB deposition technique for oxides is similar to the art known for depositing barrier layers in TMR sensors or anti-ferromagnetic oxide layers in SV sensors. For example, an oxide can be deposited by ion beam sputtering the metallic constituents of the ferrite film from a metallic target whilst admitting a controlled amount of molecular oxygen gas into the sputtering chamber directed at the substrate upon which the material is being deposited; this should result in the formation of an oxide on the wafer comprised of the metallic constituents in combination with oxygen to form a ferritic oxide compound. Because of the high relative momentum of the sputtered species in IBD, sufficient kinetic energy should be available for adatoms deposited by this technique to arrange themselves in the ordered spinel structure characteristic of such ferrites without the necessity of a post-deposition thermal anneal to develop fully their magnetic properties.

With availability of such IBD ferrites for use in the fabrication of flux-carrying portions of the magnetic circuit, it should even be possible to fabricate the sensor directly on top a portion of the yoke made from such material. In one such embodiment of the invention, the free layer could be deposited directly on top of a ferrite yoke portion, or ferrite flux guide without the necessity of coupling through pole tips or even placing the sensor in a gap of the magnetic circuit.

Description of Embodiments of the Invention Having Multiple Inputs

A significant design feature of the transfluxistor is the ability to add multiple coils carrying independent signals into the flux generator. This is analogous to the way that an electron "tube" handles multiple inputs through multiple grids. Since the applied fields from multiple coils are additive, it is then possible to make a two input device that can mix signals or bias the flux generator analogous to the operation of grids in an electron tube. FIG. 10 shows a symbolic diagram for this embodiment 400 of the two-coil transfluxistor. As depicted therein, a first flux generator coil 408 is controlled by current input through leads 412 and 416. A second flux generator 424 coil is controlled by current through input leads 428 and 432. A sensor 440 receives magnetic flux 444 from the two flux generators 408 and 424 to produce an output current through leads 446 and 448.

FIG. 11 depicts an embodiment 450 of the present invention that includes two such flux-generating coils. As depicted therein, an MR sensor 458 is disposed between the pole tips 462 and 460 of a yoke 470 in a manner similar to embodiment 100 depicted in FIG. 4. A first flux-generating coil 478 is fabricated where inside portions of the turns 482 of the first coil 478 are disposed within the yoke structure 470. Additionally, a second flux-generating coil 486 is fabricated where inside portions of the coil turns 490 thereof are also disposed within the yoke structure 470. In this manner, flux generated by each of the flux generating coils 478 and 486 will be directed by the common yoke 470 to the sensor element 458.

A possible problem with this embodiment is the mutual inductance between the two coils 478 and 486. The yoke 470 will tend to drive the second set of coils with respect to the first as in a transformer, so that this device may not be truly linear in the case of time-varying or AC signals on both coils. However, if a DC current is present on one set of coils (such as 486) and a time-varying or AC signal on the other, this effect is less significant. Also, if a choke coil having an inductance, L, (not shown, though well understood by those skilled in the art) is placed in series with the DC input line, it will in effect look like a high impedance load to the secondary AC current generated on the DC coil 486. At high frequencies, since inductive impedance, $X_L$ is proportional to frequency, v, i.e. $X_L = 2\pi vL$, this impedance from the choke coil will appear as an AC open circuit and suppress the flow of parasitic current on a DC input biasing element. Such a choke coil can be created using techniques similar to those for fabricating the coils in the flux generator; and, can be fabricated on the same wafer, or monolithic substrate, in a circuit incorporating the transfluxistor. Under these conditions, the DC current level on the second set of coils 486 can serve to shift the operating point of the flux generator along the B-H curve of the flux generator. This can also serve to shift the operating point of the flux across the gap with respect to the transfer curve of the sensor, as an alternative to directly biasing the sensor through methods known in the sensor art.

FIG. 11 further shows an embodiment of a multi-coil input transfluxistor with two sets of coils 478 and 486 having different numbers of turns per unit length of the total magnetic circuit, $n_1$ and $n_2$, respectively. The different number of turns can serve to give different gain factors for each individual coil, much like differing gain factors for successive grids in an electron tube.

As an alternative to the two coil configuration with a common yoke shown in FIG. 11, it is possible to decouple, to some degree, the influence of the two signals on each other arising from mutual inductance through the yoke by spacing separate flux generators for each set of signals along a longer sensor, so that the signal for each set of coils and flux generators modulates the resistivity of the sensor at different points along its length. FIG. 12 is a top plan view of a further embodiment 500 of the present invention including a first flux generator 504, that is similar to the flux generator device of embodiment 350 depicted in FIG. 9, which is disposed along a first portion of an MR sensor stripe 508. Additionally, a second flux generator 516 is disposed along side the first flux generator 504, where the yoke 520 and coils of the second flux generator are shown fabricated on the opposite side of the sensor strip 508 from the yoke 528 and coils of the first flux generator. As drawn, these coils are so-called pancake coils in a single planar thin film layer of the device known from the art of magnetic recording writers; the advantage of a pancake coil is that it can be patterned in a single photolithographic patterning procedure, whereas the more complex helical coils to be discussed later require many separate photolithographic patterning, and several thin film deposition operations. The narrow projecting yoke portions 532 and 536 of the flux generators 504 and 516 respectively serve to reduce the overall length of the sensor 508. In this way, the two signals of the two flux generators are mixed within the output of the sensor device appearing on output leads 446 and 448. However, this design would suffer from the somewhat higher resistance of a longer sensor stripe 508. It is possible to compensate somewhat for this effect of higher resistance by making the sensor SH larger, or the sensor thicker. However, this approach also has its drawbacks because the dimensions of the sensor are often fixed by other design parameters chosen to improve sensor linearity, and stability.

Figure 13:
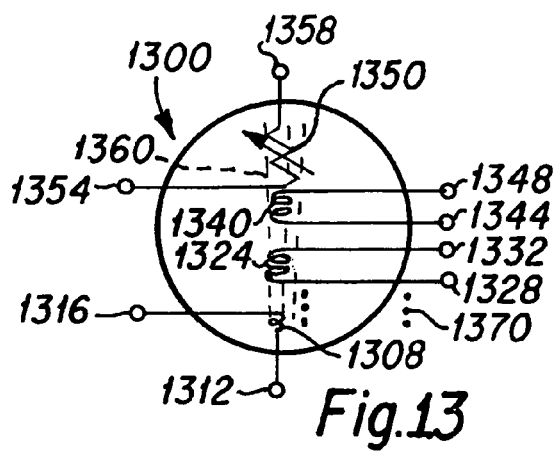
FIG. 13 is a diagram of a further embodiment of the present invention including multiple input coils.

FIG. 13 shows a symbolic diagram for an embodiment of the invention 1300, a multi-input coil transfluxistor. As depicted therein, a first flux generator coil 1308 is controlled by current input through leads 1312 and 1316. A second flux generator 1324 coil is controlled by current through input leads 1328 and 1332. A third flux generator 1340 coil is controlled by current through input leads 1344 and 1348. A sensor 1350 receives magnetic flux 1360 from multiple flux generators 1308, 1324, 1340 and others 1370 (indicated by the repeating dots) to produce an output current through leads 1354 and 1358.

Figure 14A:
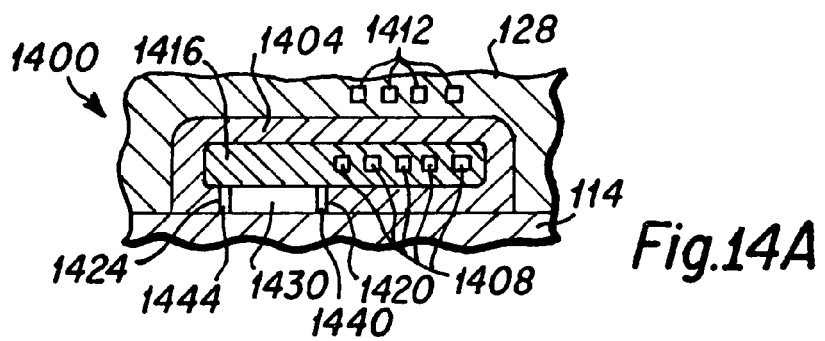
FIG. 14A is a side cross-sectional view of another embodiment of the present invention utilizing a flux generator including a helical coil.
Figure 14B:
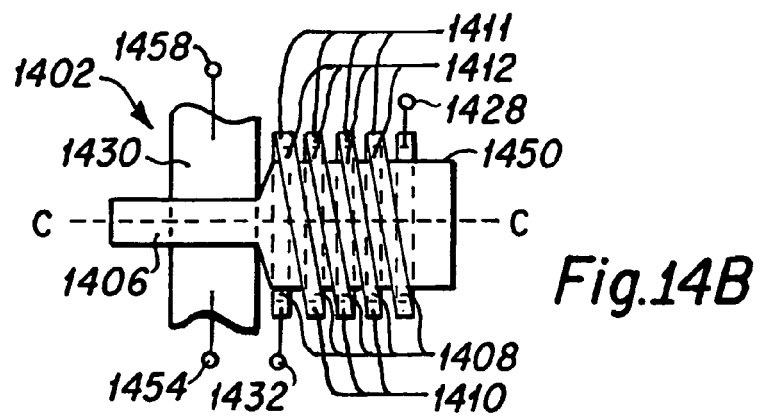
FIG. 14B is a top plan view corresponding to the embodiment of FIG. 14A of the present invention further detailing the helical coil arrangement of the flux generator of FIG. 14A.

FIG. 14A depicts in cross-section along line CC of FIG. 14B an embodiment 1400 of the present invention that uses helical coils to facilitate tighter packing of flux generators along a sensor line than that shown in FIG. 12. As depicted in FIG. 14A, an MR sensor 1430 is disposed between the pole tip portions 1420 and 1424 of a yoke 1404 in a manner similar to embodiment 100 depicted in FIG. 4. Electrically insulating portions of the gap 1444 and 1440 are interposed between the sensor sides and end surfaces of the pole tips to prevent the shunting of sensor current away from the sensor that would occur if metallic pole tips were in direct contact with the sensor. The sensor 1430, pole tip portions 1420 and 1424 of a yoke 1404, and electrically insulating portions of the gap 1444 and 1440 are fabricated in planar thin film layers on top of a substrate 114. Conductive induction line portions 1408 of a flux generating coil are fabricated forming inside portions of the turns of the coil in a planar thin film layer. These conductive induction line portions 1408 comprising inside coil turn portions are disposed within the yoke structure 1404 and thread the magnetic circuit comprised of the yoke 1404, sensor 1430, pole tips 1420 and 1424, and electrically insulating gap portions 1440 and 1444. Additionally, conductive line portions 1412 form outside portions of the turns of the coil disposed on the outside of the yoke structure 1404. The inside coil portions, conductive induction lines 1408, are connected to the outside coil portions 1412 through vertical interconnecting via portions 1410 and 1411 of the helical coil structure as shown in FIG. 14B. Electrical isolation for the inside portions 1408 of the turns of the coil from the yoke is provided by an electrically insulating encapsulating structure 1416; and, for the outside portions, by electrically insulating encapsulation 128.

The embodiment of the invention 1402 using a helical coil is further depicted in plan view by FIG. 14B. Upper yoke 1450 is shown interposed between inside coil portions, conductive induction lines 1408, and outside coil portions 1412. The inside conductive induction lines 1408, are connected to the outside coil portions 1412 through vertical interconnecting top 1410 and bottom 1411 via portions of the helical coil. The outside coil portions 1412 are connected as individual lines to alternating interconnecting vias on opposite sides of the yoke crossing from left to right over the yoke to connect the inside conductive induction lines 1408; so that a top via of an adjacent line is connected to a bottom via of the next adjacent line. A tapered yoke portion 1406 is shown that aids in the separation of flux generators to prevent cross-talk, transformer action, and mutual inductance between coils on adjacent flux generators. The sensor 1430 is shown as passing underneath the tapered upper yoke portion 1406. A pair of output leads 1458 and 1454 is shown as connected to opposite sides of the sensor 1430. Similarly, a pair of input leads 1428 and 1432 is shown connected to conductive induction lines.

Figure 15:
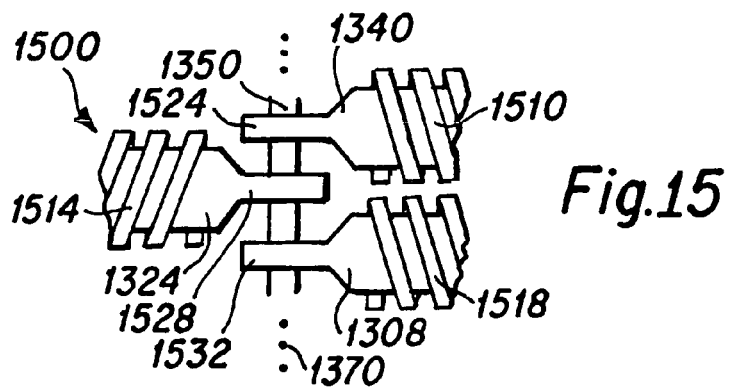
FIG. 15 is a top plan view of a further embodiment of the present invention with multiple input coils utilizing multiple flux generators each provided with a helical coil.

FIG. 15 is a top plan view of a further embodiment 1500 of the present invention including a first flux generator 1308 that is similar to the flux generator device of embodiment 1400 depicted in FIG. 14, which is disposed along a first portion of an MR sensor stripe 1350. A second flux generator 1324 is disposed along side the first flux generator 1308, where the yoke 1514 and coils of the second flux generator are shown fabricated on the opposite side of the sensor stripe from the yoke 1518 and coils of the first flux generator. Likewise, a third flux generator 1340 is disposed along side the second flux generator 1324, where the yoke 1510 and coils of the third flux generator are shown fabricated on the opposite side of the sensor stripe from the yoke 1514 and coils of the second flux generator. The narrow projecting yoke portions 1532, 1528, and 1524 of the flux generators 1308, 1324, and 1340 respectively serve to reduce the overall length of the sensor 1350. In this way, the two signals of the two flux generators are mixed within the output of the sensor. The use of helical coils makes for closer packing of the flux generators to further reduce sensor resistance from a design using pancake coils. To avoid interference of adjacent pancake coils, it is seen from the plane of the figure that a longer sensor stripe with higher sensor resistance would be required. The repeating dots indicate that this scheme could be repeated further with additional flux generators 1370 along the length of the sensor stripe.

Description of Embodiments of the Invention Having Multiple Inputs Wherein Transformer Action Between Inputs is Minimized FIG. 16 shows an embodiment of the invention 1600 that minimizes transformer action between two sets of input coils to a flux generator of one embodiment of the invention. The figure shows a cross-section through a device embodying the invention along an axis perpendicular to the coils that energize the flux generator and transversely along a center line through the yoke/pole tip structure. The figure also shows the direction of flow of the flux in two symmetrical magnetic circuits balanced so that the reluctances in each circuit are equal.

FIG. 16 depicts a left hand side (LHS) inner loop composed of: a LHS upper yoke portion 1604, having thickness, $t_4$, 1684; a LHS vertical yoke portion or leg 1632, having width, $w_1$, 1692; LHS pole tip portion 1642, having thickness, $t_1$, 1680; right hand side (RHS) pole tip portion 1644, also having thickness, $t_1$, 1680; LHS and RHS electrically insulating gap portions 1664 and 1660; a sensor 1650, having thickness, $t_s$, 1690; and, a vertical yoke portion or leg 1640 shared in common by both inner loops, having width, $w_2$, 1694. Also depicted, is a RHS inner loop composed of: a RHS upper yoke portion 1608, having thickness, $t_3$, 1686; a RHS vertical yoke portion or leg 1636, having width, $w_3$, 1696; a RHS lower yoke portion 1646, having thickness, $t_2$, 1682; and the common vertical yoke portion or leg 1640. From the figure, it may be seen that an outer loop of the magnetic circuit is composed of all the portions of the two inner loops excluding the common leg 1640.

Also depicted, are coils, $C_1$ 1612, and, $C_2$ 1616, that provide one source of flux to the sensor 1650; these coils are electrically connected electrically to each other so that the current flowing through them is the same and directed as indicated by the arrow heads and tails that represent the direction of flow of the current vectors in the coil turns shown in cross-section as small boxes. An electrically insulating encapsulating structure 1624 inside the LHS inner loop, and an electrically insulating encapsulating structure 1628 inside the RHS inner loop electrically isolates the coils, $C_1$ 1612, $C_2$ 1616, and $C_3$ 1620 from the magnetic circuit to prevent shorting. The current flowing in $C_1$ 1612 generates a flux in the LHS magnetic circuit loop in accord with the right hand rule for magnetic induction; and, similarly, the current flowing in $C_2$ 1616 generates a flux in the RHS magnetic circuit loop; the sum of these fluxes, $\Phi_{1\&2}$, 1670 is indicated by the dashed arrows shown in the outer loop. The electrical connection of the two coils is such that the flux generated by one assists, rather than cancels, that generated by the other in the outer loop containing the sensor 1650, i.e. the coils are connected assisting each other in the generation of additive reinforcing magnetic fluxes in the outer loop of the magnetic circuit including the sensor 1650. This relationship of the fluxes, $\Phi_{1\&2}$, 1670 generated by each of the two coils 1612 and 1616 is shown by the dashed arrows traversing the outer magnetic circuit loop in a counter-clockwise direction.

For two inner loops of the magnetic circuit matched to have the same reluctances, the magnitude of the fluxes generated by $C_1$ 1612, and $C_2$ 1616 are equal, provided that the two coils have the same number of turns, as shown. But, since the fluxes generated by $C_1$ 1612, and $C_2$ 1616, traverse the center vertical yoke portion, the common leg, from the bottom to the top, and from the top to the bottom, in the LHS and the RHS magnetic circuit loops, respectively, the flux due one of these coils exactly cancels that due to the other in the center yoke portion around which the third coil, $C_3$ 1620, is wound. In this way, canceling magnetic fluxes are produced in the center common leg. This is shown by dashed arrows representing the flux generated by each of the coils in the center yoke portion of equal magnitude and opposite direction. Consequently, there is no flux due to coils $C_1$ 1612 and $C_2$ 1616 flowing in the center yoke portion that may induce an electromotive force (emf), i.e. a voltage, in the coil, $C_3$ 1620, through Faraday's law of induction, as the magnitude of the flux generated by the coils, $C_1$ 1612 and $C_2$ 1616, changes, as when a time-varying or AC current is applied thereto. Thus, the transformer action effect of the outer coils, $C_1$ 1612 and $C_2$ 1616, on the center coil, $C_3$ 1620, is minimized.

In similar fashion, any changing flux, $\Phi_3$, 1674 generated by the center coil, $C_3$ 1620, generates an equal but opposite emf in each of the coils, $C_1$ 1612 and $C_2$ 1616, which cancels any induced voltage in the electrical circuit of the two coils, $C_1$ 1612 and $C_2$ 1616, because the coils are connected with such polarity and in a manner that the two emf's cancel. Thus, the transformer action effect of the center coil, $C_3$ 1620, on the electrical circuit of the outer coils, $C_1$ 1612 and $C_2$ 1616; is likewise minimized.

As indicated above, to achieve the effect of minimizing the transformer action between two input lines to the device carrying time-varying or AC signals requires that the reluctances in the two inner loops of the magnetic circuit be equally balanced. To balance the two loops, the reluctance of the left loop, which contains an active sensor, must be equal to that of the right loop without the active sensor. Reluctance, R, is given by $R=l/\mu A$, where l is the length of the portion of the magnetic circuit through which flux is driven by an applied magnetomotive force (mmf); $\mu$, the permeability of the magnetic circuit; and, A, the flux carrying cross-sectional area of that portion of the magnetic circuit. If the cross-sectional area of the circuit varies, or permeability varies, or the length of the circuit varies, the total reluctance, $R_t$, of a series magnetic circuit is given by the sum of the individual reluctances, $R_i$, for each portion of the circuit wherein the parameters are maintained constant. By way of example, in an embodiment of the invention, the cross-sectional area of the yoke may be larger than that of the sensor, and a pole tip portion of the flux generator made with cross-sectional area matching that of the sensor so that in portions of the magnetic circuit these parameters may have different values.

The left hand side (LHS) of FIG. 16 shows a portion of the magnetic circuit occupied by the pole tip structure 1642, i.e. the bottom yoke portion of the LHS magnetic circuit shown with thickness, $t_1$ 1680, the sensor with thickness, $t_s$ 1690, horizontal yoke portion with thickness, $t_4$ 1684, left-most vertical yoke portion 1632 with width, $w_1$ 1692, right-most common vertical yoke portion 1640 with width, $w_2$ 1694. In an embodiment of the invention, the LHS yoke portions are made with a constant cross-sectional area, $A_{ykLHS}$, total constant length, $l_{ykLHS}$, and a constant permeability, $\mu_{ykLHS}$; the LHS pole tip portions, with a constant but different cross-sectional area, $A_{ptLHS}$, total length, $l_{ptLHS}$, as shown the sum of the lengths of two separate pole tip portions, and a constant permeability, $\mu_{ptLHS}$; the LHS gaps, with a constant, as shown, nominal cross-sectional area, $A_{gLHS}$, total length, $l_{gLHS}$, as shown equaling the sum of the lengths of the gap on the RHS and LHS of the sensor, and a constant permeability, $\mu_{gLHS}$, assumed equal for both gaps; and, the LHS sensor, with a constant, as shown a different cross-sectional area, $A_{sLHS}$, total length, $l_{sLHS}$, and a constant permeability, $\mu_{sLHS}$. The total reluctance of the magnetic circuit shown on the LHS, $R_{tLHS}$, of FIG. 16 is given by $$R_{tLHS}=l_{ykLHS}/\mu_{ykLHS}A_{ykLHS}+l_{ptLHS}/\mu_{ptLHS}A_{ptLHS}+l_{sLHS}/\mu_{sLHS}A_{sLHS}+l_{gLHS}/\mu_{gLHs}A_{gLHs}$$

The right hand side (RHS) shows a portion of the magnetic circuit occupied by a pseudo-pole tip structure, i.e. the bottom yoke portion 1646 of the RHS magnetic circuit shown with thickness, $t_2$ 1682; a sensor is absent but an additional portion of pseudo-pole tip structure with thickness, $t_2$ 1682, is present instead; further portions of the magnetic circuit are occupied by a horizontal yoke portion 1608 with thickness, $t_3$ 1686, left-most common vertical yoke portion 1640 with width, $w_2$ 1694, right-most vertical yoke portion 1636 with width, $w_3$ 1696. In an embodiment of the invention, the RHS yoke portions are made with a constant cross-sectional area, $A_{ykRHS}$, total constant length, $l_{ykRHS}$, and a constant permeability, $\mu_{ykRHS}$; the RHS pseudo-pole tip portions, with a constant but different cross-sectional area, $A_{pptRHS}$, total length, $l_{pptRHS}$, as shown the sum of the lengths of two separate pole tip portions, and a constant permeability, $\mu_{pptRHS}$. The total reluctance of the magnetic circuit shown on the RHS, $R_{tRHS}$, of FIG. 16 is given by $$R_{tRHS}=l_{ykRHS}/\mu_{ykRHS}A_{ykRHS}+l_{pptRHS}/\mu_{ptLHS}A_{pptRHS}$$

In an embodiment of the invention that minimizes the transformer action effect between input coils of the flux generator, the total reluctance of the LHS magnetic circuit must equal that of the RHS magnetic circuit, i.e.

$$R_{tLHS}=R_{tRHS}$$

If the yoke structures are constructed essentially the same, this becomes $$l_{ptLHS}/\mu_{ptLHS}A_{ptLHS}+l_{sLHS}/\mu_{sLHS}A_{sLHS}+l_{gLHS}/\mu_{gLHS}A_{gLHS}=l_{pptRHS}/\mu_{ptLHS}A_{pptRHS}$$

This equation demonstrates a variety of ways in which the two magnetic circuits can be balanced. In a preferred embodiment of the invention, wherein the sensor width and thickness fix the cross-sectional area of the pole tips of the RHS magnetic circuit, and the cross-sectional area of the gaps, the permeability of the pseudo-pole tip structure and pole tip structure are equal, the depth dimension of both the pseudo-pole tip structure and pole tip structure are equal to the sensor width, the thickness of the pseudo-pole tip structure, $t_2$ 1682, is adjusted to satisfy the preceding equation. The thickness of the pseudo-pole tip structure, $t_{pptRHS}$, as shown, $t_2$ 1682, is then given by $$t_{pptRHS}=((l_{pptRHS}/\mu_{ptLHS})/(l_{ptLHS}/\mu_{ptLHS}+l_{sLHS}/\mu_{sLHS}+l_{gLHS}/\mu_{gLHS}))\,t_{sLHS}$$

This equation has the form of a scaling factor, $k_{sf}$, times the thickness of the sensor, $t_s$, given by $t_{pptRHS}=k_{sf}t_{sRHS}$ As shown in FIG. 16, this is equivalent to $t_2=k_{sf}t_s$ The scaling, $k_{sf}$ is given by the ratio of the lengths and permeabilities of the various structures constituting the lower yoke portions of the respective magnetic circuits on the LHS and RHS of FIG. 16 given by $$k_{sf}=(l_{pptRHS}/\mu_{ptLHS})/(l_{ptLHS}/\mu_{ptLHS}+l_{sLHS}/\mu_{sLHS}+l_{gLHS}/\mu_{gLHS})$$

Although the approach of scaling the thickness of the lower yoke portion of the magnetic circuit without the sensor is simple in concept, it may be difficult to achieve in practice because of the numerous parameters upon which the scaling factor depends. Another embodiment of the invention overcomes this problem through fabricating an identical structure to that containing the active sensor in the lower yoke portion of the RHS magnetic circuit. In other words, another identical pole tip/sensor structure is fabricated in the RHS magnetic circuit so that the LHS and the RHS of FIG. 16 are identical. Embodiments of the invention are both with and without a current being supplied to this "dummy" sensor. Depending on the application, this second sensor may also be active or passive. If active, this second sensor can be used to provide an additional output from a device embodying the invention. A state of optimum balance is approached, if the same applied current or voltage is applied to both the RHS and LHS sensors, because the same demagnetization fields due to sensor current in both sensors is then obtained. However, in general, the signal from both sensors will not be identical because the flux from the coils is additive for one sensor, while it is the difference for the other. Identical signals can be obtained only for certain types of sensors with symmetrical transfer curves under special conditions for special constraints on the currents flowing through the coils exciting the flux generator to be discussed below in further embodiments of the invention.

Since the mutual transformer action effects of $C_3$ 1620 on the electrical circuit of the outer coils, $C_1$ 1612 and $C_2$ 1616, and of $C_1$ 1612 and $C_2$ 1616 on $C_3$ 1620 is minimized, this embodiment of the invention allows for input of separate independent time varying signals to both $C_3$ 1620 and the electrical circuit of the outer coils, $C_1$ 1612 and $C_2$ 1616, to be applied to the sensor through the flux generator. This is shown in FIG. 16 by the dashed lines representing the flux generated by $C_1$ 1612 and $C_2$ 1616 and by the solid lines representing the flux generated by $C_3$ 1620 to the left and the right of the sensor 1650 in the lower yoke portion of the LHS magnetic circuit loop. As shown, the effects of flux generated by both inputs is additive, as indicated by the arrows representing these fluxes pointing in the same direction. However, the effect of the same two fluxes is subtractive in the lower yoke portion of the RHS magnetic circuit, as indicated by the arrows representing these fluxes pointing in opposite directions.

As a result of suppression of coupling between the two signal inputs, a variety of applications of this device embodying the invention are realized depending on the nature of the inputs applied to $C_3$ 1620 and the electrical circuit of the outer coils, $C_1$ 1612 and $C_2$ 1616. These applications constitute yet other embodiments of the invention. Since coupling between the two input channels is suppressed, the signals applied to inputs are in general time-varying or AC (alternating current) on DC (direct current) levels. Embodiments of the invention using such signals are as: a mixer of AC signals, regenerative and degenerative feed-back amplifiers, and oscillators. Another embodiment of the invention uses a signal on one of the inputs that is limited to a DC level; the DC level on one input is then used to bias the operating point of the sensor on the sensor transfer curve. A DC level input can also be used to alter the permeability of the flux generator magnetic circuit by driving the yoke and pole tip structures into near saturation where the permeability of ferromagnetic materials begins to drop. In this embodiment of the invention, a DC level on one of the coils is used to control the gain of the device used as an amplifier through the effect of the DC level on the permeability, $\mu$. In an embodiment, the gain controlling DC level is applied through the center coil, $C_3$ 1620, of the flux generator. In other embodiments of the invention, to avoid also saturating the sensor, it is necessary that a portion of the yoke and pole tip structures be constructed in such a way that the entirety of these structures or portions thereof saturate before the sensor does. Since the ferromagnetic materials used in the PL and FL layers of the sensor are usually selected from high permeability materials such as Permalloy, Ni80Fe20, or Fe90Co10, materials used in the magnetic circuit of the flux generator with lesser permeability are used in an embodiment of the invention. Alternatively, for a flux generator designed with a high permeability material such as permalloy, Ni80Fe20, the flux in any portion or the entirety of the magnetic circuit of the flux generator can be crowded by reducing its cross-sectional area so that that portion or the entirety of the magnetic circuit, respectively, is driven near to saturation by the DC flux generated by the gain controlling coil. In a preferred embodiment, the upper leg of the yoke structure in made with lesser cross-sectional area than the pole tip portion of the magnetic circuit which allows the gain controlling flux to drive the upper leg portion of the magnetic circuit to near magnetic saturation thereby reducing the gain due to permeability, $\mu$, through an increase in the reluctance of that portion, as the DC level is increased.

FIG. 17 illustrates another embodiment of the invention 1700, wherein more than two inputs engage the flux generator through multiple coils. In this embodiment of the invention, multiple coils are wound around the center vertical yoke portion of the flux generator. These coils provide additional inputs into the device beyond the two illustrated in FIG. 16. As shown in FIG. 17, two more coils are provided, viz. $C_4$ 1724 and $C_5$ 1728. FIG. 17 is illustrative of just one embodiment of the invention with more than two inputs.

FIG. 17 depicts a LHS inner loop composed of: a LHS upper yoke portion 1704; a LHS vertical yoke portion or leg 1742; LHS pole tip portion 1754; RHS pole tip portion 1758; LHS and RHS electrically insulating gap portions 1774 and 1770; a sensor 1760; and, a vertical yoke portion or leg 1750 common to both inner loops. Also depicted, is a RHS inner loop composed of: a RHS upper yoke portion 1708; a RHS vertical yoke portion or leg 1746; a RHS lower yoke portion 1748; and the common vertical yoke portion or leg 1750. From the figure, it may be seen that an outer loop of the magnetic circuit is composed of all the portions of the two inner loops excluding the common leg 1750.

Also depicted, are coils, $C_1$ 1712, and, $C_2$ 1716, that provide one source of flux to the sensor 1760; these coils are electrically connected in a circuit so that the current flowing through them is the same and directed as indicated by the arrowheads and tails that represent the direction of flow of the current vectors in the coil turns shown in cross-section as small boxes. An electrically insulating encapsulating structure 1732 inside the LHS inner loop, and an electrically insulating encapsulating structure 1736 inside the RHS inner loop electrically isolates the coils, $C_1$ 1712, $C_2$ 1716, $C_3$ 1720, $C_4$ 1724 and $C_5$ 1728, from the magnetic circuit to prevent shorting. The current flowing in $C_1$ 1712 generates a flux in the LHS magnetic circuit loop in accord with the right hand rule for magnetic induction; and, similarly, the current flowing in $C_2$ 1716 generates a flux in the RHS magnetic circuit loop; the sum of these fluxes, $\Phi_{1\&2}$, 1784 is indicated by the dashed arrows shown in the outer loop. The series connection of the two coils is such that the flux generated by one assists, rather than cancels, that generated by the other in the outer loop containing the sensor 1760, i.e. the coils are electrically connected assisting each other in the generation of additive reinforcing magnetic fluxes in the outer loop of the magnetic circuit including the sensor 1760. This relationship of the fluxes, $\Phi_{1\&2}$, 1784 generated by each of the two coils 1712 and 1716 is shown by the dashed arrows traversing the outer magnetic circuit loop in a counter-clockwise direction.

Alternatively, in another embodiment of the invention, additional inputs are provided by multiple coils on the outer two vertical yoke portions or legs of the magnetic circuit in pairs electrically connected assisting; or, in a combination of multiple inputs comprising both multiple coils on the center yoke vertical portion or outer vertical yoke portion. Moreover, FIG. 17 should not be construed to limit embodiments of the invention to inputs on the outer vertical yoke portions from independent operation not being electrically connected assisting. Nor should FIG. 17 or FIG. 16 be construed to limit embodiments of the invention to inputs from coils wound around the magnetic circuits as shown, as embodiments of the invention are conceived more generally to encompass conductive induction lines that merely thread the LHS and RHS magnetic circuit loops in various combinations of full coils, partial turns of coils, mere conductive induction lines threading the magnetic circuit without turns, or any combination thereof. Moreover, FIG. 17 or FIG. 16 should not be construed to limit embodiments of the invention to the "pancake" coil designs illustrated therein, as coils may be wound helically around the upper and lower horizontal portions of the RHS and LHS magnetic circuits, or combinations of "helical" and "pancake" coils wrapping various yoke portions of the magnetic circuit. In embodiments of the invention, multiple inputs are provided with various types of signals: AC, DC, or AC on a DC level in various combinations to the inputs.

In an embodiment of the invention as shown in FIG. 17, the three inputs to three coils, $C_3$ 1720, $C_4$ 1724 and $C_5$ 1728, respectively, wound around the center yoke provide inputs in addition to the pair of coils, $C_1$ 1712 and $C_2$ 1716, electrically connected assisting on the outer vertical yoke portion or legs of the flux generator. If time-varying input signals are applied to any one or more of the center three coils, this will induce an emf in the others. Unless other provision is made to block this emf, such as through the use of choke coils in series with the coils subject to this potential emf, the emf so generated will result in coupling of the these coils through a transformer action effect. In an embodiment of the invention, only DC levels are applied to the center three coils to avoid the generation of an emf therein. Alternatively, for certain applications, where an AC signal is applied to one or more of these coils, choke coils in series with the others, or frequency filters in series therewith can be used to block potential sources of emf entering the supply circuits feeding such inputs.

In an embodiment of the invention, where separate DC input currents are applied to the three center coils, flux is generated in the center vertical yoke of the magnetic circuit of the flux generator as shown in FIG. 17 by the solid arrows labeled $2\Phi_3$ 1786, $2\Phi_4$ 1784, and $2\Phi_5$ 1782; the flux from each is divided between the RHS and LHS magnetic circuit loops which are in parallel with the center yoke portion; if the reluctances on the RHS and LHS are balanced, i.e. equal, the flux generated by each of these coils in the RHS and LHS loops of the magnetic circuit equal $\Phi_3$, $\Phi_4$, and $\Phi_5$, respectively.

For the purposes of illustration, FIG. 17 shows the flux generated by coils $C_3$ 1720 and $C_5$ 1728 as upwardly directed, and the flux generated by coil $C_4$ 1724, downwardly directed through the center yoke portion, common vertical yoke portion or leg, of the magnetic circuit so that the flux divides in the RHS and LHS loops of the magnetic circuit flowing counter clockwise and clockwise, respectively, therein. These fluxes combine to give a net flux generated by the center coils at the sensor, $\Phi_{net\ center\ coils}$ 1780, shown by the solid arrow to the left of the sensor given by $$\Phi_{net\ center\ coils} = \Phi_3 - \Phi_4 + \Phi_5$$

The flux generated by inputs to the coils $C_1$ 1712 and $C_2$ 1716 is shown by the dashed arrow to the left of the sensor. In general, the flux applied to the sensor by various coils will be equal to the sum of the fluxes generated by inputs from coils on the outer vertical yoke portion or legs electrically connected assisting plus one half of the sum of the flux generated by the inputs from coils on the center vertical yoke portion or leg of the magnetic circuit taking account of the sign of the various fluxes consistent with their direction of flow through the magnetic circuit. The net flux through the sensor is then given by $$\Phi_{total\ net\ through\ sensor} = \Sigma\Phi_{i\ outer\ legs} + (1/2)\Sigma\Phi_{i\ center\ leg}$$

where $\Phi_{i\ outer\ legs}$ 1748 is the flux generated at the sensor by the ith input coil pair in the outer vertical yoke portion or legs of the magnetic circuit; $\Phi_{i\ center\ leg}$ 1748, the flux generated at the sensor by the ith input coil in the center vertical yoke portion or leg of the magnetic circuit; and, the sign of the flux relative to producing an increased output from the sensor is positive, +, for increased sensor signal, and negative, −, for decreased sensor signal.

In other embodiments of the invention, just as multiple input coils can be placed around the various yoke portions of the embodiment of the invention shown in FIG. 17, multiple sensors are placed in the various magnetic segments of RHS and LHS the magnetic circuits shown in FIG. 17. These sensors can be connected in series or parallel or other various combinations, or operated independently as multiple outputs from the device for various inputs provided on the RHS and LHS magnetic circuits. In embodiments of the invention, the incorporation of these other sensors should preferably be done so that the reluctances on the LHS and RHS loops of the magnetic circuit are balanced, i.e. equal to each other, including the effects of the various sensors on the net reluctance of both the LHS and RHS loops. The effects of these sensors on the reluctances of the magnetic circuits should not be neglected.

However, in special situations, unbalanced reluctances can be used in certain embodiments of the invention. For example, the reluctance on the LHS loop can be different from that of the RHS loop if the flux from the coils $C_1$ 1712 and $C_2$ 1716 are correspondingly adjusted by adjusting the number of turns in each so that the mmf generated by each in the LHS and RHS loops is the same. Under these conditions, the flux from each will null out on the center wound coil or coils. Moreover, the nulling of the flux on the center coils should not be construed as limiting the invention to only those embodiments wherein such fluxes are nulled out. More generally, embodiments of the invention also include those wherein the fluxes are not nulled in the center coil, and the reluctances are not balanced on the RHS and LHS loops of the magnetic circuit, although the nulling of such fluxes from the outer wound coils, $C_1$ 1712 and $C_2$ 1716, are preferred.

Description of Embodiments of the Invention Having Multiple Outputs

Figure 18:
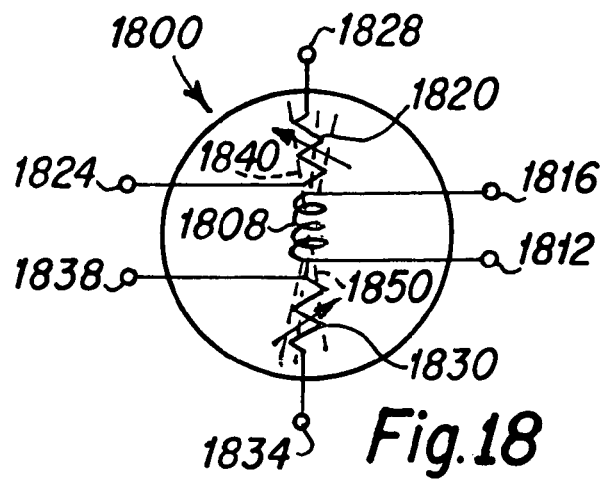
FIG. 18 is a diagram of a further embodiment of the present invention including multiple sensors.

FIG. 18 shows a symbolic diagram for this embodiment 1800 of the multi-output transfluxistor. As depicted therein, a flux generator coil 1808 is controlled by current input through leads 1812 and 1816. A first sensor 1820 receives magnetic flux 1840 from the flux generator 1808 to produce an , output . current ; through : output leads 1824 and 1828. A second sensor 1830 receives magnetic flux 1850 from the flux generator 1808 to produce an output current through output leads 1834 and 1838.

Figure 19A:
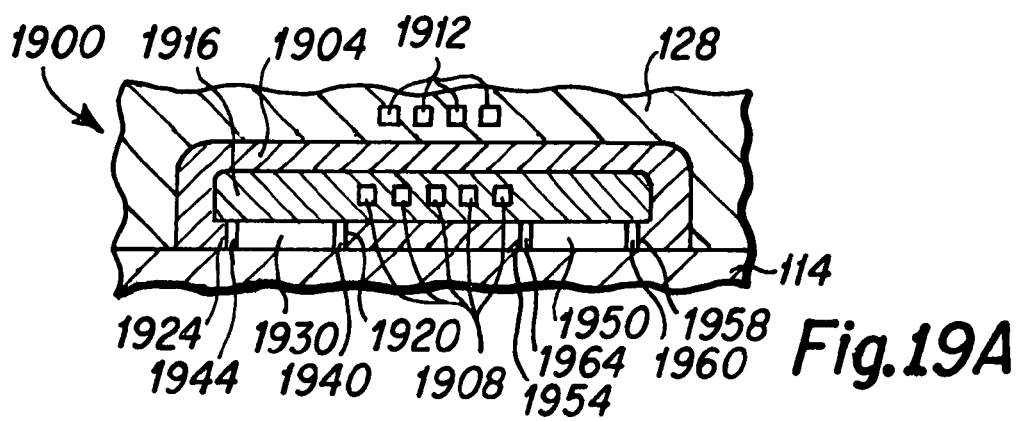
FIG. 19A is a side cross-sectional view of another embodiment of the present invention utilizing a magnetic circuit having multiple sensors and a flux generator including a helical coil.
Figure 19B:
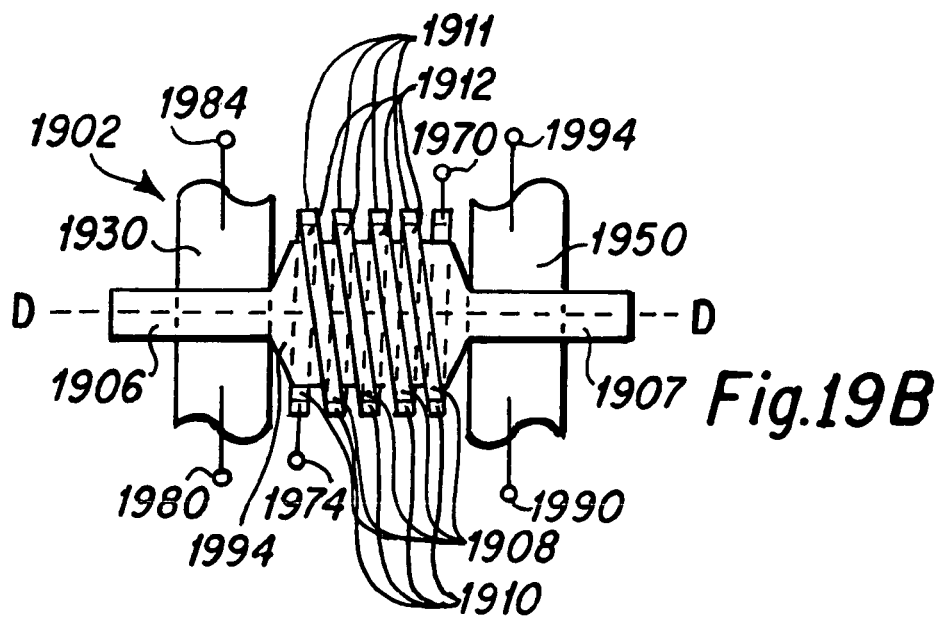
FIG. 19B is a top plan view corresponding to the embodiment of FIG. 19A of the present invention further detailing the arrangement of the multiple sensors and helical coil of the flux generator of FIG. 19A.

FIG. 19A depicts in cross-section along line DD of FIG. 19B an embodiment 1900 of the present invention that uses helical coils to facilitate tighter packing of sensors within the magnetic circuit of a transfluxistor. As depicted in FIG. 19A, a first MR sensor 1930 is disposed between first pole tip portions 1920 and 1924 of a yoke 1904. Also depicted in FIG. 19A is a second MR sensor 1930 disposed between second pole tip portions 1954 and 1958 of the yoke 1904. Electrically insulating portions of the gap 1944 and 1940 are interposed between first sensor sides and end surfaces of the first pole tips; and similarly, electrically insulating portions of the gap 1964 and 1960 are interposed between second sensor sides and end surfaces of the second pole tips, to prevent the shunting of sensor current away from the sensor. The sensor 1930, pole tip portions 1920, 1924, 1954, and 1958 of the yoke 1904, and electrically insulating portions of the gap 1940, 1944, 1960, and 1964 are fabricated in planar thin film layers on top of a substrate 114. Conductive induction line portions 1908 of a flux generating coil are fabricated as planar thin film layers forming inside portions of the turns of the coil. These conductive induction line portions 1908 comprising inside coil turn portions are disposed within the yoke structure 1904 and thread the magnetic circuit comprised of the yoke 1904, first sensor 1930, second sensor 1950, pole tips 1920, 1924, 1954, and 1958, and electrically insulating gap portions 1940, 1944, 1960, and 1964. Additionally, conductive line portions 1912 form outside portions of the turns of the coil disposed on the outside of the yoke structure 1904. The inside coil portions, conductive induction lines 1908, are connected to the outside coil portions 1912 through vertical interconnecting via portions 1910 and 1911 of the helical coil structure as shown in FIG. 19B. Electrical isolation for the inside portions 1908 of the turns of the coil from the yoke is provided by an electrically insulating encapsulating structure 1916; and, for the outside portions, by electrically insulating encapsulation 128.

The embodiment of the invention 1902 having two sensors, two output leads, and using a helical coil is further depicted in plan view by FIG. 19B. Upper yoke 1994 is shown interposed between inside coil portions, conductive induction lines 1908, and outside coil portions 1912. The inside conductive induction lines 1908, are connected to the outside coil portions 1912 through vertical interconnecting top 1910 and bottom 1911 via portions of the helical coil. The outside coil portions 1912 are connected as individual lines to alternating interconnecting vias on opposite sides of the yoke crossing from left to right over the yoke to connect the inside conductive induction lines 1908; so that a top via of an adjacent line is connected to a bottom via of the next adjacent line. Tapered yoke portions 1906 and 1907 are shown that allow for a more compact device than could be achieved with pancake coils. The first sensor 1930 is shown as passing underneath the tapered upper yoke portion 1906; and, the second sensor 1950 is shown as passing underneath the tapered upper yoke portion 1907. A pair of output leads 1980 and 1984 is shown as connected to opposite sides of the sensor 1930; and, a pair of output leads 1990 and 1994 is shown as connected to opposite sides of the sensor 1950. Similarly, a pair of input leads 1970 and 1974 is shown connected to conductive induction lines. The wavy lines at the tops and bottoms of the sensor stripes indicate that this arrangement could be used to gang multiple flux generators along the sensor stripes similar to the multi-input transfluxistor shown in FIG. 15.

Figure 20A:
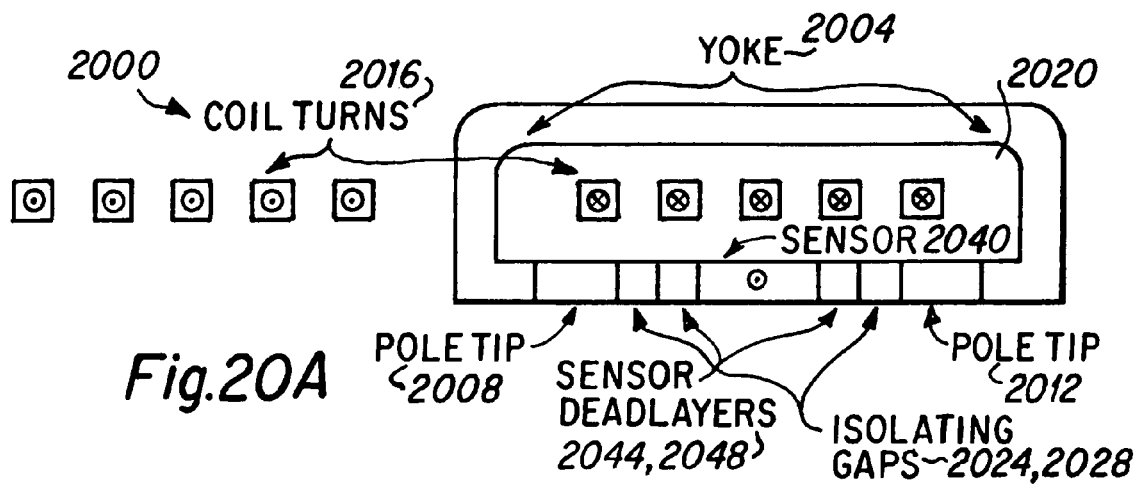
FIG. 20A is a side cross-sectional view depicting another embodiment of the present invention detailing components of a magnetic circuit embodying the invention.
Figure 20B:
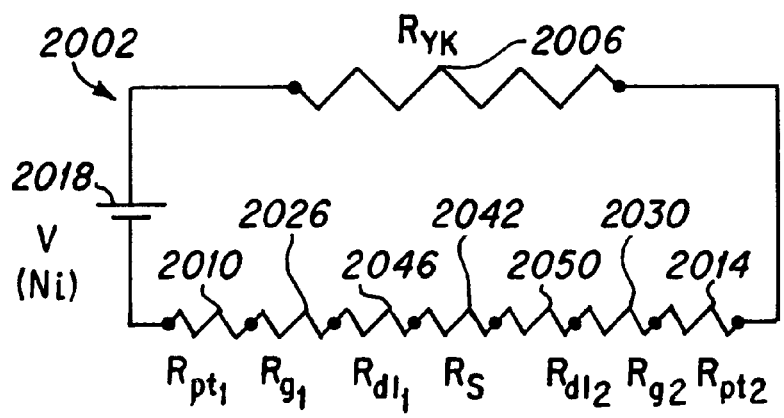
FIG. 20B is a diagram of an electrical circuit analog of the magnetic circuit of FIG. 20A useful in discussing the contributions to the net reluctance of the magnetic circuit by its various component parts.

Description of Design Considerations for Optimizing Flux Transfer from a Flux Generator to a Flux Sensor through a Magnetic Circuit A more detailed model of the magnetic circuit is useful in characterizing the operation of the device. FIG. 20A-B shows a schematic magnetic circuit 2002 that incorporates reluctances from the various structures 2000 contained in the magnetic circuit that contribute to the total reluctance of the circuit. FIG. 20A is a side cross-sectional view depicting another embodiment 2002 of the present invention detailing the components of a magnetic circuit embodying the invention. FIG. 20A depicts a thin film magnetic circuit comprising a thin film flux generator having a yoke 2004, LHS and RHS pole tip yoke portions 2008 and 2012, a gap comprise of LHS and RHS isolating gaps 2024 and 2028, and a thin film magnetoresistive sensor 2040. The flux generator further includes a plurality, five as shown, conductive induction lines threading the magnetic circuit and connected to form an induction coil with coil turns 2016, and an electrically insulating encapsulating structure 2020 isolating the inner yoke coil portions from the yoke 2004. The figure further details the structure of the sensor showing LHS and RHS sensor deadlayers 2044 and 2048 at the sides of the sensor interfacing with the pole tip end surfaces. Although other component parts of the device are present, the components selected above have been chosen to illustrate those having a dominant influence on the magnetic circuit shown schematically in FIG. 20B.

Referring now to FIG. 20B, the schematic of an equivalent analog electrical circuit 2002 is shown detailing the contributions to the net reluctance of the magnetic circuit by its various component parts enumerated above. As modeled, the circuit appears as a series circuit with a single loop with: a yoke reluctance modeled by an analog resistance $R_{yk}$ 2006; a LHS and RHS pole tip reluctance, by an analog resistances $R_{pt1}$ 2010 and $R_{pt2}$ 2014; a LHS and RHS electrically insulating gap reluctance, by an analog resistances $R_{g1}$ 2026 and $R_{g2}$ 2030; a LHS and RHS sensor deadlayer reluctance, by an analog resistances $R_{dl1}$ 2046 and $R_{dl2}$ 2050; a yoke reluctance, by an analog resistance $R_s$ 2042; and the magnetomotive force (mmf) of the coil $Ni_{IN}$, the number of turns of the coil times the input current, by an analog electromotive force (emf) or voltage source V 2018, shown as a battery. Note that this model neglects the fine details of the flux shunting through various layers of the sensor 2040, as well as the effects of the mmf generated by the current of the sensor on the sensor itself, as well as the magnetic circuit, to be discussed subsequently. Nevertheless, the model is useful for illustrating the general features of the transfer of flux from the coil through passive elements of the magnetic circuit to the sensor, and the effect of the physical dimensions and magnetic properties of these components on the flux delivered thereto.

The loop equation for the equivalent analog electrical circuit of the magnetic circuit is given by $$0 = -V + iR_{yk} + iR_{pt2} + iR_{g2} + iR_{dl2} + iR_s + iR_{dl1} + iR_{g1} + iR_{pt1}$$

where i is the electric current flowing in the circuit.

Without risk of confusion identifying the analog resistances with the reluctances, this equation is easily converted to the loop equation of the magnetic circuit:

$$0 = -Ni_{IN} + \Phi R_{yk} + \Phi R_{pt2} + \Phi R_{g2} + \Phi R_{dl2} + \Phi R_s + \Phi R_{dl1} + \Phi R_{g1} + \Phi R_{pt1}$$

where the magnetic flux flowing in the magnetic circuit, $\Phi$, is identified with i, and the mmf, $Ni_{IN}$, with the emf, V. Upon rearrangement, this gives the fundamental expression for the drop in mmf around the magnetic circuit, viz.

$$Ni_{IN} = \Phi R_{yk} + \Phi R_{pt2} + \Phi R_{g2} + \Phi R_{dl2} + \Phi R_s + \Phi R_{dl1} + \Phi R_{g1} + \Phi R_{pt1}$$

Or upon identifying the net reluctance of various component types with the sum of their parts, e.g. $R_{pt} = R_{pt1} + R_{pt2}$ becomes $$Ni_{IN} = \Phi R_{yk} + \Phi R_{pt} + \Phi R_g + \Phi R_{dl} + \Phi R_s = \Phi(R_{yk} + R_{pt} + R_g + R_{dl} + R_s)$$

Similar equations can be developed for more complex magnetic circuits embodying the invention.

Summing all of the reluctances, the expression for the field at the sensor is then given by $$B_s = Ni_{IN}/(A_s \Sigma R_i)$$

where $R_i$ is the reluctance from the ith structure, such as: the yoke, pole tips, gaps, deadlayers, sensor, etc. Substituting this expression for the field applied to the sensor by flux from the magnetic circuit into the expression for the output current, the output current can be determined as $$i_{OUT} = -(V_b th/\rho l) S_B Ni_{IN}/(A_s \Sigma R_i)$$

where $S_B$ is defined as $(\Delta R/R)(1/\Delta B)$, i.e. sensor sensitivity based on a flux density basis as given by the slope of the transfer curve in FIG. 3B; note that this differs from the usage in the art, where the sensor sensitivity, S, is defined as $(\Delta R/R)(1/\Delta H)$; so that $S_B = S/\mu_s$. This equation shows that the output from the device will be controlled by that portion or those portions of the magnetic circuit having the largest reluctance. Again, this indicates the need for a device wherein the reluctances of the electrically insulating gap portions of the gap and the sensor deadlayers are reduced to optimize the gain from the sensor.

Upon substitution for the reluctances in terms of the physical dimensions and magnetic properties of the component parts of the magnetic circuit, this equation becomes $$i_{OUT} = -(V_b th/\rho l) S_B Ni_{IN}/(A_s(l_{yk}/\mu_{yk}A_{yk} + l_{pt}/\mu_{pt}A_{pt} + l_g/\mu_g A_g + l_s/\mu_s A_s + l_{dl}/\mu_{dl}A_{dl}))$$

where A, l, and $\mu$ are respectively the area, length along, and permeability of the component parts of the magnetic circuit; and where the subscripts yk, pt, g, s, and dl refer respectively to the yoke, pole tips, electrically insulating gap portions, sensor, and sensor deadlayers. Simplifying this expression in terms of the reluctances, it becomes $$i_{OUT} = -(V_b th/\rho l) S_B Ni_{IN}/(A_s(R_{yk} + R_{pt} + R_g + R_s + R_{dl}))$$

Defining the efficiency of flux delivery to the sensor, $\eta_s$, by:

$$\eta_s = R_s/(R_{yk} + R_{pt} + R_g + R_s + R_{dl})$$

the sensor output current is then given by:

$$i_{OUT} = -(V_b th/\rho l) S_B Ni_{IN} \eta_s/(R_s A_s)$$

This equation is useful in providing the fundamental operating characteristic of an embodiment of the invention. It shows that the output current, $i_{OUT}$, from the electrical signal processing device embodying the invention will increase as the reluctance of the sensor, $R_s$, decreases and the efficiency of flux delivery to the sensor, $\eta_s$, increases. Since the efficiency of the magnetic circuit for flux delivery to the sensor, $\eta_s$, depends on $R_s$ in the numerator of the ratio, this really means that the ratio $\eta_s/R_s$ is independent of $R_s$ and that the output current, $i_{OUT}$, really increases as the denominator of $\eta_s$, decreases, which is the net reluctance of the magnetic circuit, i.e. the sum of the reluctances of all its component parts. Nevertheless, the value of modeling the sensor in terms of the efficiency, $\eta_s$, is that it bears certain formal similarities to the equation for the efficiency of flux delivery to the gap of magnetic recording heads. Thus, it is helpful in applying the design principles of magnetic recording heads to devices embodying the invention.

The reluctance of the sensor is dependent on parameters that also affect sensitivity. Therefore, for a fixed sensitivity of the sensor, the reluctance of the sensor is probably fixed. On the other hand, the maximum efficiency achievable is given for $\eta_s = 1$. This condition is approached as the contribution to the net reluctance from other sources in the magnetic circuit are reduced or approach zero. Therefore, an object of an embodiment of the invention is a signal processing device having high flux transfer efficiency to the sensor.

Referring again to FIG. 20A-B, now with reference to the equation for the sensor output current in terms of flux delivery efficiency to the sensor, $\eta_s$, a novel aspect of embodiments of the invention is the reduction or elimination of the contributions to the reluctance of the magnetic circuit from component parts of the magnetic circuit other than the sensor. Returning to the embodiment of the invention 2000 depicted in FIG. 20A, the cross-sectional view of a magnetic circuit of a device embodying the invention shown cut along its center line illustrates the various structures comprising said magnetic circuit that offer resistance to the flow of flux by virtue of their respective reluctances. The yoke structure 2004 is shown threaded by 5 turns of a coil 2016 that provides a source of mmf, $Ni_{IN}$ to drive the flux through the magnetic circuit. The yoke 2004 is connected to pole tip portions 2008 and 2012 of the yoke disposed on opposite sides of a sensor 2040 used to pass an input signal through current, $i_{IN}$, passing through the coil 2016 into a useful output signal, e.g. $i_{OUT}$, due to the magnetoresistance developed in the sensor 2040 through the effect of flux generated by the input current on the current flowing through, or voltage impressed across, the sensor 2040. The direction of current flow through the coil 2016 is shown by the vector arrowheads and tails in the boxes denoting the coil turns in cross-section; likewise, a similar vector arrow head shows the direction of bias current flow through the sensor. The pole tip portions 2008 and 2012 provide flux communication between the sensor and the yoke by connecting the two, and connect to the former through contiguous electrically insulating gap portions of the yoke 2024 and 2028, and deadlayers 2044 and 2048 disposed on opposite sides of the sensor.

The deadlayers 2044 and 2048 are in fact inactive portions of the sensor insensitive to the effects of flux because of poisoning of the magnetic properties of the same as an artifact of defining the height of the sensor along the direction of flux flow. These deadlayers 2044 and 2048 are produced through ion-milling, or other processes, used to define the sensor lateral dimensions in the plane of the thin film layers in which it is fabricated; and, in the case of ion milling, consist of those portions of the edge of the sensor implanted with a sufficiently high dose of argon to render said portions non-magnetic. With respect to the junctions between the yoke and pole tips, said junctions can be made with a sufficiently small enough reluctance to make their effect on the magnetic circuit negligible. This is done by making the junctions between the yoke and pole tips very narrow and the cross-sectional area of the same very large. This technique used to reduce the reluctance of the junctions between the yoke and pole tips can also be used to minimize the reluctances of the deadlayers 2044 and 2048 and electrically insulating gap portions 2024 and 2028, as will be shown below. In one embodiment of the invention, the electrically insulating gap portions 2024 and 2028 consist of relatively thin layers of electrically insulating material, e.g. sputtered Al2O3, or sputtered SiO2, disposed on each side of the sensor and approximately 5 to 10 nm long in the direction of flux flow. The dimensions of the deadlayers are nominally approximately 1.5 to 2.0 nm long in the direction of flux flow on each side of the sensor. In one embodiment of the invention, the cross-sectional areas of the sensor 2040, electrically insulating gap portions 2024 and 2028, deadlayers 2044 and 2048, and face of the pole tips 2008 and 2012 adjacent to the sensor are essentially the same, being determined by the cross-sectional area $A_s$ of the sensor perpendicular to the direction of flux flow through the sensor.

The following facilitates the discussion of FIG. 20 with respect to expressions giving the output signals from devices embodying the invention. A better basis for expressing the sensitivity of the sensor is in terms of the percent $\Delta R/R$ per unit of applied magnetic field or field intensity $H_a$, rather than flux density B, because this facilitates benchmarking the performance of devices embodying the invention for different sensor structures based on values published for the sensitivity of such structures, which is usually given in terms of excitation based on applied magnetic field intensity. Expressing the output current, $i_{OUT}$, on this basis, one obtains $$i_{OUT} = -(V_b th/\rho l) \, SNi_{IN}/(\mu_s A_s (R_{yk} + R_{pt} + R_g + R_s + R_{dl}))$$

where, an additional factor of, $\mu_s$, the sensor permeability, approximately 2500, appears in the denominator of the RHS. Upon substitution of the expression for the efficiency of flux delivery to the sensor, $\eta_s$, this becomes $$i_{OUT} = -(V_b th/\rho l) SNi_{IN} \eta_s / (R_s \mu_s A_s)$$

which upon substitution of the expression for the sensor reluctance, becomes $$i_{OUT} = -(V_b th/\rho l) SNi_{IN} \eta_s / l_s$$

which indicates that output current should increase if the length of the sensor is decreased.

Description of Low-Reluctance Embodiments of the Invention

The following describes the theory of operation of embodiments of the invention, devices for electrical signal translation and amplification of current or voltage inputs into current or voltage outputs. The ideal device is fabricated without non-magnetic gap portions, whereas a non-magnetic gap is an essential part of a magnetic recording write element. The absence of non-magnetic gap portions facilitates the delivery of flux from the input coil to the sensor through a low-reluctance magnetic circuit. A device having a low reluctance magnetic circuit possesses a performance advantage for signal gain in the translation of signals between inputs and outputs. However, it may not be possible to completely eliminate non-magnetic gap portions for all embodiments of the invention, because of the effects of shape anisotropy, and bias current shunting on device operation. Nevertheless, an idealized device model based on device without non-magnetic gap portions serves to illustrate important design principles for embodiments of the invention. To the degree that non-magnetic gap portions are reduced or eliminated without incurring these other performance detractors, the closer embodiments of the invention come to achieving improvements in signal gain over devices having non-magnetic gap portions. Therefore, it is useful to consider the operation of a device based on a design without non-magnetic gap portions.

A magnetoresistive sensor is basically a variable resistor that changes its resistance in response to an applied field. The resistance of the sensor is based on Ohm's Law, V=RI, where R is the resistance of the sensor, I is the current flowing through it, and V is the voltage drop across the sensor. Ohm's Law for a sensor that is a parallelepiped of thin film resistive material takes the form: $V=(\rho l/th)I$, where $\rho$ is the resistivity of the thin film resistor; t, the thickness of the film; l, the length of the resistor along the path of current flow, referred to in the art as the magnetoresistive sensor width, MRW; and h, the dimension of the sensor perpendicular to its thickness direction and the direction of current flow, but parallel to the direction of applied flux, commonly referred to in the art as the sensor stripe height, SH.

The above equation for the thin film resistor can be differentiated in terms of the parameters that change in device operation giving, viz.

$$dV = d\rho (l/th)I + (\rho l/th)dI = (l/th)(Id\rho + \rho dI)$$

If the device is biased by a constant voltage source, dV=0; then, the following equation for the change of current with a change in the resistivity of the device applies: $dI = -Id\rho/\rho$ The negative sign on the RHS (right hand side) indicates that as the resistivity increases, the current decreases.

This differential equation can be converted to an equation in terms of finite differences, where small incremental changes of the current, $\Delta I$, are generated by small incremental changes in the resistivity, $\Delta \rho$, yielding: $\Delta I = -I\Delta\rho/\rho$. For small changes in the current, it may be assumed that I is essentially constant. Then, for a constant applied voltage I=V/R, and substituting $R = \rho l/th$ for the resistance of a thin film resistor, one gets:

$$\Delta I = -(V/(\rho l/th))(\Delta \rho / \rho)$$

which is correct to first order for small changes in resistance and current through the sensor. The incremental change in current, $\Delta I$, is just the output current, $i_{OUT}$, from the device so that upon identifying V with a constant applied bias voltage to the device, $V_b$: $i_{OUT} = -(V_b/(\rho l/th))(\Delta \rho / \rho)$ The sensor sensitivity is defined by $S = (\Delta \rho / \rho)/\Delta H_a$, where $\Delta H_a$ is the applied field that produces the full resistance change in the sensor. The sensitivity is also often expressed in terms of the percentage resistance change of the device, in which case the field is omitted from the expression, it being understood that the applied field drives the device to its full resistance change. This sensitivity is distinguished from the former, viz.

$$S_p = \Delta R/R = \Delta \rho / \rho \text{ so that } S_p = S \Delta H_a.$$

The flux density generated by the flux generator, $B_{fg}$, is given by: $B_{fg} = \mu_{fg} H_{fg}$, where $\mu_{fg}$ is the permeability of the material in the flux generator; $H_{fg}$, the field intensity generated by the coil given by: $H_{fg} = ni_{IN}$ where n is the number of coil turns per unit of length of the entire magnetic circuit; $i_{IN}$, the current input into the flux generator through the coil, or input current of the device. The B field generated by the flux generator, $B_{fg}$, is given by: $B_{fg} = \mu_{fg} n i_{IN}$ The flux, $\Phi$, is determined by the total reluctance of the magnetic circuit, $R_t$, given by: $R_t = R_{fg} + R_s$ where $R_{fg}$ is the reluctance of the flux generator; and, $R_s$, the reluctance of the sensor given by: $R_{fg} = l_{fg}/\mu_{fg} A_{fg}$ and $R_s = l_s/\mu_s A_s$ where $l_{fg}$ is the length of the flux generator; $\mu_{fg}$, the permeability of the flux generator; $A_{fg}$, the cross-sectional area of the flux generator; and, $l_s$ is the length of the sensor; $\mu_s$, the permeability of the sensor; $A_s$, the cross-sectional area of the sensor; so that, $\Phi = Ni_{IN}/R_t$ where N is the number of coil turns. Thus, the flux density available to apply to the sensor is given by: $B_s = \Phi/A_s = Ni_{IN}/A_s R_t$ Since the field intensity in the sensor is given by: $H_s = B_s/\mu_s$, the field intensity available to drive the sensor is given by: $H_s = \Phi/\mu_s A_s = Ni_{IN}/\mu_s R_t$ By analogy with magnetic recording heads, an efficiency of flux delivery to the sensor, $\eta_s$, can be defined analogous to the efficiency of flux delivery to the gap of a magnetic recording head. For this embodiment of the invention, the gap is replaced by the sensor, so that s is given by: $\eta_s = R_s/(R_{fg} + R_s)$ The field intensity available to drive the sensor is then given by:

$$H_s = Ni_{IN} \eta_s / \mu_s A_s R_s$$

For this ideal, low-reluctance embodiment of the invention, the magnetic circuit is assumed to be free of the high reluctance gap so that flux generated by the magnetomotive force (mmf) of the coil, $Ni_{IN}$, is efficiently delivered to the sensor. Assuming for simplicity that the magnetic circuit of the device is essentially that of a closed loop of constant permeability and cross-sectional area, similar to a toroid, the cross-sectional area and permeability of the flux generator is equal to that of the sensor; and, since the length of the sensor is much shorter than that of the flux generator, the efficiency is limited primarily by the reluctance of the flux generator so that the field intensity available to drive the sensor becomes: $H_s = Ni_{IN}/l_{fg}$ which for large $l_{fg}$ becomes essentially: $H_s = ni_{IN}$. For the case where the permeabilities of the sensor and flux generator differ, an alternative expression applies, viz. $H_s = ni_{IN} \mu_{fg}/\mu_s$ which shows that the field at the sensor can be improved for a flux generator having higher permeability than that of the sensor.

Substituting for the relative change in resistivity in terms of sensitivity and applied field, the following is obtained: $\Delta \rho / \rho = Sni_{IN}$ Substituting this expression into the formula for output current gives the dependence of output current on the input current applied to the device:

$$i_{OUT} = -(V_b th/\rho l) Sni_{IN}$$

From this equation for the dependence of output current on input current, the form of the dependence of the current amplification factor, $\alpha$, or current gain, $G_i$, upon device design parameters is obtained, after rearranging terms:

$$G_i = -\alpha = i_{OUT}/i_{IN} = -V_b th Sn/\rho l$$

The negative sign indicates that the input and output currents are out of phase by 180°. In other words, as the input current rises, the output current falls. The sign becomes positive for a sensor in which the resistance decreases, as the field increases. Alternatively, for a flux generator with a permeability differing from that of the sensor, the current gain is given by:

$$G_i = -\alpha = i_{OUT}/i_{IN} = -V_b (th Sn/\rho l)(\mu_{fg}/\mu_s)$$

which is recognized as equivalent to the form derived earlier in the discussion of fundamental device operation described by FIG. 3.

However, in the general case, the effective permeability of the flux generator could be substantially less than the sensor permeability, i.e. $\mu_{fg} = \mu_{eff} \ll \mu_s$ in which case the design advantage of higher current gain is not realized, for example, because of the presence of non-magnetic gap portions with high reluctance and low permeability as represented by the embodiment of the invention as shown in FIG. 2. In an embodiment of the invention without non-magnetic gap portions, if the permeability of the flux generator is equal to or greater than that of the sensor:

$$\mu_{fg} = \mu_s \text{ or } \mu_{fg} > \mu_s$$

an improvement in current gain from the device can be realized. This suggests that an embodiment of the invention in which the permeability of the flux generator exceeds that of the sensor would provide a device with additional gain. However, control of magnetostriction probably limits the choices of material for both the flux generator and sensor to similar, if not identical, materials, e.g. Permalloy with a composition of 79% Ni and 21% Fe. For the remainder of this section regarding embodiments of the invention having low reluctance magnetic circuits, it will be assumed that the permeability of the flux generator is equal to that of the sensor. However, there is a caveat when the two are not equal that the results need to be modified consistent with those above.

By similar arguments, equations can be obtained for other biasing schemes of the sensor. For example, when the sensor is run in a current biased mode, i.e. constant applied bias current, $I_b$, the following equation applies to the input and output voltage signals, $v_{IN}$ and $v_{OUT}$, respectively:

$$v_{OUT} = (I_b \rho l/th) Snv_{IN}/R_{IN}$$

where $R_{IN}$ is the input resistance of the device, i.e. the coil resistance of the flux generator, assuming other impedances in the input circuit are negligible. The sign is positive indicating no phase change in the output signal generated by this device. This equation describes the dependence of output voltage on input voltage and provides the form of the dependence of the voltage amplification factor, i.e. voltage gain, $G_v$, upon device design parameters after rearranging terms:

$$G_v = v_{OUT}/v_{IN} = I_b \rho l Sn/th R_{IN}$$

Another parametric equation describes the operation of the device in a hybrid mode where the input current varies to produce an output voltage under constant current bias of the sensor, viz.

$$v_{OUT} = (I_b \rho l/th) Sni_{IN}$$

Analogously, a transfer factor, $G_{v/i}$, is defined by:

$$G_{v/i} = v_{OUT}/i_{IN} = I_b \rho l Sn/th$$

A parametric equation that describes the operation of the device in another hybrid mode where the input voltage varies to produce an output current under constant voltage bias of the sensor is given by:

$$i_{OUT} = -(V_b th/\rho l) Snv_{IN}/R_{IN}$$

An analogous transfer factor, $G_{i/v}$, is defined for this case by:

$$G_{i/v} = i_{OUT}/v_{IN} = -(V_b th/\rho l) Sn/R_{IN}$$

For each of these cases, the absolute magnitudes of the respective transfer factor or gain factors are increased by increasing the value of parameters in the numerator and decreasing the value of those parameters appearing in the denominators of the respective expressions. The expressions for the transfer and gain factors all show a directly proportional dependence on S and n that indicates that these factors increase in absolute magnitude as S and n increase, giving one figure of merit for device performance. Therefore, various embodiments of the invention, described by these parametric equations, will all have improved performance, as measured by gain or transfer factor, if sensors with high sensitivity, a flux generator with a high permeability, or a coil design with a large number of turns is employed.

However, the dependence of these gain and transfer factors on sensor thickness, t, length, l, height, h, and resistivity, $\rho$, depend on the application of the device. Thus, when the device is used to maximize output current for a given voltage or current input, the thickness, t, and height, h, of the sensor should be made large, and the length, l, and resistivity, $\rho$, of the sensor should be made small to increase the current flow through the device upon which the output current, $i_{OUT}$, depends. On the other hand, when the device is used to maximize output voltage for a given voltage or current input, the thickness, t, and height, h, of the sensor should be made small, and the length, l, and resistivity, ρ, of the sensor should be made large to increase the voltage drop across the device upon which the output voltage, $v_{OUT}$, depends.

These gain and transfer factors also depend on the values of applied bias and whether it be constant voltage, $V_b$, or constant current, $I_b$. For a device providing a current output signal, a large constant bias voltage, $V_b$, should be chosen. For a device providing a voltage output signal, a large constant bias current, $I_b$, should be chosen. Lastly, for devices functioning to amplify the effects of an input voltage, $V_{IN}$, a low value of the input resistance, determined primarily by the coil resistance, $R_{IN}$, should be chosen.

The respective upper limits and lower limits on the selection of values for these parameters may be set by other constraints on the device performance. Therefore, maximizing the value of these parameters up to the limits set by such other constraints will determine the optimum value for a given application or use of an embodiment of the invention. For example, the selection of a sensor with a large sensitivity, S, might be limited by other concerns with respect to the device operation. In the case of a current output device, a less sensitive sensor might be chosen, because the sensor can handle larger currents through greater values of the thickness, t, and height, h, and smaller values of the length, l, and resistivity, ρ, to increase the current flow through the sensor. Under such conditions of high current flow, other sensors having greater sensitivity might fail sooner, because of a critical dependence of mean time to failure (MTTF) on sensor current, joule heating, or operating temperature due to the physical construction of such a high sensitivity sensor.

In the case of a current output device, the value of the applied constant voltage bias, $V_b$, should be made high so that the nominal current flowing through the sensor given by $V_b$ th/ρl is large, but not so large that the self biasing effects from this current lessen the sensitivity of the sensor by saturating its magnetization in the direction of the applied field, $H_a$. Likewise, N, the number of coil turns, should not be so large as to lead to excessively large applied field at the sensor driving it, the yoke, or pole tips to saturation, or creating as excessive inductance for the device.

The choice of permeability for flux generator, $\mu_{fg}$, i.e. the yoke and pole tips, should be made high to increase the flux density at the sensor. However, the practical considerations of control of composition of the material so that permeability is reproducible from device to device may limit the material of choice. For example, plated Permalloy with a composition of Ni:Fe of 79:21 is well understood; and its compositional control is known from its use in magnetic recording head technology. To take advantage of manufacturing economies attending its use in devices embodying the invention, it would be logical to choose such a material for the yoke and pole tip structures of the flux generator. Also, this composition of Permalloy has a particularly low magnetostriction coefficient, λ, which facilitates making a flux generator structure with negligible stress-induced, magnetic anisotropy. As a result, the hysteresis loop of a flux generator made with a Permalloy yoke and pole tips will have low coercivity making the transfer curve of the device more linear.

In the case of a voltage output device, sensors with the highest sensitivity should be used, such as spin valves (SV's), and tunneling magnetoresistive sensors (TMR's). The resistance of the sensor should be made high through greater values of the length, l, and resistivity, ρ, and smaller values of the thickness, t, and height, h, to increase the voltage drop across the sensor. However, the resistance should not be made so high that Johnson noise becomes an issue with respect to the noise performance of the device. The resistivity, ρ, of a high sensitivity sensor may be limited by the physical construction of the sensor giving rise to its high sensitivity, such as the thickness of spacer layers or tunnel layers, in spin valves (SV's), and tunneling magnetoresistive sensors (TMR's), respectively. The selection of the constant bias current, $I_b$, should not be so high as to create an excessive voltage drop across the device that creates electric fields high enough to induce breakdown of dielectric layers such as the tunneling oxide layer in magnetic tunnel junction sensors, presently the sensors with highest sensitivity, or current densities high enough to produce electromigration of constituents in the direction of current flow through conductive sensor layers of small cross-sectional area.

With respect to the selection of a value of S, note that embodiments of the invention allow for freedom to select various types of sensors with different values of S depending on the use of the device and practical constraints with respect to manufacturing. Thus, for a high-end application, the additional cost of fabrication of a high sensitivity sensor might be justified by the ability to recapture its cost of production plus a reasonable profit. On the other hand, for a low-end application, the additional cost of a high sensitivity sensor might not be justified.

In addition, other factors besides manufacturability might affect the selection of a particular sensor, because of the nature of the application, for example, making the selection of a sensor with lesser sensitivity desirable. Two examples of such applications discussed above were the invention's use as a current amplifier, or as a voltage amplifier. Other applications that might arise would be the use of the invention as a variety of digital devices. Thus, in selecting a particular sensor for a particular embodiment of the invention, it is desirable to match the sensor to the flux generator. Therefore, the design of the sensor and the flux generator deviate from those typically encountered in magnetic recording technology; magnetic recording technology imposes constraints on the design of the read and write element structures to meet the demands of high density magnetic recording to a magnetic recording disk. Embodiments of the invention are liberated from the constraints imposed by these demands, because such embodiments are not being used to directly record to a disk. In particular, some sensors are rather thin compared to the dimensions of the yoke and pole tips met in typical recording element designs for magnetic recording heads. One way in which the design of the sensor and the flux generator will deviate from those typically encountered in magnetic recording technology is in the thickness of the sensor and the pole tips of the flux generator. This creates the opportunity for obtaining additional sources of gain not necessarily reflected in the above equations.

Magnetic recording sensors have already been optimized to produce signals utilizing high sensitivity. However, the thickness, width and height dimensions of such sensors are constantly being driven smaller to meet the demands of high density magnetic recording, as driven by ever decreasing bit sizes on, and fly heights relative to the recording disk. However, embodiments of this invention place no such constraints on the sensor design. Therefore, the possibility exists to improve the performance of devices embodying the invention by altering these dimensions from those used in magnetic recording technology. A few of these possibilities were elaborated above in the discussion with respect to the dependence of gain or transfer factors on sensor dimensions. But, one aspect of this invention is to take advantage of the miniaturized designs of magnetic recording head structures for the purpose of a making a miniaturized device suitable for coupling several such devices in an integrated circuit on a monolithic substrate. Where such devices are based on magnetic properties of such circuit elements, analogous to the use of field effect transistors (FET's) in semiconductor monolithic integrated circuits.

This raises the issue that the optimum pole tip dimensions differ from the optimum dimensions of the sensor with which it is to be interfaced in devices embodying the invention. The height of the typical recording pole tip is typically one to a few microns, which is many times higher than the thickness of a typical sensor, which is on the order of a few tens of nanometers. The width of the typical recording pole tip is generally wider than the width of the sensor by a few tens of percent to allow for a write-wide, read-narrow recording method for information recorded on, and read from a disk. The user of a particular embodiment of the invention is therefore faced with the task of integrating the sensor with the flux generator in a unified magnetic circuit that is utilized in an electrical signal processing device capable of amplification or switching.

One method of integrating the sensor to the flux generator is to reduce the height of the pole tips to that of the sensor thickness. In so doing, a constraint is placed on the current flowing through the coil so as not to saturate the pole tips, but at the same time to optimize the flux transfer to the pole tips. This can be accomplished by changing the cross-section of the pole tips relative to that of the yoke. Since the flux in the magnetic circuit is constant, the flux density at the ends of the pole tips will scale with the change in cross-section ratios in the yoke and pole tip portions of the flux generator given by:

$$B_{pt}=B_{yk}(A_{yk}/A_{pt})$$

where $B_{pt}$ is the flux density at the pole tips; $B_{yk}$, the flux density in the yoke; $A_{pt}$, the cross-sectional area of the pole tip; and, $A_{yk}$, the cross-sectional area of the yoke. Under these conditions, the equations for gain and transfer factors become:

$$G_i=i_{OUT}/i_{IN}=-(V_b thSn/\rho l)(A_{yk}/A_{pt})$$

$$G_v=v_{OUT}/v_{IN}=(I_b \rho lSn/thR_{IN})(A_{yk}/A_{pt})$$

$$G_{v/i}=v_{OUT}/i_{IN}=(I_b \rho lSn/th)(A_{yk}/A_{pt})$$

$$G_{i/v}=i_{OUT}/v_{IN}=-(V_b th/\rho l)(Sn/R_{IN})(A_{yk}/A_{pt})$$

These modified gain equations show an additional factor contributing to the gain due to the ratio of cross-sectional areas of the yoke to the pole tip; by making the yoke a larger cross-sectional area than the pole tip, the gain or transfer factors are increased for devices embodying the invention. Since most sensors have a fixed thickness constrained by their design as efficient high sensitivity sensors, this added gain factor enters if the dimensions of the pole tips are reduced from their thickness, on the order of a micron, to the thickness of the sensor that the pole tips engage. Since sensors are typically on the order of a few tens of nanometers, this means that the gain due to matching of the pole tips' thickness with the sensor thickness is on the order of approximately 20. Note that under these conditions, the constraint on the uniformity of the cross-section of the magnetic circuit has been relaxed; but, the permeability of both the sensor and the flux generator are still assumed to be equal.

For this ideal case of a device embodying the invention, the amount of flux available to the sensor from the flux generator would be substantially higher than that available from a magnetic recording head, because the sensor is directly integrated into the magnetic circuit with the flux generator of the invention. This results in an increase in the expected gain over the case for a magnetic circuit having non-magnetic gap portions due to the following:

1) since the magnetic induction field, B, drops exponentially with distance from the pole tips at a gap, a substantial portion of the full field at the pole tips can be captured when the sensor is incorporated into the magnetic circuit with the flux generator, because there is substantially less reluctance than the case having an air gap in a magnetic recording head;
2) there is a loss of flux from the structure at the write gap that never reaches the disk; this flux loss would be reduced in the magnetic circuit integrating both the flux generator and sensor for high flux transfer efficiency;
3) there is a loss of flux along the throat structures that bring the pole tips out to the ABS (air bearing surface) of a magnetic recording head; in an embodiment of the invention wherein the sensor is incorporated into the magnetic circuit of the flux generator, these throat structures are eliminated.

For the reasons enumerated above, the efficiency of flux delivery to the sensor in this ideal embodiment of the invention is expected to be higher than the efficiency of flux delivery to a disk from a similar write element used in a magnetic recording head. However, for embodiments of the invention intended for use as amplifiers of voltage or current, the constraint of the linearity of the response of the device limits the choice of yoke and pole tip materials to those having negligible hysteresis. A maximum flux density of 24,000 G is based on the use of CoFe flux concentrators at the pole tips of a magnetic recording head and Ni45Fe55 alloy in the yoke structures. Since linearity is important for some amplifier embodiments of the invention, a material with minimal hysteresis is preferred, such as Ni79Fe21 Permalloy or other material having high permeability, low magnetostriction, and low coercivity.

The voltage gain of the device under constant current bias is related to the current gain for a device of identical construction under constant voltage bias, where the constant bias voltage, $V_b$, is related to an equivalent constant bias current, $I_b$, by $V_b=I_b R_s$ where $R_s$ is the resistance of the sensor. This implies that:

$$G_v=G_i(R_s/R_{IN})$$

so that the voltage gain for the same device operated at an equivalent constant bias current would be multiplied by the ratio of output to input resistances:

$$R_s/R_{IN}=\sim 50\Omega/\sim 2\Omega=25$$

where $R_s$ is the output resistance, i.e. sensor resistance, ~50Ω, and $R_{IN}$, the input resistance, i.e. the coil resistance ~2Ω. The corresponding transfer factors for devices operated in hybrid modes of operation can be easily calculated based on similar considerations.

From the earlier equations for device output current, output voltage, gain and transfer factors for hybrid-mode devices, it would seem that additional improvements in gain could be obtained simply by adjusting the various sensor parameters: t, h, ρ, and l. However, these parameters are in general fixed by selection of a sensor with a particular sensitivity, S, because of the design of the sensor. In the case of devices with high sensitivities: spin valves (SV's), and tunneling magnetoresistance (TMR) sensors, and devices with lesser sensitivity: anisotropic magnetoresistance (AMR) sensors, the sensitivity depends critically on the sequencing of various layers with predetermined thicknesses and resistivities. Therefore, although the equations above predict changes in such devices with variation of these parameters, the thickness and resistivity of the sensor are in fact fixed by the selection of a sensor with a particular sensitivity.

This leaves the parameters for the sensor height, h, and length, l, that might be adjusted to further enhance gain. For example, to enhance voltage gain, it is logical to increase the overall resistance of the sensor by increasing the sensor length, l, and decreasing its height, h; this is the same as increasing the ratio of l/h otherwise known as increasing the number of squares of material in the sensor modeling it as a thin film resistor.

However, although there is a greater degree of flexibility in adjusting these parameters than for t and ρ, the values of l and h are intertwined through their effect on the shape anisotropy of the sensor and maintaining sensor stability. A longer sensor will be magnetically stiffer because of an increased shape anisotropy and the rotational response of the magnetization of the free layer (FL) to a given field will be reduced compared to a sensor with a lesser length. Also, the applied field will be reduced in proportion to the degree that the sensor is lengthened. This will reduce the applied field at the pole tip in direct proportion to its length through its dependence on the thickness and width of the pole tip which for a sensor with dimensions matched across the interface with the pole tip is exactly the thickness and length of the sensor, respectively. Therefore, what is gained in lengthening the sensor is lost through lessening the applied field by a corresponding widening of the pole tip in direct proportion to the amount the sensor is lengthened.

This leaves the height, h, of the sensor as the only remaining parameter through which the sensor voltage gain might be increased. A decrease in the height of the sensor would increase its resistivity by increasing the number of squares in the sensor modeled as a thin film resistor. This would have the consequence of increasing the magnetic stiffness of the sensor through the effects of shape anisotropy, but would also increase the amount of field through the sensor through a reduction of the reluctance in the magnetic circuit into which the sensor is integrated. The reduction of sensor height would also have the consequence of increasing the susceptibility of the sensor to electromigration because the current density through the sensor for a fixed applied bias current would be greater.

Similar arguments apply to increasing the current gain of the device in an embodiment as a current amplifier. Since selecting a sensor with a given sensitivity, S, fixes the sensor design increasing t and reducing p to increase the current gain of the device are not viable options, unless a particular sensor design with a given sensitivity has a greater thickness or lower resistivity.

Again, this leaves the remaining parameters, the sensor height, h, and length, l, that might be adjusted to further enhance current gain. To enhance current gain, the overall resistance of the sensor might be reduced by decreasing the sensor length, l, and increasing its height, h; this is the same as decreasing the ratio of l/h otherwise known as decreasing the number of squares of material in the sensor. As in the case of an embodiment of the invention as a voltage amplification device, here too, the values of l and h are intertwined through their effect on the shape anisotropy of the sensor and maintaining sensor stability. In this case, however, increasing h so that it is greater than l would destabilize the sensor by adding shape anisotropy through a demagnetizing field that favors alignment of the free layer along the direction of the applied field, rather than perpendicular to the applied field. In addition, if the magnetization of the free layer is oriented by the demagnetizing field, due to the shape anisotropy, towards the direction of the applied field, this would have the effect of biasing the sensor away from the zero operation point of the transfer curve, which would possibly reduce the dynamic range of the device with respect to the applied field. Also, the gap between the pole tips would increase which would reduce the flux in the device by the corresponding increase in the reluctance due to the sensor in the magnetic circuit.

From the preceding discussion, it would seem best then to leave the dimensions of the sensor unchanged from those used in particular magnetic recording head designs. On the other hand, since in amplification, amplifiers are frequently cascaded in a series of stages to get to the required levels of output signal for a particular load, it is still desirable to have some means of scaling the device to allow for different ranges of input and output current or voltage. It is also desirable to be able to select stages of amplification with different amounts of gain.

One way embodied by the invention to reduce gain would be to use sensors with lower sensitivity. Earlier vintage sensors used in magnetic recording would provide a variety of lower sensitivity designs. These sensors are also typically thicker, wider, and taller than the most recent high sensitivity designs used in magnetic recording technology so that the applied fields impressed upon the sensor would also be reduced for a given input. This is a consequence of the effects of flux reduction by increased reluctance of the magnetic circuit using a taller sensor, and increased area over which the flux is spread at the interface between the sensor and flux generator leading to a lower applied field at the sensor. Other ways embodied by the invention to reduce sensitivity and thus alter the operating range of a device embodying the invention are to shunt flux away from the sensor through a magnetic shunt in parallel with the sensor in the magnetic circuit, or to introduce longer non-magnetic portions of the gap between the sensor and the pole tips which creates greater reluctance in the magnetic circuit reducing both the flux in the entire magnetic circuit and the field impressed upon the sensor by the pole tips for a given input.

A way of scaling the device to obtain higher input and output levels embodied by the invention is to stack several identical sensors connected in series or parallel within the same gap between the pole tips of the flux generator. To first order there would be negligible effect on the gain of the device because the area of the pole tips would have to be increased by the same proportion as the number of devices introduced. For stacked sensors connected in parallel, this would appear as an overall increase in thickness of the composite with a corresponding increase in the area of the pole tips by nominally the same amount. Neglecting the effects of an additional increase in thickness of the stack due to spacers separating the devices vertically, these two effects would cancel each other in the equation for the current gain, $G_i$, of such a device. However, the overall output current would be increased in proportion to the increased thickness of the stack by a factor corresponding to the number of devices in the stack. The increased area at the pole tips would also allow the input current to be increased by the same factor for a device having essentially the same current gain as a device made with a single sensor. For stacked sensors connected in series, this would appear in an overall increase in the length of the composite sensor with a corresponding increase in the area of the pole tips by nominally the same amount. Neglecting the effects of an additional increase in thickness of the stack due to interconnecting lines and spacers separating the devices vertically, these two effects would cancel each other in the equation for the voltage gain, $G_v$, of such a device.

In both cases, for series connected, and parallel connected and stacked sensors, the effects of spacers would reduce the gain by the effect of flux shunting through these spacers placed in the gap between the pole tips. In the case of the series connected and stacked sensors, an additional decrease in gain associated with a similar shunting effect due to the interconnects would occur if the interconnects were also placed in the gap. The effect of the interconnects can be eliminated by routing them around the gap, but such schemes would, not only induce extraneous and undesirable sources of flux in the magnetic circuit for a sufficiently high current through the composite sensor, but also be overly complicated and difficult to execute in manufacturing.

For both schemes, a limit will be reached when the cross-sectional area of the pole tips, $A_{pt}$, becomes comparable to the cross-sectional area of the yoke, $A_{yk}$. As the ratio, $A_{yk}/A_{pt}$, decreases, the current input into the flux generator will reach a point at which saturation of the yoke becomes an issue with respect to the linearity of the device. Any further increase in input current would then require an increase in the cross-sectional area of the yoke to avoid saturation. Also, when saturation is a concern, the dimensions of the yoke of the flux generator can be scaled to increase the allowed input current by increasing the cross-sectional area of flux carrying structures in the magnetic circuit.

Figure 21:
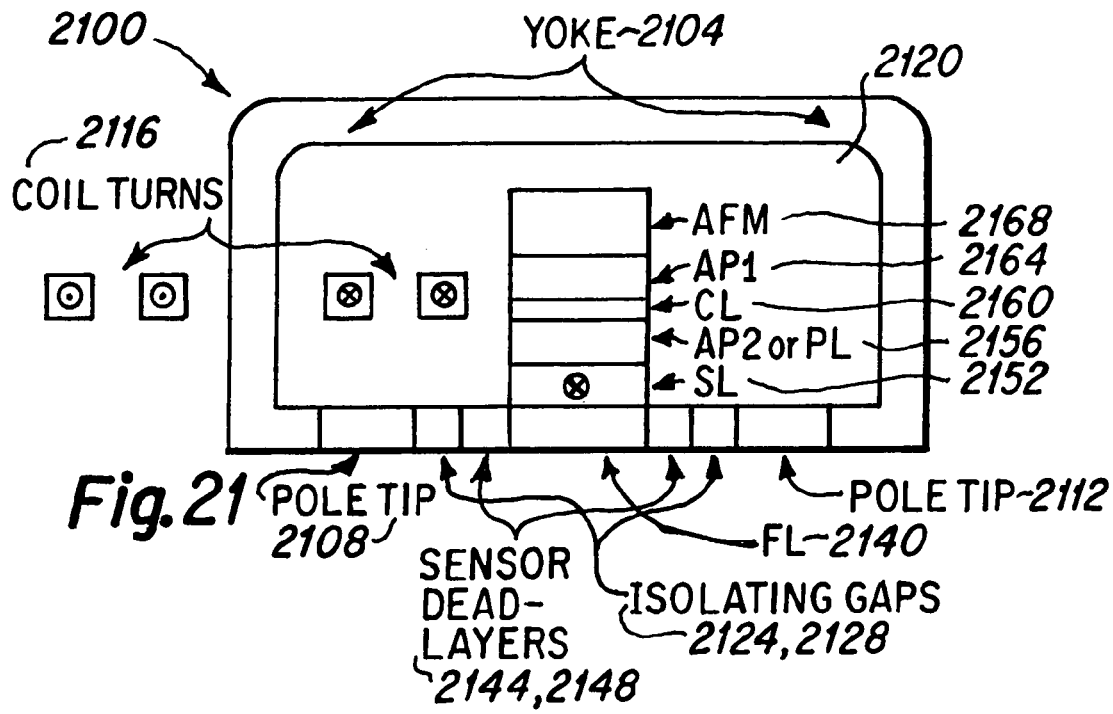
FIG. 21 is a side cross-sectional view depicting another embodiment of the present invention that optimizes flux delivery from pole tips to a free layer in a GMR sensor, and detailing the contributions to the magnetomotive force (mmf) in the magnetic circuit from the flux generator and current-carrying portions of the sensor wherein substantially all of the sensor threads the magnetic circuit.

Description of Embodiments of the Invention Optimizing Flux Transfer to a Free Layer FIG. 21 illustrates an embodiment of the invention 2100 meeting the objective of providing a signal processing device efficiently integrating a flux-controlled sensor. FIG. 21 shows this embodiment of the invention in vertical cross-section along the center line along the long dimension of the yoke of the device. The present embodiment of the invention comprises: a magnetic circuit comprising a flux generator and a sensor; said flux generator comprising a yoke portion 2104 connected to two pole tip portions 2108 and 2112; pole tip portions with said pole tip portions 2108 and 2112 at the ends distal from the their connection with the yoke 2104 connected to two electrically insulating gap portions 2124 and 2128; electrically insulating gap portions 2124 and 2128 with said gap portions connected at the ends distal from their connection with the pole tip portions to two deadlayer portions 2144 and 2148 of a sensor free layer 2140; wherein the flux generator is provided with electrical current inputs in the form of a patterned conductive planar thin film layer selected from the group consisting of a single conductive induction line or coil 2116 with multiple turns that provide a source of mmf to said magnetic circuit; an electrically insulating and encapsulating structure 2120 to prevent shorting of the coil turns to the yoke; said sensor portion further comprising a GMR sensor comprising: free layer (FL) 2140, a spacer layer (SL) 2152, and a pinned layer (PL) 2156; and, magnetic bias layers (not shown) to provide a stabilizing magnetic field to align a magnetization of the free layer in a single domain state perpendicular to a direction of flux flow through the sensor; a pair of conductive output leads (not shown) connected at either end of the sensor; wherein the direction of the free layer is at least approximately orthogonal to a direction of magnetization of the pinned layer; wherein said direction of magnetization of the pinned layer is provided by a pinning magnetic field.

As shown in FIG. 21 the device is a CIP top spin valve (TSV). However, other devices embodying the invention include those where the sensor is a bottom spin valve (BSV), dual spin valve (DSV), tunneling magnetoresistive (TMR) sensor, anisotropic magnetoresistive sensor (AMR), etc.

Thus, FIG. 21 should not be interpreted to limit the scope of the invention. FIG. 21 is chosen for its heuristic value in teaching the operation of devices embodying the invention. As shown, the device includes an AP (anti-parallel) pinning structure to pin the pinned layer comprising: an antiferromagnetic (AFM) layer 2168 in contact with a first antiparallel pinned (AP1) layer 2164; a first antiparallel pinned layer with the side opposite to that in contact with the AFM layer 2168 in contact with a coupling layer (CL) 2160; a coupling layer with the side opposite to that in contact with the AP1 layer 2164 in contact with a second antiparallel pinned (AP2) layer 2168; and, a second antiparallel pinned (AP2) layer 2156 with the side opposite to that in contact with the coupling layer, CL 2160, in contact with the spacer layer (SL) 2152; wherein the AP2 layer 2156 is the pinned layer (reference layer) of the GMR-SV sensor. To simplify the drawing, a current is shown flowing through the spacer layer to indicate current flow through the GMR sensor as indicated by the arrow tail of a current density vector inscribed therein. However, current flows through all of the layers depending on the thin film sheet resistance of each layer, and interfacial electron scattering at the interfaces between the layers. However, the major fraction of the net current through the sensor flows through the spacer layer 2152, which is important for the discussion of a model magnetic circuit for the device shown in FIG. 21.

The device embodying the invention shown in FIG. 21 operates through the action of the magnetic flux generated by the current flowing into the input coil 2116 on a free layer 2140 integrated into a magnetic circuit that conducts flux to the sensor. The flux rotates the direction of magnetization of the free layer 2140 so that it rotates away from a direction orthogonal to the direction of magnetization of the pinned layer 2156. If the flux is such that it rotates the free layer magnetization towards the direction where the magnetizations of the free layer 2140 and pinned layer 2156 are antiparallel, a state of greater electrical resistance to current flow through the sensor in created. If the flux is such that it rotates the free layer 2140 magnetization towards the direction where the magnetizations of the free layer 2140 and pinned layer are parallel 2156, a state of lower electrical resistance to current flow through the sensor in created. In this manner, a time varying flux that is the result of a time-varying input current serving as the input signal to the device, creates a time-varying electrical output from the device by causing greater or lesser electrical resistance to the flow of current through the sensor. Thus, an input signal to the coil is translated into an output from the sensor. An object of the invention is the efficient integration of the sensor into the magnetic circuit conducting the flux signal to the sensor so as to optimize the translation of the input signal into the output signal.

The efficient integration of the sensor with the flux generator is illustrated in the embodiment of the invention shown in FIG. 21. The width and thickness dimensions of the pole tip portions 2108 and 2112 of the yoke are matched to be approximately equal to the width and thickness dimensions of the free layer portion 2140 of the sensor. This means that: if $w_{ptRHS}$ and $t_{ptRHS}$ are the respective width and thickness of the end surface of the RHS pole tip, these are respectively approximately equal to the width and thickness, $w_{FLRHS}$ and $t_{FLRHS}$, of the RHS side of the free layer facing the RHS pole tip; and, if $w_{ptLHS}$ and $t_{ptLHS}$ are the respective width and thickness of the end surface of the LHS pole tip, these are respectively approximately equal to the width and thickness, $w_{FLLHS}$ and $t_{FLLHS}$, of the LHS side of the free layer facing the LHS pole tip. The matching of these dimensions optimizes the delivery of flux to the flux sensitive portion of the sensor that develops the output signal. In effect, this matches the flux-carrying cross-sectional area of the pole tips to the flux-carrying cross-sectional area of the free layer portion of the sensor, i.e. $A_{FLLHS}=A_{ptLHS}$, and $A_{FLRHS}=A_{ptRHS}$. Moreover, to get the full benefit of the effect of matching these dimensions, the end surfaces of both the pole tips and the free layer should be nominally well aligned so that there is minimal offset between the two, i.e. the end surfaces of each should overlay one another when viewed along perpendiculars to the end surfaces, or along the direction of flux propagation between the pole tips and sensor.

FIG. 21 also depicts current-carrying portions of the sensor other than the free layer as threading the magnetic circuit. By Ampere's Law, the passage of a current through these current-carrying portions of the sensor will create a magnetic field in the magnetic circuit that these layers thread. This might be a problem for a device being used as a current amplifier, because if the flux created by the these current-carrying sensor layers exceeds that of the flux created by the input signal, some kind of non-linearity of device performance due to the cancellation of fluxes, or leading and lagging of fluxes, in the magnetic circuit might occur. This effect might be used to advantage in certain applications; but, for a linear current amplifier this could be a problem. The effect can be overcome if the input to the sensor is a constant DC current from a DC current source. This would only produce a constant flux in the magnetic circuit that might be overcome through some biasing means of the sensor. But, this is essentially a voltage amplification device, not a current amplification device. Thus, for a constant voltage bias mode of the sensor, the flux generated by the varying current in the sensor would likely interfere with the signal flux from the flux generator. Another solution is to place as much of the current-carrying portions of the sensor as possible outside of the magnetic circuit so that these portions due not thread the circuit to prevent their creating an interfering flux therein.

Figure 22:
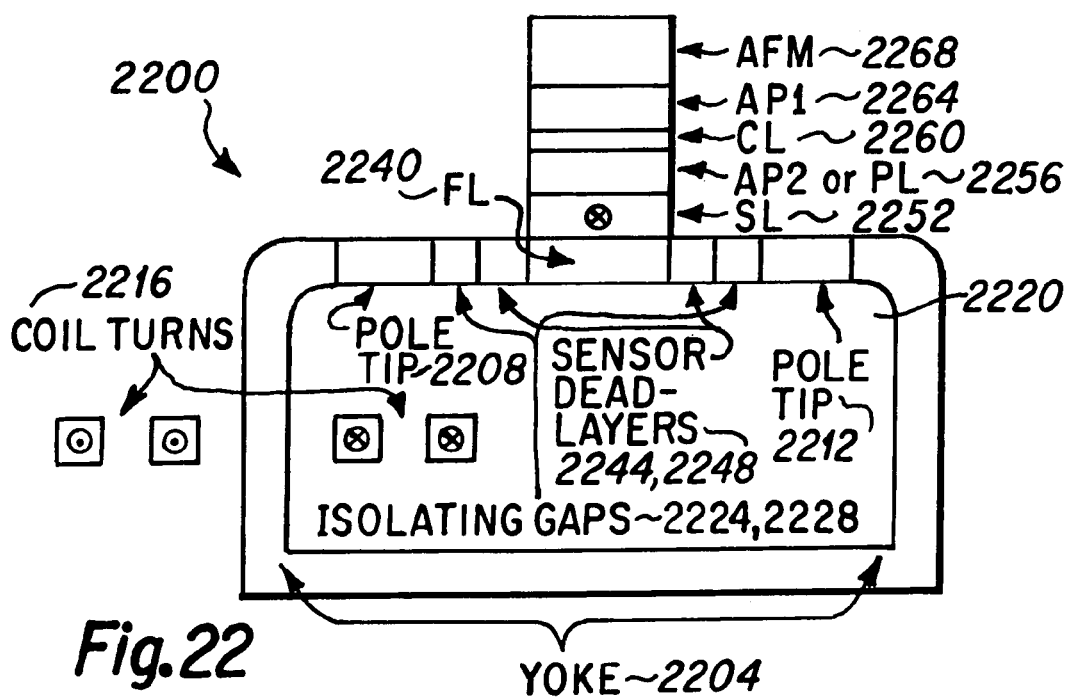
FIG. 22 is a side cross-sectional view depicting another embodiment of the present invention that optimizes flux delivery from pole tips to a free layer in a GMR sensor, and detailing the contributions to the mmf in the magnetic circuit from the flux generator and current-carrying portions of the sensor wherein essentially only the free layer of the sensor threads the magnetic circuit.

FIG. 22 illustrates another embodiment of the invention 2200 overcoming the effect of fluxes created by current-carrying portions of the sensor through placing most of the carrying-portions of the sensor outside the magnetic circuit, instead of inside where such portions would thread the circuit. In this embodiment of the invention, only the free layer 2240 is in the magnetic circuit with the flux generator. The other layers of the sensor: the spacer layer 2252, the pinned layer or second antiparallel pinned layer 2256, the coupling layer 2260, the first antiparallel pinned layer 2264, and the antiferromagnetic layer 2268, lie outside of the magnetic circuit of the flux generator. This arrangement minimizes the effects of the currents carried by these layers on the magnetic circuit carrying the flux signal generated by the flux generator. Thus, these portions of the sensor lie outside of the region threading the magnetic circuit, so that their influence on the magnetic circuit is minimized.

As depicted in FIG. 22, the magnetic circuit carrying flux generated by the flux generator comprises: a yoke 2204, LHS and RHS pole tip portions 2208 and 2212 of the yoke, electrically insulating portions of the gap 2224 and 2228, dead-layer portions of the sensor 2244 and 2248, and the free layer 2240 of the sensor. Once again, the thicknesses and widths of the pole tips should be matched to the thicknesses and widths of the sensor end surfaces that communicate with the pole tips as described above with respect to FIG. 21. The flux generator comprises: non-sensor portions of the magnetic circuit, the coil with coil turns 2216, and an electrically insulating and encapsulating structure 2220 to prevent shorting of the coil turns to the yoke.

Note that as shown in FIGS. 21 and 22 the sensor is a top SV type sensor. This means that to implement the design with the non-free layer portions of the sensor outside of the magnetic circuit carrying flux from the flux generator it necessary to place top SV structure on the top yoke portions of the magnetic circuit. If a bottom SV is used, this design can be implemented with the free layer in the bottom yoke portions of the magnetic circuit.

Another embodiment of the invention avoids having any current carrying portion of the sensor threading the magnetic circuit. However, a drawback of such a design is that the communication of flux to the sensor will be reduced because it is no longer directly in the flux path or the main flux path of the magnetic circuit. This can be done by fabricating the free layer of the sensor in direct contact with a closed magnetic circuit without electrically insulating gap portions. For a top SV the top layer of the magnetic circuit shown in FIG. 22 would be replaced with a continuous electrically insulating ferrimagnetic oxide layer, such as nickel manganese ferrite, or nickel zinc ferrite. This ferrimagnetic electrically insulating oxide material could be deposited using ion beam deposition (IBD) for a target containing constituents of the ferrimagnetic oxide in the presence of a reactive oxygen species. Subsequent to deposition of this ferrimagnetic oxide, the top SV structure could be deposited so that the free layer is in direct contact with the ferrimagnetic oxide layer. Subsequently photolithography and ion milling could be used to pattern: first, the ferrimagnetic oxide top magnetic yoke structure; second, the top SV sensor. The action of the flux in the ferrimagnetic layer from the flux generator would likely be communicated to the free layer through some magnetostatic and or magnetic exchange interaction with the ferrimagnetic layer. Since the former mechanism constitutes a kind of flux shunting away from the magnetic circuit, this embodiment of the invention is not as efficient in flux delivery as having the sensor directly in a gap.

Description of Design Considerations in Selecting Operating Characteristics of the Flux Generator and the Sensor to Realize Specific Embodiments of the Invention Depicted in FIG. 23A-F are various B-H loops and sensor transfer curves useful for discussing various embodiments of the invention. The selection of particular materials or sensors with special characteristics may be especially useful in designing electrical signal processing devices having specific applications as amplifiers, signal translation devices, isolators, digital switches, logic gates, or memory elements.

FIG. 23A depicts a generic B-H loop 2300. As is known in the art, the loop consists of a plot of a B-field, magnetic induction filed, of material versus an applied magnetic field. The major features of the loop are as follows: a magnetic saturation field, $B_s$ 2312; a positive coercivity or coercive force, $H_c$ 2314, and a negative coercive force, $-H_c$ 2316; a permeability of the material, $\mu$ 2318, which is the slope of the B-H loop; a value of the saturation magnetic induction, $B_s$ 2320, which equals $H+4\pi M_s$, where $M_s$ is the magnetization saturation, as shown $B_s$ is read from the ordinate of the plot; a remanent magnetic induction, $B_r$ 2322; a squareness, Sq 2324, which is the ratio $B_r/B_s$; a positive nucleation field, $H_n$ 2326; an ascending portion of the loop 2330; a portion of the loop whereat the material is positively saturated 2332; a descending portion of the loop 2334; and, a portion of the loop whereat the material is negatively saturated 2336. As is well known in the art, when a material is at negative saturation, an applied magnetic field causes the magnetic induction B to progress along the ascending portion of the loop 2330 until saturation at 2332; and with reversal of the applied field, to progress along the descending portion of the loop 2334, until negative saturation at 2336. The loop is shown as open;

the effect that opens the loop is called hysteresis, which means that the material retains some memory of the magnetic field that has been applied to it.

FIG. 23B depicts the B-H loop 2302 of a material which is useful as an anisotropic magnetoresistive portion of a sensor or free layer portion of a SV or TMR device designed to have high signal sensitivity. The loop has a high permeability 2350, i.e. a steeper slope on the ascending portion of the loop. The onset of saturation at negative and positive applied fields 2342 and 2346 occurs abruptly in transition from the ascending and descending portions of the loop 2340 and 2344, respectively. Finally, the coercivity, $H_c$ 2348, of the material is relatively small. This type of loop is called an easy-axis loop. Since the coercivity is low, a material with this type of loop would produce a device with low hysteresis, and amplifiers having nominal linearity; and, since the permeability is high, amplifiers also having good gain. This type of material is also useful for flux carrying portions of the magnetic circuit. Materials with this kind of loop are: Permalloy, Supermalloy, Sendust, silicon iron, aluminum iron, and ferrites when magnetized along an easy-axis of magnetization.

FIG. 23C depicts the B-H loop 2304 of a material which is useful as an anisotropic magnetoresistive portion of a sensor or free layer portion of a SV or TMR device designed to have very linear operation, but at some cost in reduced device sensitivity. The loop has ascending 2360 and descending 2364 portions that virtually lie on top of each other. Thus, the coercivity is very low, and as shown it is absent. Also, there is a portion of the loop whereat the material is positively saturated 2362, and, a portion of the loop whereat the material is negatively saturated 2366. The permeability 2368 is lower than for the material of FIG. 23B. This type of loop is called a hard-axis loop. Since the coercivity is low, a material with this type of loop would produce a device without hysteresis, and consequently amplifiers, signal translation devices, and isolators having good linearity; but, since the permeability is low, amplifiers having somewhat lower gain. This type of material is also useful for flux carrying portions of the magnetic circuit. Materials with this kind of loop are: Permalloy, Supermalloy, Sendust, silicon iron, aluminum iron, and ferrites when magnetized along a hard axis of magnetization.

FIG. 23D depicts the B-H loop 2306 of a material which is useful as an AMR layer portion of a AMR sensor, or free layer portion of a SV or TMR device that is used in a digital switch, logic gate, or memory element. The loop has ascending 2370 and descending 2374 portions. Again, there is portion of the loop whereat the material is positively saturated 2362 occurring at a positive saturating applied field, $H_{sat}$ 2373, and, a portion of the loop whereat the material is negatively saturated 2366 occurring at a negative saturating applied field, $-H_{sat}$ 2375. The loop is open with relatively large coercivities, $H_c$ 2378, and $-H_c$ 2380. The squareness, Sq 2386, of the loop is large, approximately equal to 1, because the remanent magnetic induction, $B_r$, is essentially the same as the saturation magnetic induction, $B_s$. As a result, the value of the positive nucleation field, $H_n$ 2382, and the absolute value of the negative nucleation field, $H_n$ 2384, are both large. This type of loop is called a square loop.

Since the coercivity and the nucleation fields are high, a material with this type of loop would produce a very hysteretic device, useful as a digital switch, logic gate, or memory element, because the remanent states are highly stable for free layers and AMR layers made of such materials. This stability results from the large nucleation fields, and coercivities required to switch these layers to the opposite remanent magnetization state. This type of material may also be useful for flux-carrying portions of the magnetic circuit. However, this would likely be at the cost of device response time, because it would take longer for the rest of the magnetic circuit to switch its state, than to switch the state of the sensor alone. Materials with this kind of loop are: cobalt and its alloys; in particular the cobalt alloys used for magnetic recording layers such as those based on: CoPtCr, CoTaCr, CoPtTaCr, CoPtCrB; also, the magnetic alloys with Llo crystal structure: CoPt, FePt; and magnetic multilayers such as $[CO/Pt]_n$ and $[Fe/Pt]_n$, where the subscript n indicates that the structure repeats itself n times.

FIG. 23E depicts the ΔR/R-H transfer curve 2308 of certain types of GMR sensors, and of SV, or TMR sensors that are used in embodiments of the invention. The transfer curve has a step-like characteristic associated with the changing magnetization state of the free layer in the sensor with increasing applied magnetic field. Three operating points useful for describing the behavior of the sensor with applied field are indicated: 2394 where the magnetization of the free layer is parallel to that of the pinned layer (also called the reference layer), a low resistance state of the sensor; 2390 where the magnetization of the free layer is orthogonal to that of the pinned layer, an intermediate resistance state of the sensor; and, 2392 where the magnetization of the free layer is anti-parallel to that of the pinned layer, a high resistance state of the sensor.

Starting at the LHS of the plot of ΔR/R-H transfer curve, the region of operating point 2394, the curve lies on the H-axis of the plot, because the resistance is in the lowest state; so that ΔR, the difference between the resistance of the sensor and its resistance in the low resistance state, is zero. In this region the free layer is fully negatively saturated. As the applied field increases, a turning point is reached at which the transfer curve begins to rise because the resistance increases above its value in the lowest state. This turning point occurs at a slightly positive field that is analogous to the nucleation field discussed with respect to B-H loops, i.e. it corresponds to the field at which the magnetization of the free layer begins to change. The offset of this value from zero is caused by a variety of effects: exchange bias between the free layer and the pinned layer structure, self bias due the current flowing through the sensor, etc. At still higher applied magnetic field, the magnetization of the free layer rotates away from the magnetization direction of the pinned layer. The sensor enters a linear-response region of the ΔR/R-H transfer curve, the region of operating point 2390. In this region, magnetization of the free layer rotates uniformly with applied magnetic field. At still higher fields, the sensor again enters a flat, unresponsive portion of the ΔR/R-H transfer curve, the region of operating point 2392, where the curve is again parallel to the H-axis of the plot, because the resistance is in the highest state; so that ΔR, the difference between the resistance of the sensor and its resistance in the low resistance state, is at its maximum. In this region the free layer is fully positively saturated.

Operating points 2392 and 2394 are useful for embodiments of the electrical signal processing device as either a digital switch, logic gate, or memory element. For a sensor biased with a constant current supply, if the sensor state lies in the region of operating point 2394, the sensor is in a low resistance state or low voltage state, identified with a logical "0"; and, if the sensor state lies in the region of operating point 2392, the sensor is in a high resistance state or high voltage state, identified with a logical "1". Although the ΔR/R-H transfer curve 2308 shows no hysteresis, it is desirable to use a free layer in the sensor having a square loop with significant hysteresis as is shown in FIG. 23D. As a result, the ΔR/R-H transfer curve 2308 would open up splitting the steep portion of the curve with operating point 2390 into two portions: an ascending portion offset to the right by nominally the value of the coercivity, $H_c$, and a descending portion offset to the left by $-H_c$. This would have the effect of stabilizing the sensor in remanent states of high and low voltage without the necessity of supplying an applied field to maintain the sensor in those states. This enables storage of information about the logical state of the device in a non-volatile manner, which is desirable for embodiments as a digital switch, logic gate, or memory element.

Operating point 2390 is useful for embodiments of the electrical signal processing device as either an amplifier, signal translation device, or isolator. If the sensor state lies in the region of operating point 2390, the sensor is in an intermediate resistance state that depends on the orientation of the magnetization in the free layer relative to the magnetization of the pinned (reference) layer. For an amplifier with high gain, it is desirable that this portion of the curve be as steep as possible. In part, this can be achieved by using a material for the free layer with high permeability as shown in FIG. 23B. Other ways of increasing the slope of the transfer curve or sensor sensitivity, S, are to use materials in the sensor stack that enhance the spin-dependent-scattering effect, such as CoFe or alloy thereof in both the free layer and pinned layer, and oxide spacer layers such as MgO, AlOx and TiOx in TMR devices. Using these later materials has the effect of increasing the separation between the high and low resistance portions of the transfer curve, which increases sensor sensitivity, S. For an amplifier, electrical signal translation device, or isolator with good linearity, it is necessary that the hysteresis of the free layer be minimized as shown for a material with the B-H loop in FIG. 23C. For "A" class operation of an amplifier, the sensor should be biased so that the input field signal varies about a mean level given by the field value at operating point 2390; moreover, to avoid saturation and non-linearity effects on the output signal, the peak-to-peak values on the input field signal should lie within the linear operating regime of the device far from the turning points of the $\Delta R/R$-H transfer curve near saturation of the sensor. As discussed earlier, embodiments of amplifiers as voltage amplifiers or current amplifiers are realized by biasing the sensor with a constant current source or a constant voltage source, respectively.

FIG. 23F depicts the $\Delta R/R$-H transfer curve 2310 of AMR sensors, and non-standard GMR sensors of the granular-giant-magnetoresistance ($G^2MR$), multilayer (ML), discontinuous-multilayer (DML), and colossal-magnetoresistance (CMR) types that can be used in embodiments of the invention. The transfer curve has a bell-shaped characteristic curve associated with the changing magnetization state of the magnetically alterable portions of the sensor with varying applied magnetic field. In the case of the group of non-standard GMR sensors excepting ML devices, the magnetically active portions of the sensor are ferromagnetic particles or small ferromagnetic domains; and in the case of AMR sensors and GMR-ML sensors, ferromagnetic layers.

Starting at the LHS of the plot of $\Delta R/R$-H transfer curve 2310, the magnetically active portions of the sensor are all fully saturated; under these conditions the resistance state of the sensor is low. As the field is increased, the direction of magnetization of some of these portions of the sensor begin to rotate toward the direction of the applied field and pass through a region of the transfer curve where the response of resistance to applied field is nominally linear. When the field reaches zero, a high resistance state is reached where the magnetically active portions of the sensor are in a net magnetically neutral state with about half magnetized in the direction of the negative saturation field and about half in the opposite direction. With growth of the applied filed in the positive direction, more of these magnetically active portions rotate to the positive direction of magnetization away from the direction of the negative saturation field; and, the sensor passes through another linear response region with center located at the operating point 2396. Upon further increase of the applied field, the active portions of the sensor are again all fully saturated 2398, but in the opposite direction to their original magnetization state.

Although sensors with these types of transfer curves have been used as digital devices, economically successful applications have primarily been as magnetic field detectors and magnetic recording head sensors, for which these types of sensors provide linear responses. Therefore, the operation of these sensors will be discussed in terms of a single operating point 2396 on the linear portion of the transfer curve, which is suitable for applications as an amplifier, signal translation device, or isolator. From the location of the operating point 2396, it is seen that it is necessary to bias these sensors with a positive field to obtain linear response. Also, to obtain sensor output linearity, it is necessary that materials be selected with negligible hysteresis such as those with a B-H loop shown in FIG. 23C. Suitable materials are those with soft magnetic properties for the magnetically active portions of the sensor, those with low hysteresis, such as Permalloy. Otherwise, as discussed above in the case of the SV-type transfer curve 2308 of FIG. 23E, the transfer curve 2310 will become hysteretic and produce a non-linear output response. For an amplifier with larger gain, it is desirable that the linear region of the transfer curve be as steep as possible. In part, this can be achieved by using a material for the magnetically active portions of the sensor with high permeability as shown in FIG. 23B. A special case is that of a sensor using the colossal magnetoresistance effect. Materials demonstrating this effect are manganate perovskites based on $La_wCa_xMn_yO_z$. These materials exhibit high values of $\Delta R/R$, even thousands of percent, but are relatively field insensitive requiring fields of a few Tesla to develop the full resistance change; so that they would not be useful for high gain amplifiers. However, because of their linear response over a large field range, CMR materials would be useful for amplifiers having a large dynamic range. In general, sensors with these types of transfer curves would not be suitable for amplifiers with high gain. However, sensors with such transfer curves would work well in applications such as a signal translation device, or an isolator, where output linearity is the primary requirement.

Description of Digital Device Embodiments of the Invention

Specific embodiments of the invention are as a current amplification device, a voltage amplification device, and a digital device. The later may be suitable also as the component of a memory cell in a MRAM. These devices all derive benefits from fabrication technology for the thin film magnetic recording head, which allows each device to be used as a basic design element in a monolithic integrated magnetic circuit, or hybrid magnetic-circuit/semiconducting-circuit chip incorporating many such devices. The small sizes in which the magnetic write and read elements of such magnetic recording heads can now be fabricated makes such integration possible. In general, the various embodiments of the invention as a current amplification device and voltage amplification device have been discussed above, but not an embodiment of the invention as a digital device. Desirable attributes of an embodiment of the invention as a digital device are:

1) that it be easily switchable between two states;
2) that it remain highly stable in a state having once switched into that particular state;

3) that it consume low amounts of power; and 4) that its input and output levels be suitable for interfacing to other devices.

These attributes are best satisfied through the choice of sensor incorporated into the device.

Figure 24:
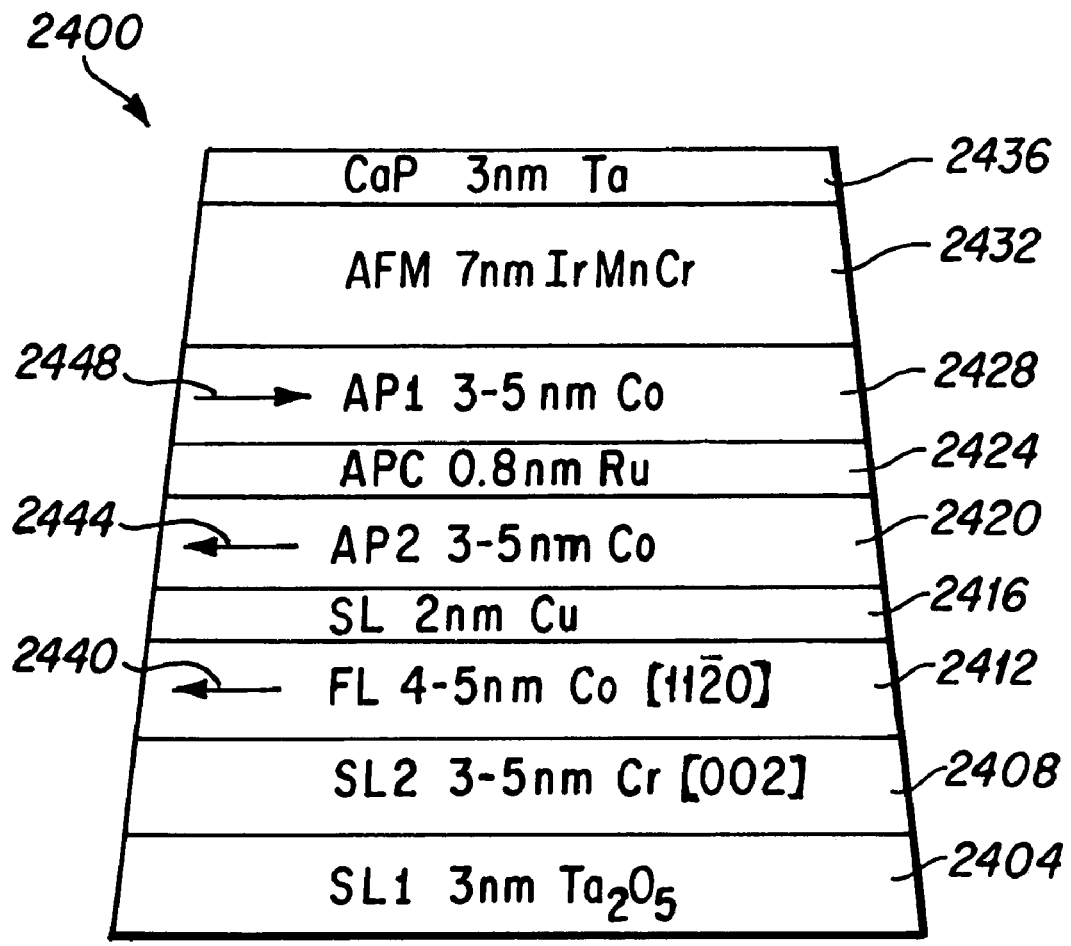
FIG. 24 is a side cross-sectional view of a sensor structure useful in a digital switch, logic gate, or MRAM memory element further embodying the present invention.

FIG. 24 shows a sensor 2400 that is a suitable choice for a highly stable digital device integrated in a magnetic circuit with a flux generator. An embodiment of the invention is a top SV sensor using Co or Co alloys as the free layer 2412 and pinned layers 2420 and 2428 to provide high ΔR/R to satisfy the 4th attribute for a digital device by providing a high voltage difference between the output of the sensor in one of two latched states. The sensor comprises a multilayer SV device having an amorphous under layer (SL1) 2404; in an embodiment of the invention this is approximately 3 nm of Ta2O5. On this layer is deposited a thin layer of Cr, NiAl, or RuAl (SL2) 2408 around 3 to 5 nm thick with an [002] preferred orientation, although the [110] preferred orientation will also work. The Cr acts as a seed layer (SL2) 2408 for a free layer (FL) 2412 of Co or a Co alloy with high spin scattering coefficient and minimal resistivity contributions from impurity or grain boundary scattering of electrons. Thus, an ion beam deposited (IBD) layer would be preferred having large grain size and high purity. The Cr layer would serve to produce in the Co or Co alloy FL 2412 a preferred orientation of [11-20] on [002] Cr or [1-100] on [110] Cr, both having a preferred orientation with c-axis in-plane which is the easy-axis of magnetization for Co. This would produce a FL 2412 with high in-plane coercivity and high squareness which would serve to latch the FL 2412 in a remanent state along the direction of an applied field, after the applied field was reduced to zero. The direction of the applied field would be chosen perpendicular to the sides of the sensor that face the end surfaces of the pole tips of a flux generator providing the applied field.

The IBD Co FL 2412 is deposited to have nominally a 4 nm to 5 nm thickness on the Cr seed layer. Alternatively, plasma vapor deposited (PVD) layers of Co and Cr could be deposited under conditions to produce a small grain size on the order of 12 nm to further enhance its coercivity; but, this would be at the cost of increased resistivity due to grain boundary and impurity scattering in the Co FL 2412. The sensor further comprises an approximately 2 nm spacer layer (SL) 2416 of Cu on the Co FL 2412 and another Co layer to act as a pinned layer (PL) 2420 on top of the SL, which is in this embodiment a second antiparallel pinned layer (AP2) 2420. Alternatively, instead of a Cu spacer layer 2416, an oxide layer of MgO, AlOx, or TiOx could be used in an embodiment of the invention utilizing a TMR sensor. Also, so called "dusting" or spin-dependent-scattering-enhancement layers of CoFe can be deposited between the spacer layer 2416 and the FL 2412 and AP2 layer 2420. Other alloys of CoFe such as CoFeB could also be used for these "dusting" layers. An additional antiparallel coupling layer (APC) 2424 of approximately 8 nm of Ru and another 4 nm to 5 nm Co layer can be deposited on the second antiparallel pinned layer 2420 to produce a synthetic antiferromagnet (SAF) or antiparallel pinned (AP) structure capturing any spurious flux that might couple magnetostatically from the PL with the FL. This is achieved by depositing a first antiparallel pinned layer (AP1) 2428 on the APC layer 2424. The magnetostatic interaction between AP1 2428 and AP2 2420 directs the fringing flux at the ends of the layers into a closed loop limiting magnetostatic coupling between AP2 2420 and the FL 2412. Alternatively, the layer 2420 may be a single pinned layer.

Depending on whether the AP structure or single pinned layer is used, layers 2420 or 2428 can then be directly pinned with approximately 70 nm AFM layer 2432 of PtMn or IrMnCr that lies thereon. In a preferred embodiment of the invention, the additional Ru 2424 and Co 2428 layers are omitted in the interest of minimizing shunting of current through the sensor so as to increase the voltage swing between the two GMR states. These two states correspond to a low voltage state with the magnetization 2440 of the FL 2412 parallel to the magnetization 2444 of the PL or AP2 layer 2420, as shown; and, the high voltage state with the magnetization 2440 of the FL 2412 antiparallel to the magnetization 2444 of the PL or AP2 layer 2420. Note that for these magnetization configurations, the sensor is being driven between its two magnetically saturated states 2394 and 2392 discussed earlier in FIG. 23E. These magnetization states are unlike the magnetization state useful for linear operation of the a SV or TMR sensor where the device is biased to operate at the zero asymmetry point of the transfer curve 2390, in which case the magnetization of the FL is orthogonal to the magnetization of the PL in the ideal quiescent state of the sensor. This means that FIG. 24 as drawn shows a cross section through the sensor along a center line down the length of the pole tip structures, i.e. the applied field passes through the sensor along a line from the RHS side to the LHS side of the sensor stack as drawn which is consistent with the direction of the magnetization 2440 of the FL along the direction of the applied field for a low voltage saturated state of the sensor 2394. The PL would be magnetized so that its moment would lie in the direction perpendicular to the interface between the flux generator and the sensor. Thus, two states of the sensor corresponding to a high resistance and low resistance state of the sensor would exist for the states in which the FL magnetization lies in the opposite direction and the same direction as that of the PL, respectively. The sensor 2400 is capped with a capping layer 2436 of Ta approximately 3 nm thick over the AFM 2432.

Output leads (not shown) provide current to the device by either lying contiguously at opposite LHS and RHS sides of the sensor or opposite one another at the top and bottom sides of the sensor depending on whether the sensor is operated as a CIP (current in plane) or CPP (current perpendicular to plane) sensor. The magnetization states of the pinned layer PL, or AP1 and AP2, are set by magnetic anneals as is known in the art. Similarly, hard bias magnetization states for devices employing a biasing magnetization structure for the FL can be set by means known in the art.

Unlike devices used as amplifiers, the hard bias structure, usually required for such sensors to stabilize the FL in a single domain state aligned orthogonally to the magnetization direction of the PL, is not required for an embodiment of the invention as a digital device. A device embodying the invention as a tunneling magnetoresistive (TMR) sensor would satisfy both the 3rd and 4th attributes for a digital device as discussed above. A TMR sensor having higher intrinsic resistance than either a CIP SV or CPP SV would produce a higher output voltage swing between the two states of the device with the magnetization of FL and PL layers aligned parallel to one another, or aligned antiparallel, in the low and high resistance or output voltage states, respectively. To further enhance the stability of the sensor, the 2nd attribute, in each state beyond that provided by the magnetocrystalline anisotropy, derived from a Co FL with [11-20] aligned in-plane, elongation of the sensor in the direction of the applied field provides an addition measure of shape anisotropy to the Co FL so that the preferred magnetization states would lie parallel or antiparallel to the direction of the field applied by the flux generator. Thus, a ratio of h/l>1 would provide a sensor with additional stability due to shape anisotropy.

For a large h/l ratio, in an embodiment of the invention as a digital device using a CPP current or voltage bias condition, as in a CPP SV or TMR sensor, this might cause a reduction in the voltage difference between the two states because of the larger cross-sectional area of the device perpendicular to the direction of current flow. However, the elongation that would reduce the flux, concomitantly the applied field, available to switch the sensor from one state to another would be higher, making the digital device embodiment with a high h/l ratio, >1, harder to switch contrary to the 1st attribute. In fact, most embodiments stabilizing the switch in its two states would mitigate against ease of switching. However, the flux generator can be designed to provide as high a field as desired, as high as approximately 1000 Oe, even more, without much difficulty. The main limitation on the switching field is that it not exceed the pinning field of the PL, which for contemporary SVs and TMR sensors can be made as high as approximately 2000 Oe.

In order to have a device suitable for very large scale integration in digital device applications, it is desirable that the device have as small a footprint as possible on the chip. Therefore, it is desirable that the flux generator have as small as possible dimension consistent with it providing a high switching field to the sensor. A large coil structure conflicts with a design having a small footprint. Therefore, even though an embodiment of the invention with a multiple turn coil would provide a high switching field, a design that provides a switching field sufficient to switch a high stability digital sensor is all that is required. FIG. 25A-C shows an embodiment of the invention 2500 having a flux generator with a current carrying element sufficient to supply a large switching field to the sensor without occupying a large portion of real estate on the chip. This embodiment of the invention comprises a single conductive induction line threading the yoke and pole tip structure of the flux generator without a full coil turn structure.

FIG. 25A shows an embodiment of the invention 2500. FIG. 25A depicts the yoke 2516 of a flux generator 2510 including pole tip portions with end surfaces 2524 and 2522 disposed on either side of a sensor 2520 located in the gap of the flux generator. The flux generator further comprises a single conductive induction line 2512 which threads the magnetic circuit, because the yoke 2510 surrounds it. This conductive induction line 2512 is isolated from the yoke by an electrically insulating encapsulating structure 2518. The sensor 2520 is itself isolated from the yoke by two electrically insulating portions of the gap 2526 and 2528. The conductive induction line 2512 carries a current indicated by the crossed circle therein and is fabricated as a thin film in a planar layer parallel to planar layers of the yoke portion having the pole tips and gap, and also parallel to the planar layers of the sensor. These various thin film planar layers being fabricated by the methods of thin film technology generally have thicknesses on the order of or less than 1 micron. A current passes through the sensor 2520 indicated by the dotted circle therein which for the purposes of the subsequent discussion is assumed to be constant; so that the sensor 2520 is operated in a constant current bias mode.

The sensor 2520, insulating gap portions 2526 and 2528, and conductive induction line 2512 can be deposited using sputtering and, patterned using ion milling and photolithography as known in the art of thin film technology as practiced in the fabrication of the magnetic recording heads used in hard disk drives (HDD's). The yoke and pole tips 2516 are generally plated using techniques known form the same art. The electrically insulating encapsulating structure 2518 can be a sputter deposited and patterned oxide such as alumina or photoresist as known form this art.

An electrical signal in the form of a current is impressed on the conductive induction line 2512 through leads (not shown). This generates a flux signal in the yoke 2516 and magnetic circuit containing the flux generator 2510 and sensor 2520. In response to this flux signal, the resistivity of the sensor 2520 is changed in accord with a magnetoresistive effect sensitive to the flux in the magnetic circuit and modulates the output voltage from the sensor as an output signal on output leads (not shown). Thus, the device depicted in FIG. 25A constitutes one embodiment of an electrical signal processing device with a thin film flux generator 2510 for generating a flux signal in the magnetic circuit composed of yoke 2516, insulating gap portions 2526 and 2528, and sensor 2520 in response to an input signal applied as a current on one conductive induction line 2512 wherein the thin film magnetoresistive sensor 2520 is magnetically coupled through the magnetic circuit to the flux generator 2516 for receiving a flux signal induced in the magnetic circuit by induction line 2512 and producing an output signal in response thereto. For embodiments of the invention suitable as digital switches, logic gates, or magnetic memory cells, it is desirable to use a sensor such as that described above in FIG. 24 in a mode that switches it from one saturated magnetic state to the opposite saturated magnetic state. Note that after the sensor has changed its magnetization state, it is no longer necessary to apply any current to the conductive induction line 2512 to maintain that state in the sensor, because of the magnetic hysteresis of the sensor 2520. The operation of the device suitable for use as a digital device: digital switch, logic gate, or magnetic memory cell, is next described.

By employing a switching FL with a high coercivity field, $H_c$ 2378 (in FIG. 23D), square loop 2306 and negative nucleation field, $-H_n$ 2384, nearly equal to $-H_c$ 2380, a device with an abrupt transition from a state of magnetization parallel to the PL, or anti-parallel to the PL can be made. This requires that the applied field for switching the FL, $H_a$, provided by the current flowing through the conductive induction line threading the yoke/pole tip structure, be sufficient to overcome the $H_c$ 2378 of the FL in the sensor, i.e.

$$H_a > H_c$$

In turn, this places the following constraint on the switching current required, $i_{SW}$, in a conductive induction line threading the magnetic circuit in order to switch the state of the free layer, given by $$i_{SW} > H_c A_{pt} / \mu n A_{yk}$$

The expression for the switching field, $i_{SW}$, shows the dependence of switching field relating to the design of the flux generator as follows:
1) the smaller the ratio of the pole tip cross-sectional area to the yoke cross-sectional area, the smaller the required switching current;
2) the greater value of n for conductive induction lines threading the flux generator, the smaller is the switching current, where n counts the number conductive induction lines threading the magnetic circuit per unit length thereof;
3) the greater the permeability of the flux generator, the smaller the required switching current;
4) the lower the coercivity of the FL, the smaller the required switching current.

With respect to this latter design constraint, the switching current should be as small as possible to overcome the coercivity of the FL. Since the coercivity of the FL is made sufficiently high to assure its stability, the switching current must be some amount greater than the coercivity determined by the squareness of the loop. For non-volatile maintenance of the state of magnetization of the FL after the switching current is applied, the switching current is made sufficiently in excess of the coercivity of the FL so that the FL returns to a reproducible remanent state. For a very square magnetization loop of the FL, this is a field sufficient to saturate the FL. This device could be useful as part of a memory element in an MRAM, or as an inventor for logic or digital switching.

A further embodiment of the invention based on its use as a digital device is as a dual input logic gate 2502 shown in FIG. 25B. FIG. 25B shows an embodiment of the invention 2502. FIG. 25B depicts the yoke 2536 of a flux generator 2530 including pole tip portions with end surfaces 2544 and 2542 disposed on either side of a sensor 2540 located in the gap of the flux generator. The flux generator further comprises a two conductive induction lines 2532 and 2534 which is a conductor threading the magnetic circuit. Logic signals in the form of currents may be applied thereto. The conductive induction lines 2532 and 2534 are isolated from the yoke 2536 by an electrically insulating encapsulating structure 2538. The sensor 2540 is itself isolated from the yoke by two electrically insulating portions of the gap 2546 and 2548. The conductive induction lines 2532 and 2534 carry currents indicated by the crossed circles therein and are fabricated as separate isolated thin film planar layers parallel to planar layers of the yoke portion having the pole tips and gap, and also parallel to the planar layers of the sensor 2540. These various thin film planar layers being fabricated by the methods of thin film technology generally have thicknesses on the order of or less than 1 micron. A current passes through the sensor 2540 indicated by the dotted circle therein which for the purposes of the subsequent discussion is assumed to be constant; so that the sensor 2540 is operated in a constant current bias mode.

The sensor 2540, insulating gap portions 2546 and 2548, and conductive induction lines 2532 and 2534 can be deposited using sputtering and, patterned using ion milling and photolithography as known in the art of thin film technology as practiced in the fabrication of the magnetic recording heads used in hard disk drives (HDD's). The yoke and pole tips 2536 are generally plated using techniques known form the same art. The electrically insulating encapsulating structure 2538 can be a sputter deposited and patterned oxide such as alumina or photoresist as known form this art.

Two separate electrical signals in the form of currents are impressed on the conductive induction lines 2532 and 2534 through leads (not shown). This generates a flux signal in the yoke 2536 and magnetic circuit containing the flux generator 2530 and sensor 2540. In response to this flux signal, the resistivity of the sensor 2540 is changed in accord with a magnetoresistive effect sensitive to the flux in the magnetic circuit and modulates the output voltage from the sensor as an output signal on output leads (not shown). Thus, the device depicted in FIG. 25B constitutes one embodiment of an electrical signal processing device with a thin film flux generator 2530 for generating a flux signal in the magnetic circuit composed of yoke 2536, insulating gap portions 2546 and 2548, and sensor 2540 in response to an input signals applied as currents on two conductive induction line 2532 and 2534, wherein the thin film magnetoresistive sensor 2540 is magnetically coupled through the magnetic circuit to the flux generator 2536 for receiving a flux signal induced in the magnetic circuit by induction lines 2532 and 2534 and producing an output signal from the sensor in response thereto.

For embodiments of the invention suitable as digital switches, logic gates, or magnetic memory cells, it is desirable to use a sensor such as that described above in FIG. 24 in a mode that switches it from one saturated magnetic state to the opposite saturated magnetic state. Note that after the sensor has changed its magnetization state, it is no longer necessary to apply any currents to the conductive induction lines 2532, and 2535 to maintain that state in the sensor, because of the magnetic hysteresis of the sensor 2540.

The operation of an embodiment of the invention as digital device suitable for use as a logic gate is next described. An embodiment of the invention as an "AND" gate uses two conductive induction lines 2532 and 2534 threading the magnetic circuit or the flux generator 2536, such that the current in neither conductive induction line is capable of changing the state of magnetization, i.e. overcoming the coercivity, of the FL alone without the aid of current from the other. Starting with the device in the low output state, in which both the FL and PL are aligned parallel, the sum of the current in one conductive induction line 2532, $i_{IN1}$, with that of a second conductive induction line 2534, $i_{IN2}$, must then be equal to or greater than the current sufficient to switch the FL to the high output state, in which the FL and PL are aligned anti-parallel, given by:

$$i_{IN1} + i_{IN2} > \text{ or } = i_{SW}$$

If the two currents are chosen to be equal, the value of current in each sufficient to switch the FL is greater than or equal to $i_{SW}/2$, and corresponds to a logical unit, "1". Any value of the current less than this value is a logical zero, "0". The logical "1" state of output of the device corresponds to the voltage across the sensor 2540 in the high resistance state, when the FL and PL magnetizations (2440 and 2444) are anti-parallel to each other. However, this state will remain after current to the device is removed; so that it is desirable to reset the "AND" gate before each new cycle of operation. In another embodiment of the invention 2504 shown in FIG. 25C, a reset function is provided by a third conductive induction line 2555 threading the flux generator with current greater than or equal to $i_{SW}$ but with opposite polarity to that through the conductive induction lines used as logic inputs, which switches the state of the FL so that it is aligned parallel to the PL so that the device is in the logical "0" state corresponding to the voltage across the sensor 2540 in the low resistance state. Alternatively, one of the input lines can be toggled with current greater than or equal to $i_s$ but with opposite polarity to that which it had as a logic input, which switches the state of the FL so that it is aligned parallel to the PL so that the device is in the logical "0" state corresponding to the voltage across the sensor 2540 in a low resistance state.

A further embodiment of the invention based on its use as a digital device is as a dual input logic gate 2504 with a reset function as shown in FIG. 25C. FIG. 25C shows an embodiment of the invention 2504. FIG. 25C depicts the yoke 2556 of a flux generator 2550 including pole tip portions with end surfaces 2564 and 2562 disposed on either side of a sensor 2560 located in the gap of the flux generator. The flux generator further comprises three conductive induction lines: 2552 and 2554 acting as logic signal inputs, and 2555 providing a state reset function; note that these lines are conductors threading the magnetic circuit. Logic signals in the form of currents may be applied thereto. The conductive induction lines 2552, 2554, and 2555 are isolated from the yoke 2556 by an electrically insulating encapsulating structure 2558. The sensor 2560 is itself isolated from the yoke by two electrically insulating portions of the gap 2566 and 2568. The conductive induction lines 2552, 2554, and 2555 carry currents indicated by the crossed circles therein for logic signal lines 2552, and 2554, and by a dotted circle for logic signal lines 2555, and are fabricated as separate isolated thin film planar layers parallel to planar layers of the yoke portion having the pole tips and gap, and also parallel to the planar layers of the sensor 2560. These various thin film planar layers being fabricated by the methods of thin film technology generally have thicknesses on the order of or less than 1 micron. A current passes through the sensor 2560 indicated by the dotted circle therein which for the purposes of the subsequent discussion is assumed to be constant; so that the sensor 2560 is operated in a constant current bias mode.

The sensor 2560, insulating gap portions 2566 and 2568, and conductive induction lines 2552, 2554, and 2555 can be deposited using sputtering and, patterned using ion milling and photolithography as known in the art of thin film technology as practiced in the fabrication of the magnetic recording heads used in hard disk drives (HDD's). The yoke and pole tips 2556 are generally plated using techniques known form the same art. The electrically insulating encapsulating structure 2558 can be a sputter deposited and patterned oxide such as alumina or photoresist as known form this art.

Two separate electrical signals in the form of currents are impressed on the conductive induction lines 2552 and 2554 through leads (not shown). This generates a flux signal in the yoke 2556 and magnetic circuit containing the flux generator 2550 and sensor 2560. In response to this flux signal, the resistivity of the sensor 2560 is changed in accord with a magnetoresistive effect sensitive to the flux in the magnetic circuit and modulates the output voltage from the sensor as an output signal on output leads (not shown). Thus, the device depicted in FIG. 25C constitutes one embodiment of an electrical signal processing device with a thin film flux generator 2550 for generating a flux signal in the magnetic circuit composed of yoke 2556, insulating gap portions 2566 and 2568, and sensor 2560 in response to an input signals applied as currents on two conductive induction line 2552 and 2554, wherein the thin film magnetoresistive sensor 2540 is magnetically coupled through the magnetic circuit to the flux generator 2556 for receiving a flux signal induced in the magnetic circuit by induction lines 2552 and 2554 and producing an output signal from the sensor in response thereto. For embodiments of the invention suitable as digital switches, logic gates, or magnetic memory cells, it is desirable to use a sensor such as that described above in FIG. 24 in a mode that switches it from one saturated magnetic state to the opposite saturated magnetic state. Note that after the sensor has changed its magnetization state, it is no longer necessary to apply any currents to the conductive induction lines 2552, 2554, and 2555 to maintain that state in the sensor, because of the magnetic hysteresis of the sensor 2560.

An embodiment of the invention as a "NAND" gate uses two conductive induction lines threading the magnetic circuit through the flux generator such that the current in neither one is capable of changing the state of magnetization, i.e. overcoming, the coercivity, of the FL alone without the aid of current from the other. Starting with the device in the high output state, in which both the FL and PL are aligned anti-parallel, the sum of the current in one conductive induction line 2532, $i_{IN1}$, with that of a second conductive induction line 2534, $i_{IN2}$, must then be equal to or greater than the current sufficient to switch the FL to the low output state, in which the FL and PL are aligned parallel, given by:

$$i_{IN1} + i_{IN2} > \text{ or } = i_{SW}$$

If the two currents are chosen to be equal, the value of current in each sufficient to switch the FL is greater than or equal to $i_{SW}/2$, and corresponds to a logical unit, "1". Any value of the current less than this value is a logical zero, "0". Note that in this case the current flow through the conductive induction lines is of opposite polarity to that for the "AND" gate. The logical "0" state of output of the device corresponds to the voltage across the sensor 2540 in the low resistance state, when the FL and PL magnetizations are parallel to each other.

However, the output state of the device will remain unchanged after input currents to the device are removed; so that it is desirable to reset the "NAND" gate before each new cycle of operation. In another embodiment of the invention 2504 shown in FIG. 25C, a reset function is provided by a third conductive induction line 2555 threading the flux generator with current greater than or equal to $i_{SW}$ but with opposite polarity to that through the conductive induction lines used as logic inputs, which switches the state of the FL so that it is aligned anti-parallel to the PL so that the device is in the logical "1" state corresponding to the voltage across the sensor 2540 in the high resistance state. Alternatively, one of the input lines can be toggled with current greater than or equal to $i_{SW}$ but with opposite polarity to that which it had as a logic input, which switches the state of the FL so that it is aligned anti-parallel to the PL so that the device is in the logical "1" state wherein the output of the device corresponds to the voltage across the sensor 2540 in a high resistance state.

Again with reference to FIG. 25B, an embodiment of the invention as an "OR" gate uses two conductive induction lines threading the magnetic circuit through the flux generator such that the current in either one is capable of changing the state of magnetization, i.e. overcoming the coercivity, of the FL alone without the aid of current from the other. Starting with the device in the low output state, in which both the FL and PL are aligned parallel, the sum of the current in one conductive induction line 2532, $i_{IN1}$, with that of a second conductive induction line 2534, $i_{IN2}$, must then be equal to or greater than the current sufficient to switch the FL to the high output state, in which the FL and PL are aligned anti-parallel, given by:

$$i_{IN1} + i_{IN2} > \text{ or } = i_{SW}$$

The value of current in each line is sufficient to switch the FL and is greater than or equal to $i_{SW}$, and corresponds to a logical unit, "1". A value of the current less than $i_{SW}/2$ is a logical zero, "0". The logical "1" state of output of the device corresponds to the voltage across the sensor 2540 in the high resistance state, when the FL and PL magnetizations are anti-parallel to each other. However, this state will remain after input currents to the device are removed; so that it is desirable to reset the "OR" gate before each new cycle of operation. Once again, in another embodiment of the invention 2504 shown in FIG. 25C, a reset function is provided by a third conductive induction line 2555 threading the flux generator with current greater than or equal to $i_{SW}$ but with opposite polarity to that through the conductive induction lines used as logic inputs, which switches the state of the FL so that it is aligned parallel to the PL so that the device is in the logical "0" state corresponding to the voltage across the sensor 2540 in the low resistance state. Alternatively, one of the input lines can be toggled with current greater than or equal to $i_{SW}$ but with opposite polarity to that which it had as a logic input, which switches the state of the FL so that it is aligned parallel to the PL so that the device is in the logical "0" state corresponding to the voltage across the sensor 2540 in a low resistance state.

An embodiment of the invention as a "NOR" gate uses two conductive induction lines threading 2532 and 2534 the magnetic circuit through the flux generator such that the current in either one is capable of changing the state of magnetization, i.e. overcoming the coercivity, of the FL alone without the aid of current from the other. Starting with the device in the high output state, in which both the FL and PL are aligned anti-parallel, the sum of the current in one conductive induction line 2532, $i_{IN1}$, with that of a second conductive induction line 2534, $i_{IN2}$, must then be equal to or greater than the current sufficient to switch the FL, in which the FL and PL are aligned parallel, given by $$i_{IN1}+i_{IN2} > \text{ or } = i_{SW}$$

The value of current in each sufficient to switch the FL is greater than or equal to $i_{SW}$, and corresponds to a logical unit, "1". A value of the current less than $i_{SW}/2$ is a logical zero, "0". After a logical "1" appears on either conductive induction line, it will change the output of the device to a logical "0" corresponding to the state in which the FL and PL magnetizations lie parallel to each other. The logical "0" state of output of the device corresponds to the voltage across the sensor 2540 in the low resistance state, when the FL and PL magnetizations are parallel to each other. However, this state will remain after input currents to the device are removed; so that it is desirable to reset the "NOR" gate before each new cycle of operation. In another embodiment of the invention 2504 shown in FIG. 25C, a reset function is provided by a third conductive induction line 2558 threading the flux generator with current greater than or equal to $i_{SW}$ but with opposite polarity to that through the conductive induction lines used as logic inputs, which switches the state of the FL so that it is aligned anti-parallel to the PL so that the device is in the logical "1" state corresponding to the voltage across the sensor 2540 in the high resistance state. Alternatively, one of the input lines can be toggled with current greater than or equal to $i_{SW}$ but with opposite polarity to that which it had as a logic input, which switches the state of the FL so that it is aligned anti-parallel to the PL so that the device is in the logical "1" state corresponding to the voltage across the sensor 2540 in a high resistance state.

Note that the preceding discussion has been predicated on the assumption that the sensor 2540 is operated in a constant current bias mode so that the output current through the sensor 2540 does not change only the voltage drop across it changes. If on the other hand, the sensor 2540 is operated in a constant voltage bias mode, so that the output voltage does not change, the current through the sensor 2540 for the low resistance state will be in a high state, and the current through the sensor 2540 for a high resistance state will be in a low state. This means that the NAND gate operation becomes that of a AND gate, and vice versa, when the bias mode of the sensor 2540 is changed from constant current to constant voltage bias; and, the NOR gate operation becomes that of an OR gate, and vice versa, when the bias mode of the sensor 2540 is change from constant current to constant voltage bias. Depending on what other devices these gates are connected to, one or the other of these bias modes of operation might be preferred.

Besides "AND," "OR," "NAND," and "NOR" gates, for full implementation of logic, the logical negation operation is desirable. The negation function is provided by another embodiment of the invention as an inverter 2500. Two other embodiments of the invention as an inverter 2502 are based on the "NAND" and "NOR" gates described above. The logic table for the "NAND" gate indicates that if one of the inputs is placed in a high state, corresponding to a logical "1," the output of the device will switch to the opposite state of that input on the other line, viz. for a first input in the "1" state, if the second input is "0", the output will go to "1," and if the second input is "1," the output will go to "0." One embodiment of the inverter is to apply a fixed high level, logical state "1," on one input of the "NAND" gate and input the logic signal on the other or second input taking the output from the sensor 2540 as the logical output of the device.

In similar fashion, the "NOR" gate can be converted to inverter operation in an embodiment of the invention by taking the output of the sensor 2540 for a fixed low input, logical "0," on one input, for the input of either a logical "0" or "1" on the other input. Since the invention relies on current to drive its operation when used in a constant current bias mode, it is desirable to provide an inverter that does not need a fixed input current on one input line. In another alternative embodiment of the invention, the field supplied by the fixed input line to the flux generator can be provided through the use of magnetic bias to the flux generator. The magnetic bias can be provided by a permanent magnet placed in the flux generator occupying the same place as the fixed input line would occupy that generates the same field that the input would were it present. Alternatively, in the case of the inverter based on the "NOR" gate, since the fixed input is in a low state, a logical "0," the permanent bias magnet or first fixed input conductive induction line can be completely eliminated, and only one input to the flux generator is required. This single input line can also be made to serve the function of a reset line.

Further Embodiments of the Invention not Precluded by the Preceding Descriptions The present invention generally provides a switching and amplification device based purely on magnetic technology that is suitable for large scale integration, as well as discrete device components. While the invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What I claim is:

1. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a thin film layer of said flux generator, and connected to at least one lead of said pair of thin film input leads;
a thin film yoke including a yoke portion having at least one pair of thin film pole tips, wherein a gap having end surfaces on opposite sides of said gap is disposed between each said pair of pole tips;
wherein a thin film magnetoresistive sensor is disposed in each gap proximate to ends of said pole tips from which flux emanates when the flux generator is generating flux, wherein each lead of said pair of output leads is connected to an opposite second side of said sensor, wherein said pole tips of said yoke are fabricated with end surfaces that are generally perpendicular to said planar sensor layers of said magnetoresistive sensor, wherein an electrically insulating portion of said gap is formed between said magnetoresistive sensor and one of said end surfaces of one of said pole tips.

2. An electrical signal processing device as described in claim 1 wherein said magnetoresistive sensor is a current perpendicular to the plane (CPP) sensor.

3. An electrical signal processing device as described in claim 1 wherein said magnetoresistive sensor is a current in the plane (CIP) sensor.

4. An electrical signal processing device as described in claim 1 wherein said electrically insulating portion of said gap has a length that is less than 1000 microns.

5. An electrical signal processing device as described in claim 1 wherein said flux generator and said magnetoresistive sensor are disposed upon a single substrate.

6. An electrical signal processing device as described in claim 1 wherein a magnetic shield is disposed between said sensor and said conductive induction line.

7. An electrical signal processing device as described in claim 1 wherein said at least one conductive induction line is connected to each lead of said pair of input leads.

8. An electrical signal processing device as described in claim 1 including two or more conductive induction lines and wherein each conductive induction line is connected to respective separate pairs of input leads.

9. An electrical signal processing device as described in claim 1 wherein two or more conductive induction lines connect to one another to form an induction coil, and wherein said induction coil is connected to a pair of input leads.

10. An electrical signal processing device as described in claim 9 wherein said induction coil is selected from the group consisting of a pancake coil and a helical coil.

11. An electrical signal processing device as described in claim 9 wherein two or more induction coils thread said magnetic circuit.

12. An electrical signal processing device as described in claim 1 wherein said magnetic circuit includes a flux generator and two or more magnetoresistive sensors.

13. An electrical signal processing device as described in claim 1 wherein a flux guide is disposed between one of said magnetic pole tips and one of said first sides of said sensor.

14. An electrical signal processing device as in claim 1 wherein an electrically insulating portion of said gap is formed between said magnetoresistive sensor and an end surface of one of said pole tips, wherein said electrically insulating portion of said gap has a length that is 10 nanometers or less.

15. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a thin film layer of said flux generator, and connected to at least one lead of said pair of thin film input leads;
a thin film yoke including a yoke portion having at least one pair of thin film pole tips, wherein a gap having end surfaces on opposite sides of said gap is disposed between each said pair of pole tips;
wherein a thin film magnetoresistive sensor is disposed in each gap proximate to ends of said pole tips from which flux emanates when the flux generator is generating flux, wherein each lead of said pair of output leads is connected to an opposite second side of said sensor,
wherein said pole tips of said yoke are fabricated with end surfaces that are generally perpendicular to said planar sensor layers of said magnetoresistive sensor,
wherein said end surfaces of said pole tips are disposed in contact with said magnetoresistive sensor.

16. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said pole tips of said yoke are fabricated with end surfaces that are generally perpendicular to said planar sensor layers of said magnetoresistive sensor,
wherein an electrically insulating portion of said gap is formed between said magnetoresistive sensor and one of said end surfaces of one of said pole tips,
wherein said electrically insulating portion of said gap has a length that is less than 1 micron.

17. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said pole tips of said yoke are fabricated with end surfaces that are generally perpendicular to said planar sensor layers of said magnetoresistive sensor,
wherein an electrically insulating portion of said gap is formed between said magnetoresistive sensor and one of said end surfaces of one Of said pole tips,
wherein said electrically insulating portion of said gap has a length that is 10 nanometers or less.

18. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein one pole tip of said yoke is disposed at a first side of said magnetoresistive sensor and another pole tip of said yoke is disposed at another first side of said sensor.

19. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said magnetic circuit includes two or more flux generators and a single magnetoresistive sensor.

20. An electrical signal processing device as described in claim 19 wherein said magnetic circuit includes three loops comprising two inner loops and an outer loop, wherein said two inner loops share a common leg and said outer loop comprises the portions of said two inner loops excluding said common leg.

21. An electrical signal processing device as described in claim 20 wherein said two inner loops of said magnetic circuit are matched to have the same reluctances.

22. An electrical signal processing device as described in claim 20 wherein said magnetic circuit is threaded by at least four conductive induction lines, wherein a first two such lines are connected electrically to produce additive reinforcing magnetic fluxes in said outer loop and canceling magnetic fluxes in said common leg of said two inner loops, wherein a second two such lines are connected electrically to produce oppositely circulating magnetic fluxes in said two inner loops and additive reinforcing magnetic fluxes in said common leg of said two inner loops, and wherein said first two lines are connected to a pair of input leads, and said second two lines are connected to a separate pair of input leads.

23. An electrical signal processing device as described in claim 20 wherein four or more conductive induction lines connect to one another to form at least three induction coils, a first of said induction coils being wrapped around an outer portion of a first inner loop, a second of said induction coils being wrapped around an outer portion of a second inner loop, and a third of said induction coils being wrapped around said common leg, and wherein said first of said induction coils is connected electrically to said second of said induction coils to produce additive reinforcing magnetic fluxes in said outer loop and canceling magnetic fluxes in said common leg, wherein a third of said induction coils is connected electrically to produce oppositely circulating magnetic fluxes in said two inner loops and additive reinforcing magnetic fluxes in said common leg, and wherein said first and second of said induction coils are connected to a pair of input leads, and said third of said induction coils is connected to a separate pair of input leads.

24. An electrical signal processing device as described in claim 19 wherein each said flux generator includes at least one separate conductive induction line and a separate yoke.

25. An electrical signal processing device as described in claim 24 wherein each said yoke includes pole tips that are disposed proximate first sides of said sensor.

26. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said pole tip portions of said yoke have first widths and first thicknesses, and wherein a free layer portion of said sensor has a second width and a second thickness, and wherein said first widths and first thicknesses of said pole tip portions are approximately equal to said second width and second thickness of said free layer portion of said sensor.

27. An electrical signal processing device as described in claim 26 wherein said sensor includes one of said free layer portions and another current-carrying portion, and wherein said magnetic circuit is threaded by said current-carrying portion.

28. An electrical signal processing device as described in claim 26, wherein said sensor includes one of said free layer portions and another current-carrying portion, and wherein said current-carrying portion lies outside of a region threading said magnetic circuit.

29. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said sensor includes: a seed layer being disposed on an under layer of said sensor, said seed layer being comprised of one or more materials selected from the group consisting of chromium, nickel aluminum, ruthenium aluminum, and alloys of chromium; and, a free layer being disposed on said seed layer and being comprised of one or more materials selected from the group consisting of cobalt and alloys of cobalt.

30. An electrical signal processing device as described in claim 29 wherein said sensor further includes: a spin-dependent-scattering-enhancement layer being disposed on said free layer and being comprised of one or more materials selected from the group consisting of cobalt iron and alloys of cobalt iron.

31. An electrical signal processing device, comprising:
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips;
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
and further including a flux-carrying portion, wherein said flux-carrying portion is comprised of a ferrimagnetic electrically insulating oxide material.

32. An electrical signal processing device as described in claim 31 wherein said flux carrying-portion is a component of said flux generator selected from the group consisting of a flux guide, a yoke, a yoke portion, and a pole tip.

33. A method of making a magnetic circuit device having a flux-carrying portion, comprising:
fabricating a device, the device comprising
at least one pair of input leads for inputting an input signal;
at least one pair of output leads for outputting an output signal;
a thin film magnetic circuit including at least one thin film flux generator for generating a flux signal in said magnetic circuit in response to said input signal and at least one thin film magnetoresistive sensor magnetically coupled through said magnetic circuit to said flux generator for receiving said flux signal and producing an output signal in response to said flux signal;
wherein each flux generator includes at least one thin film conductive induction line threading said magnetic circuit, said induction line being formed in a planar thin film layer of said flux generator, and connected to at least one lead of said pair of thin film input leads;
a thin film yoke including a yoke portion having at least one pair of thin film pole tips, said thin film pole tips being formed in a planar thin film layer of said flux generator, and wherein said yoke surrounds said conductive induction line; wherein a gap having end surfaces on opposite sides of said gap is disposed between each said pair of pole tips; and
a flux-carrying portion
wherein a thin film magnetoresistive sensor is disposed in each gap proximate to said pole tips, wherein said thin film magnetoresistive sensor is formed with at least two first sides and two second sides and includes planar thin film sensor layers wherein said planar sensor layers are disposed parallel to said planar layer of said conductive induction line, and parallel to said planar layer of said yoke portion, wherein each lead of said pair of output leads is connected to an opposite second side of said sensor, and wherein said magnetoresistive sensor is a member of the group consisting of an anisotropic magnetoresistive sensor, a giant magnetoresistive sensor, a spin valve sensor, and a tunneling magnetoresistive sensor,
wherein said flux-carrying portion is fabricated by ion beam deposition from a target containing constituents of a ferrimagnetic electrically insulating oxide material in the presence of a reactive oxygen species.

34. A method of making a magnetic circuit device as described in claim 33 wherein said flux carrying-portion is a component of a flux generator selected from the group consisting of a flux guide, a yoke, a yoke portion, and a pole tip.

35. An electrical signal processing device, comprising: at least one pair of input leads; at least one pair of output leads; a thin film magnetic circuit including at least one thin film flux generator and at least one thin film magnetoresistive sensor; wherein each flux generator includes at least one thin film conductive induction line threading said magnetic circuit, and a thin film yoke including a yoke portion having at least one pair of thin film pole tips; wherein a gap having end surfaces on opposite sides of said gap is disposed between each said pair of pole tips; wherein a thin film magnetoresistive sensor is disposed in each gap proximate to said pole tips; and, wherein an electrically insulating portion of said gap is formed between said magnetoresistive sensor and an end surface of a said pole tip, wherein said electrically insulating portion of said gap is a ferrimagnetic oxide.

36. An electrical signal processing device as in claim 35 wherein said magnetoresistive sensor is a member of the group consisting of an anisotropic magnetoresistive sensor, a giant magnetoresistive sensor, a spin valve sensor, a tunneling magnetoresistive sensor, and a colossal magnetoresistive sensor.

37. An electrical signal processing device as in claim 35 wherein said flux generator and said magnetoresistive sensor are disposed upon a single substrate.

38. An electrical signal processing device as in claim 35 wherein said sensor includes one of said free layer portions and another current-carrying portion, and wherein said current-carrying portion lies outside of a region threading said magnetic circuit.

39. An electrical signal processing device as in claim 35 wherein said magnetic circuit includes three loops comprising two inner loops and an outer loop, wherein said two inner loops share a common leg and said outer loop comprises the portions of said two inner loops excluding said common leg.

40. An electrical signal processing device as in claim 35 wherein two or more conductive induction lines connect to one another to form an induction coil.

41. An electrical signal processing device as described in claim 40 wherein said induction coil is selected from the group consisting of a pancake coil and a helical coil.

42. An electrical signal processing device, comprising: at least one pair of input leads; at least one pair of output leads; a thin film magnetic circuit including at least one thin film flux generator and at least one thin film magnetoresistive sensor; wherein each flux generator includes at least one thin film conductive induction line threading said magnetic circuit, and a thin film yoke including a yoke portion having at least one pair of thin film pole tips; wherein a gap having end surfaces on opposite sides of said gap is disposed between each said pair of pole tips; wherein a thin film magnetoresistive sensor is disposed in each gap proximate to said pole tips; and, wherein an electrically insulating portion of said gap is formed between said magnetoresistive sensor and a said end surface of a said pole tip, wherein said pole tip portions of said yoke have first widths and first thicknesses, and wherein a free layer portion of said sensor has a second width and a second thickness, and wherein said first widths and first thicknesses of said pole tip portions are approximately equal to said second width and second thickness of said free layer portion of said sensor.

43. An electrical signal processing device, comprising: at least one pair of input leads; at least one pair of output leads; a thin film magnetic circuit including at least one thin film flux generator and at least one thin film magnetoresistive sensor; wherein each flux generator includes at least one thin film conductive induction line threading said magnetic circuit, and a thin film yoke including a yoke portion having at least one pair of thin film pole tips; wherein a gap having end surfaces on opposite sides of said gap is disposed between each said pair of pole tips; wherein a thin film magnetoresistive sensor is disposed in each gap proximate to said pole tips; and, wherein an electrically insulating portion of said gap is formed between said magnetoresistive sensor and a said end surface of a said pole tip, wherein said magnetic circuit includes three loops comprising two inner loops and an outer loop, wherein said two inner loops share a common leg and said outer loop comprises the portions of said two inner loops excluding said common leg, wherein four or more conductive induction lines connect to one another to form at least three induction coils, a first of said induction coils being wrapped around an outer portion of a first inner loop, a second of said induction coils being wrapped around an outer portion of a second inner loop, and a third of said induction coils being wrapped around said common leg, and wherein said first of said induction coils is connected electrically to said second of said induction coils to produce additive reinforcing magnetic fluxes in said outer loop and canceling magnetic fluxes in said common leg, wherein a third of said induction coils is connected electrically to produce oppositely circulating magnetic fluxes in said two inner loops and additive reinforcing magnetic fluxes in said common leg, and wherein said first and second of said induction coils are connected to a pair of input leads, and said third of said induction coils is connected to a separate pair of input leads.

* * * * *